(12) United States Patent
Hashiguchi

(10) Patent No.: US 12,087,795 B2
(45) Date of Patent: Sep. 10, 2024

(54) SOLID-STATE IMAGING DEVICE AND ELECTRONIC APPARATUS

(71) Applicant: SONY SEMICONDUCTOR SOLUTIONS CORPORATION, Kanagawa (JP)

(72) Inventor: Hideto Hashiguchi, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 375 days.

(21) Appl. No.: 17/608,962

(22) PCT Filed: Apr. 6, 2020

(86) PCT No.: PCT/JP2020/015447
§ 371 (c)(1),
(2) Date: Nov. 4, 2021

(87) PCT Pub. No.: WO2020/235234
PCT Pub. Date: Nov. 26, 2020

(65) Prior Publication Data
US 2022/0216246 A1    Jul. 7, 2022

(30) Foreign Application Priority Data
May 20, 2019    (JP) ................ 2019-094699

(51) Int. Cl.
*H01L 27/146*    (2006.01)
*H01L 21/768*    (2006.01)
*H01L 23/00*    (2006.01)

(52) U.S. Cl.
CPC .. *H01L 27/14634* (2013.01); *H01L 21/76829* (2013.01); *H01L 24/05* (2013.01); *H01L 27/1462* (2013.01)

(58) Field of Classification Search
CPC ............... H01L 21/02; H01L 21/02002; H01L 21/76826; H01L 21/76829;
(Continued)

(56) References Cited

U.S. PATENT DOCUMENTS

2010/0059887 A1    3/2010    Ueki et al.
2012/0070986 A1    3/2012    Ueki et al.
(Continued)

FOREIGN PATENT DOCUMENTS

CN    102867847 A    1/2013
JP    2010-093235 A    4/2010
(Continued)

OTHER PUBLICATIONS

International Search Report and Written Opinion of PCT Application No. PCT/JP2020/015447, issued on Jul. 7, 2020, 10 pages of ISRWO.

*Primary Examiner* — Cheung Lee
(74) *Attorney, Agent, or Firm* — CHIP LAW GROUP

(57) ABSTRACT

A solid-state imaging device is provided that includes a first substrate including at least a first electrode, a first modification layer, a first low-permittivity layer formed on the first modification layer, and a first joint surface where the first electrode and the first modification layer are exposed; and a second substrate including at least a second electrode, a second modification layer, a second low-permittivity layer formed on the second modification layer, and a second joint surface where the second electrode and the second modification layer are exposed. The first modification layer has higher hydrophilicity than the first low-permittivity layer. The second modification layer has higher hydrophilicity than the second low-permittivity layer. The first substrate and the second substrate form a laminate structure and are electrically connected by bonding the first joint surface and the second joint surface.

21 Claims, 26 Drawing Sheets

(58) Field of Classification Search
CPC ... H01L 21/76832; H01L 24/02; H01L 24/05; H01L 24/06; H01L 24/08; H01L 24/09; H01L 24/80; H01L 25/065; H01L 25/07; H01L 25/18; H01L 27/146; H01L 27/1462; H01L 27/14634; H01L 2224/08145; H01L 2224/80013; H04N 25/70

See application file for complete search history.

(56) References Cited

U.S. PATENT DOCUMENTS

| | | |
|---|---|---|
| 2013/0009321 A1 | 1/2013 | Kagawa et al. |
| 2014/0362267 A1 | 12/2014 | Kagawa et al. |
| 2015/0270212 A1 | 9/2015 | Kagawa et al. |
| 2016/0343762 A1 | 11/2016 | Kagawa et al. |
| 2016/0343763 A1 | 11/2016 | Kagawa et al. |
| 2018/0277585 A1 | 9/2018 | Kagawa et al. |
| 2019/0273109 A1 | 9/2019 | Kagawa et al. |

FOREIGN PATENT DOCUMENTS

| | | |
|---|---|---|
| JP | 2012-256736 A | 12/2012 |
| JP | 2013-038112 A | 2/2013 |
| JP | 2013-073988 A | 4/2013 |
| JP | 2013-232473 A | 11/2013 |
| KR | 10-2013-0007972 A | 1/2013 |
| KR | 10-2019-0071647 A | 6/2019 |
| TW | 201304064 A1 | 1/2013 |

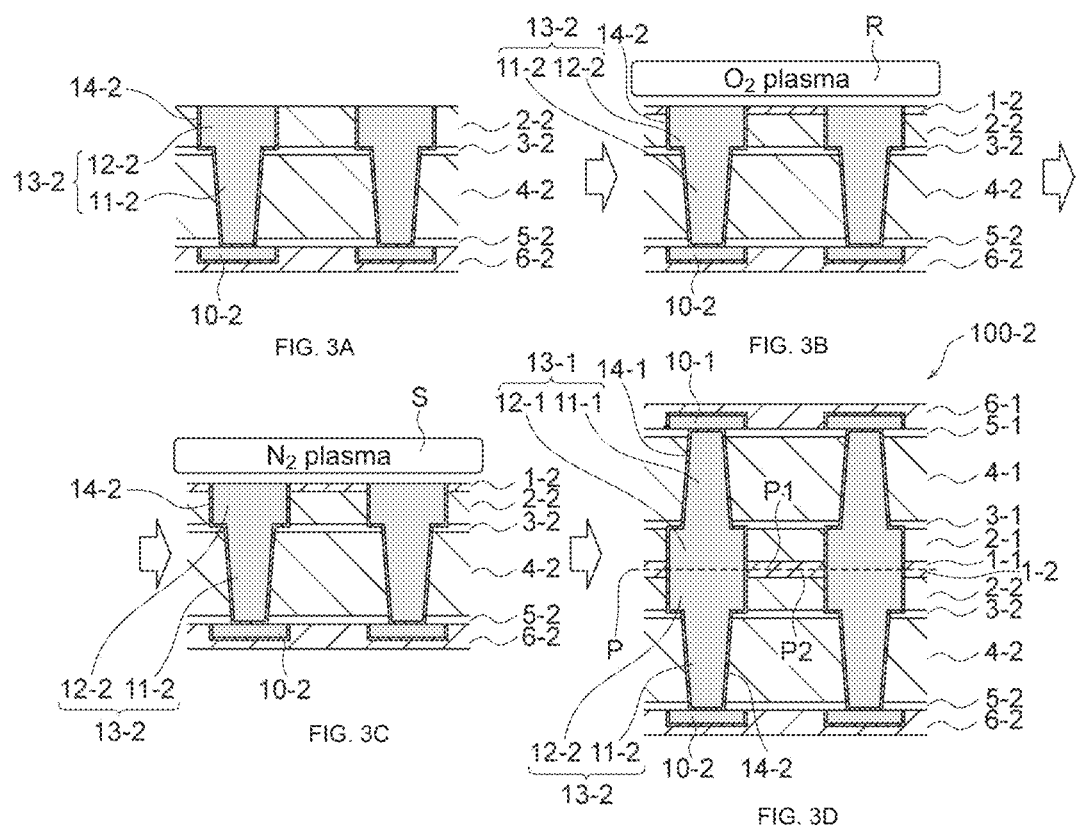

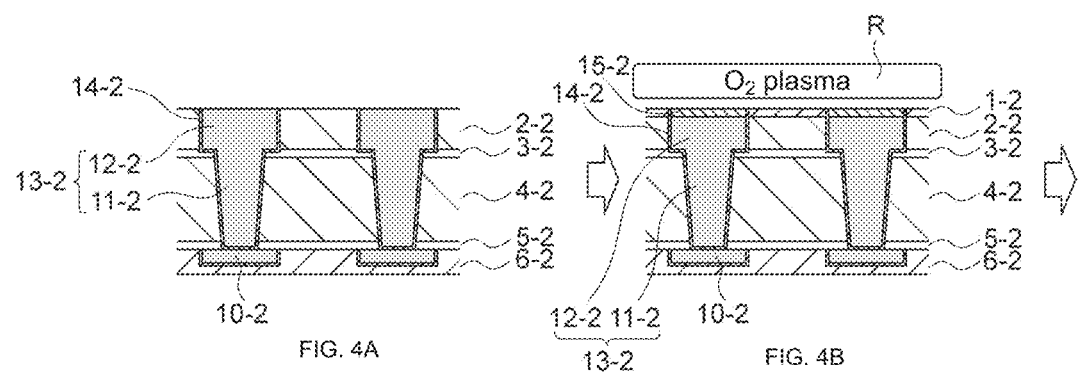
FIG. 4A
FIG. 4B
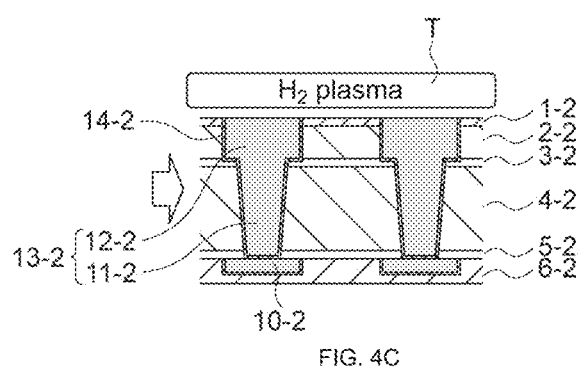
FIG. 4C

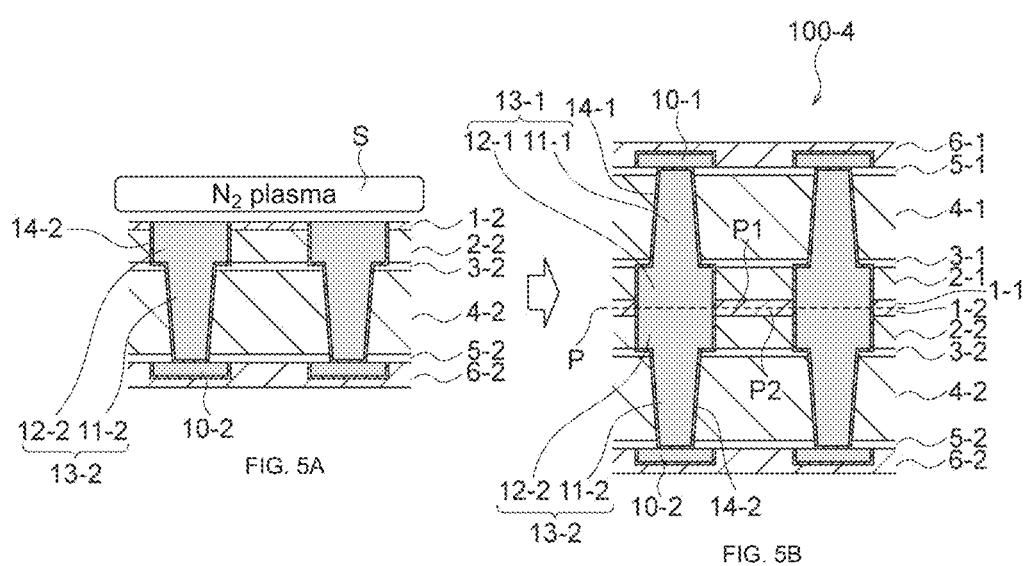

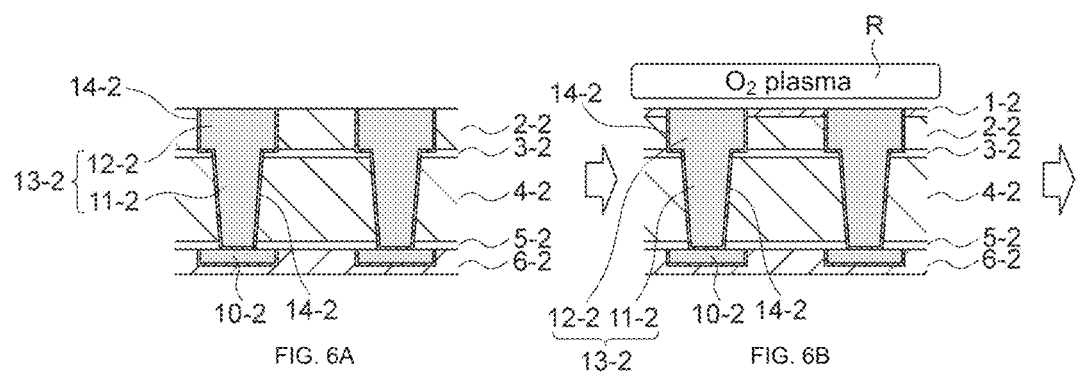
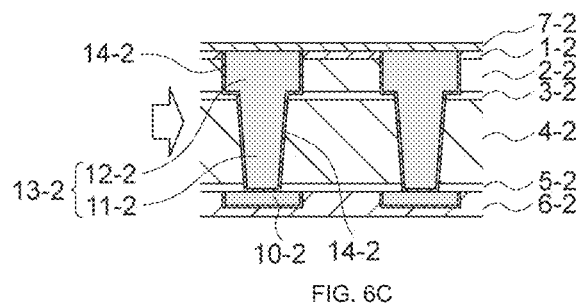

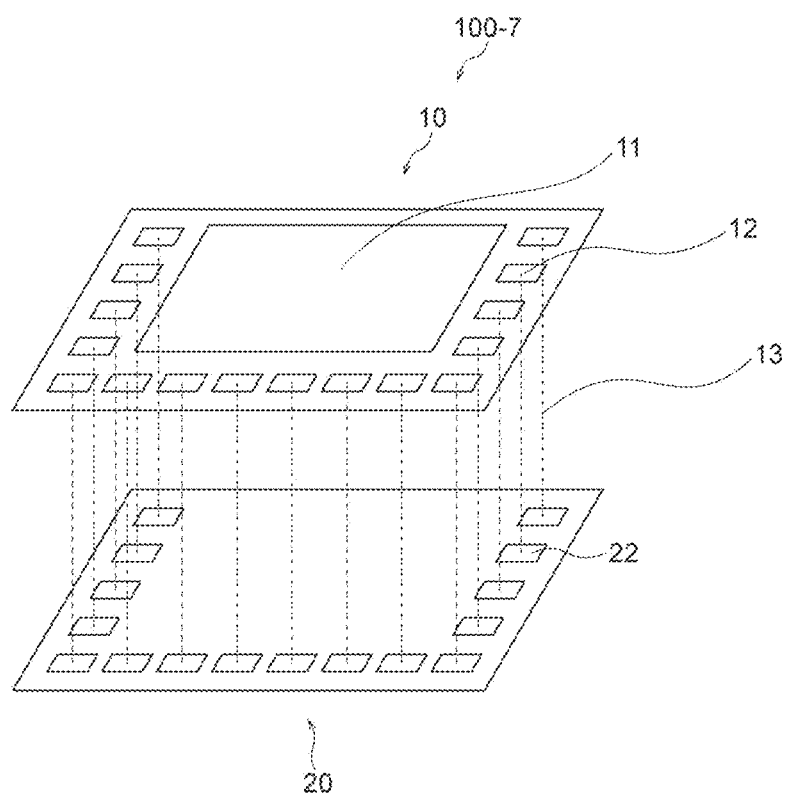

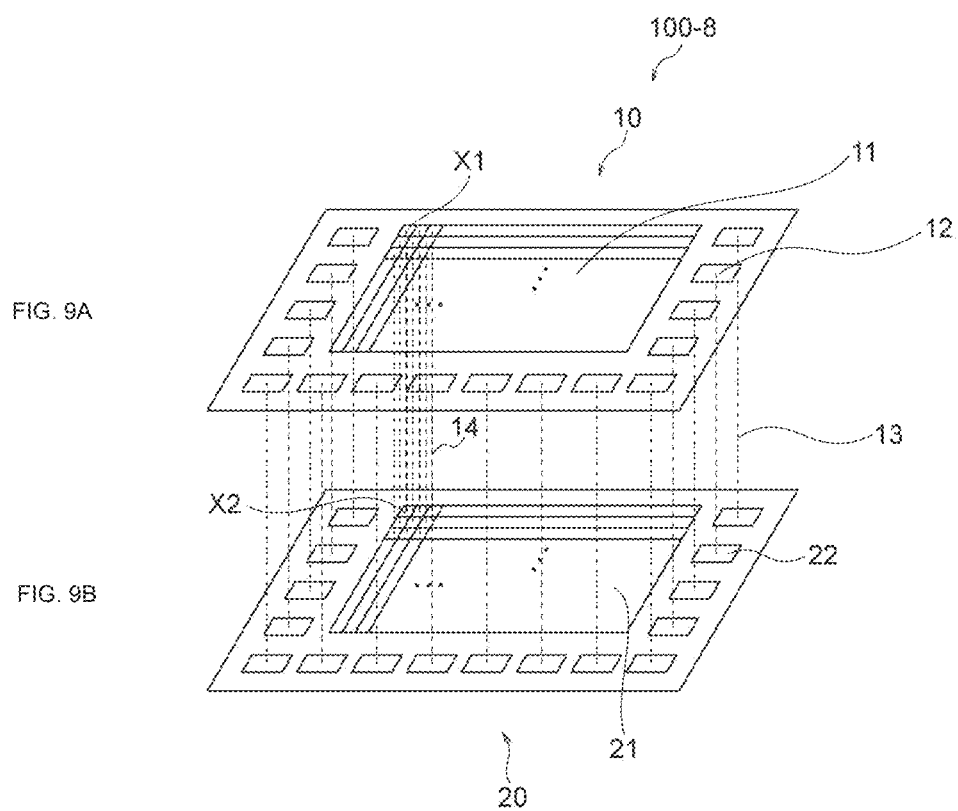

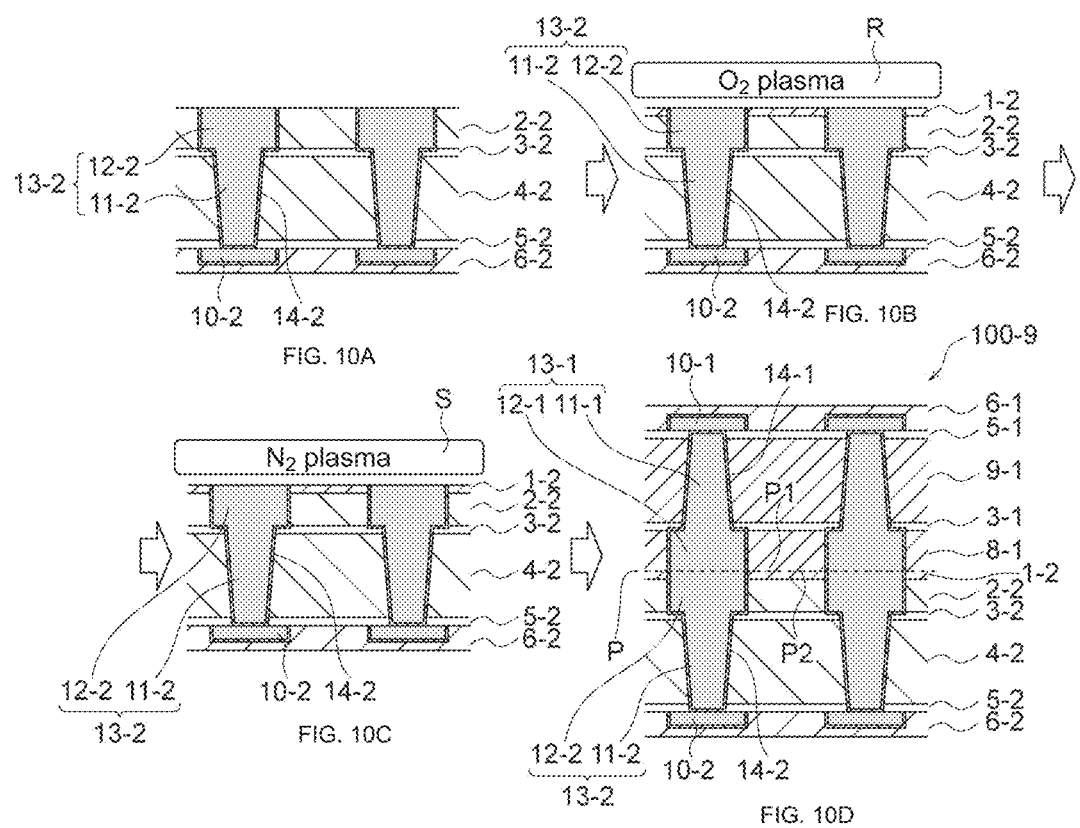

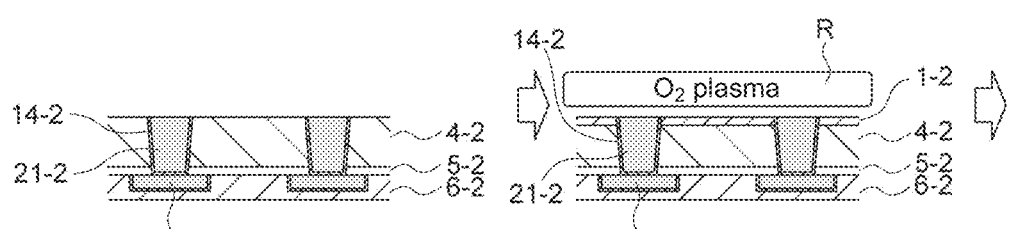
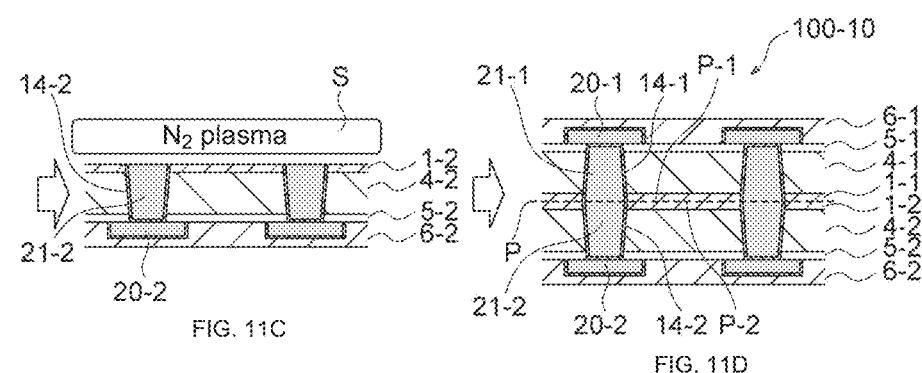

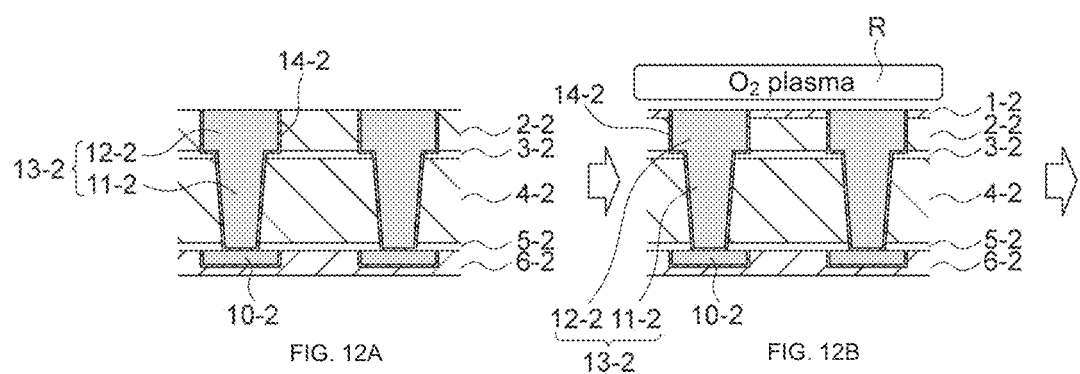
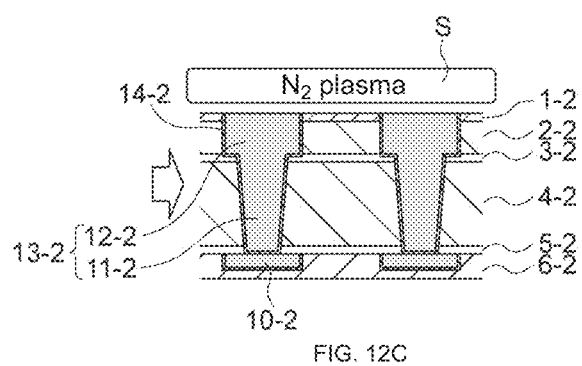

SOLID-STATE IMAGING DEVICE AND ELECTRONIC APPARATUS

CROSS REFERENCE TO RELATED APPLICATIONS

This application is a U.S. National Phase of International Patent Application No. PCT/JP2020/015447 filed on Apr. 6, 2020, which claims priority benefit of Japanese Patent Application No. JP 2019-094699 filed in the Japan Patent Office on May 20, 2019. Each of the above-referenced applications is hereby incorporated herein by reference in its entirety.

TECHNICAL FIELD

The present technology relates to a solid-state imaging device and an electronic apparatus.

BACKGROUND ART

In recent years, mobile devices and the like such as digital still cameras, digital video cameras, camera-equipped cell phones, and personal digital assistants (PDAs) have been widespread more and more, and demand for solid-state imaging devices (image sensors), which play central roles in such mobile devices, have increased. Under such a situation, technologies of a solid-state imaging device including two or more substrates, which are bonded, have been actively developed, and each of the substrates includes their own elements and wiring to achieve highly integrated solid-state imaging devices (image sensors), downsized solid-state imaging devices, densely arrayed pixels, and the like.

For example, Patent Literature 1 and Patent Literature 2 proposes technologies of improving reliability of junction of two or more substrates (two semiconductor members, each of which includes their own elements and wiring.

CITATION LIST

Patent Literature

Patent Literature 1: JP 2012-256736A
Patent Literature 2: JP 2013-038112A

DISCLOSURE OF INVENTION

Technical Problem

However, according to the technologies proposed by Patent Literatures 1 and 2, it may be impossible to further improve the reliability of junction in the solid-state imaging device including two or more substrates, which are bonded to each other.

The present technology has been made in view of the above-described situations, and a main object of the present technology is to provide a solid-state imaging device that makes it possible to further improve reliability of junction, and to provide an electronic apparatus provided with the solid-state imaging device.

Solution to Problem

As a result of extensive research to achieve the above-mentioned object, the present inventors have succeeded in further improvement of reliability of junction, and completed the present technology.

In other words, according to a first aspect of the present technology, there is provided a solid-state imaging device including: a first substrate including at least a first electrode, a first modification layer, a first low-permittivity layer formed on the first modification layer, and a first joint surface where the first electrode and the first modification layer are exposed; and a second substrate including at least a second electrode, a second modification layer, a second low-permittivity layer formed on the second modification layer, and a second joint surface where the second electrode and the second modification layer are exposed. The first modification layer has higher hydrophilicity than the first low-permittivity layer. The second modification layer has higher hydrophilicity than the second low-permittivity layer. The first substrate and the second substrate form a laminate structure and are electrically connected by bonding the first joint surface and the second joint surface.

In the solid-state imaging device according to the first aspect of the present technology, the first low-permittivity layer may include SiOC, the first modification layer may include Si atoms, O atoms, and C atoms, and concentration of the C atoms in the first modification layer may decrease toward the first joint surface.

In the solid-state imaging device according to the first aspect of the present technology, the first low-permittivity layer may include SiOC, the first modification layer may include Si atoms, O atoms, and C atoms, and concentration of the O atoms in the first modification layer may increase toward the first joint surface.

In the solid-state imaging device according to the first aspect of the present technology, the first low-permittivity layer may include SiOC, the first modification layer may include Si atoms, O atoms, and C atoms, concentration of the C atoms in the first modification layer may decrease toward the first joint surface, and concentration of the O atoms in the first modification layer may increase toward the first joint surface.

In the solid-state imaging device according to the first aspect of the present technology, the second low-permittivity layer may include SiOC, the second modification layer may include Si atoms, O atoms, and C atoms, and concentration of the C atoms in the second modification layer may decrease toward the second joint surface.

In the solid-state imaging device according to the first aspect of the present technology, the second low-permittivity layer may include SiOC, the second modification layer may include Si atoms, O atoms, and C atoms, and concentration of the O atoms in the second modification layer may increase toward the second joint surface.

In the solid-state imaging device according to the first aspect of the present technology, the second low-permittivity layer may include SiOC, the second modification layer may include Si atoms, O atoms, and C atoms, concentration of the C atoms in the second modification layer may decrease toward the second joint surface, and concentration of the O atoms in the second modification layer may increase toward the second joint surface.

In the solid-state imaging device according to the first aspect of the present technology, the first low-permittivity layer may include SiOC, the second low-permittivity layer may include SiOC, the first modification layer may include Si atoms, O atoms, and C atoms, the second modification layer may include Si atoms, O atoms, and C atoms, concentration of the C atoms in the first modification layer may decrease toward the first joint surface, and concentration of the C atoms in the second modification layer may decrease toward the second joint surface.

In the solid-state imaging device according to the first aspect of the present technology, the first low-permittivity layer may include SiOC, the second low-permittivity layer may include SiOC, the first modification layer may include Si atoms, O atoms, and C atoms, the second modification layer may include Si atoms, O atoms, and C atoms, concentration of the O atoms in the first modification layer may increase toward the first joint surface, and concentration of the O atoms in the second modification layer may increase toward the second joint surface.

In the solid-state imaging device according to the first aspect of the present technology, the first low-permittivity layer may include SiOC, the second low-permittivity layer may include SiOC, the first modification layer may include Si atoms, O atoms, and C atoms, the second modification layer may include Si atoms, O atoms, and C atoms, concentration of the C atoms in the first modification layer may decrease toward the first joint surface, concentration of the O atoms in the first modification layer may increase toward the first joint surface, concentration of the C atoms in the second modification layer may decrease toward the second joint surface, and concentration of the O atoms in the second modification layer may increase toward the second joint surface.

In the solid-state imaging device according to the first aspect of the present technology, the first low-permittivity layer may include SiOC, the second low-permittivity layer may include SiOC, the first modification layer may include Si atoms, O atoms, and C atoms, the second modification layer may include Si atoms, O atoms, and C atoms, concentration of the C atoms in the first modification layer may decrease toward the first joint surface, and concentration of the O atoms in the second modification layer may increase toward the second joint surface.

In the solid-state imaging device according to the first aspect of the present technology, the first low-permittivity layer may include SiOC, the second low-permittivity layer may include SiOC, the first modification layer may include Si atoms, O atoms, and C atoms, the second modification layer may include Si atoms, O atoms, and C atoms, concentration of the O atoms in the first modification layer may increase toward the first joint surface, and concentration of the C atoms in the second modification layer may decrease toward the second joint surface.

In the solid-state imaging device according to the first aspect of the present technology, the first low-permittivity layer may include SiOC, the second low-permittivity layer may include SiOC, the first modification layer may include Si atoms, O atoms, and C atoms, the second modification layer may include Si atoms, O atoms, and C atoms, concentration of the C atoms in the first modification layer may decrease toward the first joint surface, concentration of the O atoms in the first modification layer may increase toward the first joint surface, and concentration of the C atoms in the second modification layer may decrease toward the second joint surface.

In the solid-state imaging device according to the first aspect of the present technology, the first low-permittivity layer may include SiOC, the second low-permittivity layer may include SiOC, the first modification layer may include Si atoms, O atoms, and C atoms, the second modification layer may include Si atoms, O atoms, and C atoms, concentration of the C atoms in the first modification layer may decrease toward the first joint surface, concentration of the O atoms in the first modification layer may increase toward the first joint surface, and concentration of the O atoms in the second modification layer may increase toward the second joint surface.

In the solid-state imaging device according to the first aspect of the present technology, the first low-permittivity layer may include SiOC, the second low-permittivity layer may include SiOC, the first modification layer may include Si atoms, O atoms, and C atoms, the second modification layer may include Si atoms, O atoms, and C atoms, concentration of the C atoms in the first modification layer may decrease toward the first joint surface, concentration of the C atoms in the second modification layer may decrease toward the second joint surface, and concentration of the O atoms in the second modification layer may increase toward the second joint surface.

In the solid-state imaging device according to the first aspect of the present technology, the first low-permittivity layer may include SiOC, the second low-permittivity layer may include SiOC, the first modification layer may include Si atoms, O atoms, and C atoms, the second modification layer may include Si atoms, O atoms, and C atoms, concentration of the O atoms in the first modification layer may increase toward the first joint surface, concentration of the C atoms in the second modification layer may decrease toward the second joint surface, and concentration of the O atoms in the second modification layer may increase toward the second joint surface.

In the solid-state imaging device according to the first aspect of the present technology, the first substrate and/or the second substrate may further include an insulating thin film, and the insulating thin film may be exposed on the first joint surface and/or the second joint surface.

In the solid-state imaging device according to the first aspect of the present technology, each of the first low-permittivity layer and the second low-permittivity layer may include at least one selected from a group consisting of SiOC, SiOF, SiOCH, SiCOH, hydrogen silsesquioxane, and methylsilsesquioxane.

In the solid-state imaging device according to the first aspect of the present technology, the first joint surface and the second joint surface may be bonded via the first electrode and the second electrode, the first joint surface and the second joint surface may be bonded via the first modification layer and the second electrode, the first joint surface and the second joint surface may be bonded via the first electrode and the second modification layer.

In the solid-state imaging device according to the first aspect of the present technology, the first substrate may include a pixel area where a plurality of pixels including photoelectric converters is arrayed, the second substrate may include a peripheral circuit section that includes at least a logic circuit and that is formed on a periphery of the pixel area, the first electrode of the first substrate may be formed in an area outside of the pixel area and may be electrically connected to the second electrode of the second substrate, and the first electrode of the first substrate may be formed in the pixel area and may be electrically connected to the second electrode of the second substrate.

In the solid-state imaging device according to the first aspect of the present technology, the first substrate may include a pixel area where a plurality of pixels including photoelectric converters is arrayed, the second substrate may include a peripheral circuit section that includes at least a logic circuit and that is formed on a periphery of the pixel area, and the first electrode of the first substrate may be formed in the pixel area and may be electrically connected to the second electrode of the second substrate.

In addition, according to a second aspect of the present technology, there is provided a solid-state imaging device including: a first substrate including at least a first electrode, an insulating layer, and a first joint surface where the first electrode and the insulating layer are exposed; and a second substrate including at least a second electrode, a modification layer, a low-permittivity layer formed on the modification layer, and a second joint surface where the second electrode and the modification layer are exposed. The modification layer has higher hydrophilicity than the low-permittivity layer. The first substrate and the second substrate form a laminate structure and are electrically connected by bonding the first joint surface and the second joint surface.

In the solid-state imaging device according to the second aspect of the present technology, the low-permittivity layer may include SiOC, the modification layer may include Si atoms, O atoms, and C atoms, and concentration of the C atoms in the modification layer may decrease toward the second joint surface.

In the solid-state imaging device according to the second aspect of the present technology, the low-permittivity layer may include SiOC, the modification layer may include Si atoms, O atoms, and C atoms, and concentration of the O atoms in the modification layer may increase toward the second joint surface.

In the solid-state imaging device according to the second aspect of the present technology, the low-permittivity layer may include SiOC, the modification layer may include Si atoms, O atoms, and C atoms, concentration of the C atoms in the modification layer may decrease toward the second joint surface, and concentration of the O atoms in the modification layer may increase toward the second joint surface.

In the solid-state imaging device according to the second aspect of the present technology, the first substrate and/or the second substrate may further include an insulating thin film, and the insulating thin film may be exposed on the first joint surface and/or the joint surface.

In the solid-state imaging device according to the second aspect of the present technology, the low-permittivity layer may include at least one selected from a group consisting of SiOC, SiOF, SiOCH, SiCOH, hydrogen silsesquioxane, and methylsilsesquioxane.

In the solid-state imaging device according to the second aspect of the present technology, the first joint surface and the second joint surface may be bonded via the first electrode and the second electrode, the first joint surface and the second joint surface may be bonded via the insulating layer and the second electrode, the first joint surface and the second joint surface may be bonded via the first electrode and the modification layer.

In the solid-state imaging device according to the second aspect of the present technology, the first substrate may include a pixel area where a plurality of pixels including photoelectric converters is arrayed, the second substrate may include a peripheral circuit section that includes at least a logic circuit and that is formed on a periphery of the pixel area, the first electrode of the first substrate may be formed in an area outside of the pixel area and may be electrically connected to the second electrode of the second substrate, and the first electrode of the first substrate may be formed in the pixel area and may be electrically connected to the second electrode of the second substrate.

In the solid-state imaging device according to the second aspect of the present technology, the first substrate may include a pixel area where a plurality of pixels including photoelectric converters is arrayed, the second substrate may include a peripheral circuit section that includes at least a logic circuit and that is formed on a periphery of the pixel area, and the first electrode of the first substrate may be formed in the pixel area and may be electrically connected to the second electrode of the second substrate.

In addition, according to the present technology, there is provided an electronic apparatus including the solid-state imaging device according to the first aspect of the present technology or the solid-state imaging device according to the second aspect of the present technology.

According to the present technology, it is possible to further improve reliability of junction. Note that the effects described here are not necessarily limited, and any effect that is desired to be described in the present disclosure may be exhibited.

BRIEF DESCRIPTION OF DRAWINGS

FIGS. 3A, 3B, 3C, and 3D are cross-sectional views for describing a method of producing the solid-state imaging device according to the first embodiment of the present technology.

FIGS. 4A, 4B, and 4C are cross-sectional views for describing a method of producing the solid-state imaging device according to the first embodiment of the present technology.

FIGS. 5A and 5B are cross-sectional views for describing the method of producing the solid-state imaging device according to the first embodiment of the present technology.

FIGS. 6A, 6B, and 6C are cross-sectional views for describing a method of producing a solid-state imaging device according to a second embodiment of the present technology.

FIGS. 8A and 8B are perspective views of a configuration example of a solid-state imaging device according to a third embodiment of the present technology.

FIGS. 9A and 9B are perspective views of a configuration example of a solid-state imaging device according to a fourth embodiment of the present technology.

FIGS. 10A, 10B, 10C, and 10D are cross-sectional views for describing a method of producing a solid-state imaging device according to a fifth embodiment of the present technology.

FIGS. 11A, 11B, 11C, and 11D are cross-sectional views for describing a method of producing a solid-state imaging device according to a sixth embodiment of the present technology.

FIGS. 12A, 12B, and 12C are cross-sectional views for describing a method of producing a solid-state imaging device according to a seventh embodiment of the present technology.

MODE(S) FOR CARRYING OUT THE INVENTION

Figures 1A, 1B:
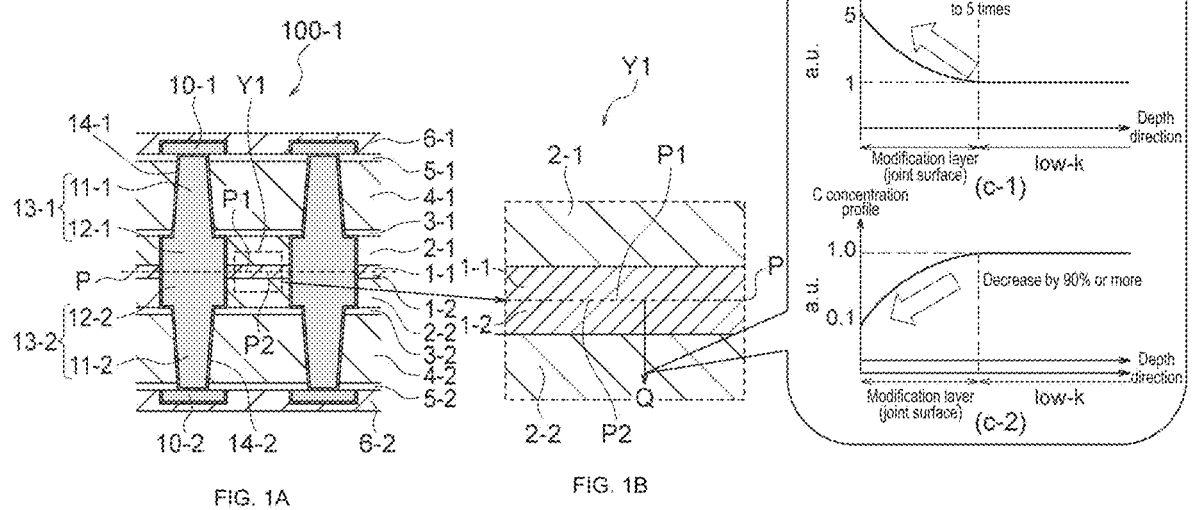
FIGS. 1A and 1B are diagrams illustrating a configuration example of a solid-state imaging device according to the present technology.

Suitable embodiments for implementing the present technology will be described below. It will be understood that the embodiments described below are typical embodiments of the present technology and should not be construed as limiting the scope of the present technology. Note that, with regard to the drawings, the terms "top", "on", "above", and the like mean an upper direction or an upper side of the drawings, the terms "bottom", "under", "below", and the like mean a lower direction or a lower side of the drawings, the term "left" means a left direction or a left side of the drawings, and the term "right" means a right direction or a right side of the drawings, unless otherwise described. In addition, with regard to the drawings, elements or members same with or similar to each other are denoted with a same reference sign, and redundant description thereof will be omitted.

Note that the description will be given in the following order.

1. Overview of Present Technology
2. First Embodiment (First Example of Solid-State Imaging Device and Method of Producing Solid-State Imaging Device of First Example)
3. Second Embodiment (Second Example of Solid-State Imaging Device and Method of Producing Solid-State Imaging Device of Second Example)
4. Third Embodiment (Third Example of Solid-State Imaging Device)
5. Fourth Embodiment (Fourth Example of Solid-State Imaging Device)
6. Fifth Embodiment (Fifth Example of Solid-State Imaging Device and Method of Producing Solid-State Imaging Device of Fifth Example)
7. Sixth Embodiment (Sixth Example of Solid-State Imaging Device and Method of Producing Solid-State Imaging Device of Sixth Example)
8. Seventh Embodiment (Seventh Example of Solid-State Imaging Device and Method of Producing Solid-State Imaging Device of Seventh Example)
9. Eighth Embodiment (Example of Electronic Apparatus)
10. Example of How to Use Solid-State Imaging Device According to Present Technology
11. Example of Application of Solid-State Imaging Device According to Present Technology 1. Overview of Present Technology First, an overview of the present technology will be described.

For example, a solid-state imaging device has a structure obtained by stacking a sensor board (first substrate) and a circuit board (second substrate). The sensor board includes a pixel section (pixel area). The circuit board includes a peripheral circuit section such as a logic circuit that executes various kinds of signal processing related to operation of the solid-state imaging device. The two substrates are directly joined via their flat surfaces. A joint surface is present between wiring of the respective substrates, and the joint surface includes a region of electrode such as Cu electrode and a region of low-permittivity layer (insulating layer) including low-k material such as SiOC.

With regard to the solid-state imaging device (device) stacked through hybrid bonding (such as Cu—Cu bonding), it is possible to reduce capacity between electrodes by using a low-k film (low-permittivity layer) like SiOC as a passivation film around the electrodes. However, SiOC or the like has many carbon atoms (C), has lower hydrophilicity than $SiO_2$ in general, and has less hydroxyl groups on a film surface. Therefore, this makes it difficult to cause dehydration between hydroxyl groups on surfaces of substrates facing to each other when joining the plurality of substrates. For example, the number of Si—O—Si bonds between the substrates (for example in vicinity of a joint part between two substrates) is less than $SiO_2$, and sometimes low joint strength is obtained.

Figures 17A, 17B:
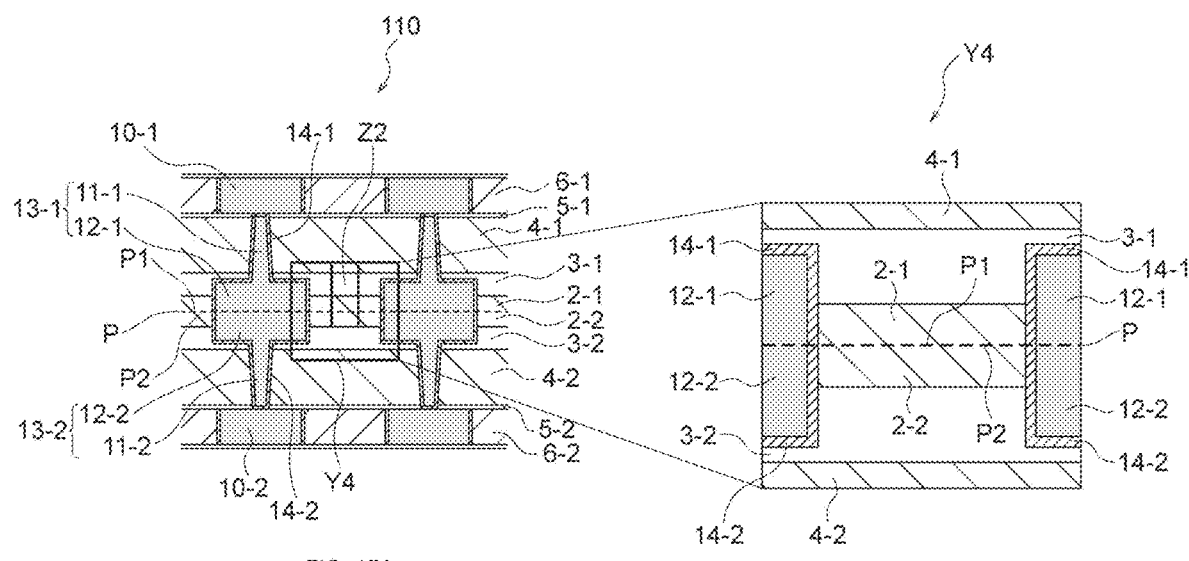
FIGS. 17A and 17B are cross-sectional views of a configuration example of a solid-state imaging device.

FIGS. 17A and 17B are cross-sectional views of a configuration example of a solid-state imaging device. FIG. 17A is a cross-sectional view of a solid-state imaging device 110, and FIG. 17B is an enlarged cross-sectional view of a portion Y4 illustrated in FIG. 17A.

As illustrated in FIGS. 17A and FIG. 17B, a first substrate of the solid-state imaging device 110 includes a first electrode 13-1, a first low-permittivity layer 2-1, and a first joint surface P1 where the first electrode 13-1 and the first low-permittivity layer 2-1 are exposed. In addition, the first substrate of the solid-state imaging device 110 includes an SiN layer 3-1 formed on the first low-permittivity layer 2-1 (upper direction in FIG. 17A), a first low-permittivity layer 4-1 formed on the SiN layer 3-1 (upper direction in FIG. 17A), an SiN layer 5-1 formed on the first low-permittivity layer 4-1 (upper direction in FIG. 17A), and an interlayer insulating film 6-1 (such as SiO2) formed on the SiN layer 5-1 (upper direction in FIG. 17A). In the interlayer insulating film 6-1 (such as SiO2), first wiring 10-1 is embedded, and the first wiring 10-1 is connected to the first electrode 13-1. The first electrode 13-1 includes a via 11-1 and a trench 12-1.

A second substrate of the solid-state imaging device 110 includes a second electrode 13-2, a second low-permittivity layer 2-2, and a second joint surface P2 where the second electrode 13-2 and the second low-permittivity layer 2-2 are exposed. In addition, the second substrate of the solid-state imaging device 110 includes an SiN layer 3-2 formed on the second low-permittivity layer 2-2 (lower direction in FIG. 17A), a second low-permittivity layer 4-2 formed on the SiN layer 3-2 (lower direction in FIG. 17A), an SiN layer 5-2 formed on the second low-permittivity layer 4-2 (lower direction in FIG. 17A), and an interlayer insulating film 6-2 (such as SiO2) formed on the SiN layer 5-2 (lower direction in FIG. 17A). In the interlayer insulating film 6-2 (such as SiO2), second wiring 10-2 is embedded, and the first wiring 10-2 is connected to the second electrode 13-2. The second electrode 13-2 includes a via 11-2 and a trench 12-2.

A barrier metal layer 14-1 is formed between a group of the first electrode 13-1 and the first wiring 10-1, and a group of the first low-permittivity layer 2-1, the SiN layer 3-1, the first low-permittivity layer 4-1, the SiN layer 5-1, and the interlayer insulating film 6-1 (such as $SiO_2$). In addition, a barrier metal layer 14-2 is formed between a group of the second electrode 13-2 and the second wiring 10-2, and a group of the second low-permittivity layer 2-2, the SiN layer 3-2, the second low-permittivity layer 4-2, the SiN layer 5-2, and the interlayer insulating film 6-2 (such as $SiO_2$). The barrier metal layers 14-1 and 14-2 include Ta, Ti, Ru, TaN, TiN, or the like, for example.

A joint part P is formed by bonding the first joint surface P1 and the second joint surface P2 of the solid-state imaging device 110, and the first substrate and the second substrate form a laminate structure and are electrically connected.

In a region Z2 illustrated in FIG. 17A, SioC serving as the low-permittivity layer (low-k film) is used as a passivation film. This makes it possible to reduce capacity between the adjacent electrodes (such as capacity between the first electrodes 13-1 and capacity between the second electrodes 13-2). However, an SiOC surface has lower hydrophilicity and has less hydroxyl groups near the joint part P illustrated in FIGS. 17A and 17B. Therefore, sometimes less Si—O—S1 bonds are formed, and low joint strength is obtained.

The present technology has been made in view of the above-described issues. According to the present technology, there is provided a solid-state imaging device including: a first substrate including at least a first electrode, a first modification layer, a first low-permittivity layer formed on the first modification layer, and a first joint surface where the first electrode and the first modification layer are exposed; and a second substrate including at least a second electrode, a second modification layer, a second low-permittivity layer formed on the second modification layer, and a second joint surface where the second electrode and the second modification layer are exposed. The first substrate and the second substrate form a laminate structure and are electrically connected by bonding the first joint surface and the second joint surface. The first modification layer of the solid-state imaging device according to the present technology has higher hydrophilicity than the first low-permittivity layer. The second modification layer of the solid-state imaging device according to the present technology has higher hydrophilicity than the second low-permittivity layer.

The present technology makes it possible to further improve reliability of junction of two or more substrates. More specifically, the first low-permittivity layer and the second low-permittivity layer (low-k films) are used as passivation films around the first electrode and the second electrode, and a modification layer having higher hydrophilicity is formed on a joint surface (front surface) of the first substrate and a joint surface (front surface) of the second substrate. This makes it possible to reduce capacity between adjacent electrodes (for example, capacity between the first electrodes and capacity between the second electrodes), and to bond the first substrate and the second substrate with high joint strength. In addition, when using the solid-state imaging device according to a first embodiment of the present technology (first example of solid-state imaging device) it is possible to reduce capacity between adjacent electrodes (for example, capacity between the first electrodes and capacity between the second electrodes) while maintaining high joint strength between the first substrate and the second substrate.

Next, details of the present technology will be described with reference to FIGS. 1A and 1B.

FIGS. 1A and 1B are diagrams illustrating a configuration example of a solid-state imaging device according to the present technology. FIG. 1A is a cross-sectional view of a solid-state imaging device 100-1. FIG. 1B is an enlarged cross-sectional view of a portion Y1 illustrated in FIG. 1A. FIGS. 1A and 1B(C-1) illustrate a profile of oxygen (O) concentration (vertical axis) with respect to a depth direction from the joint surface P2 of the second substrate (lower direction illustrated in FIG. 1B indicated by an arrow Q) (horizontal axis). FIGS. 1A and 1B(C-2) illustrate a profile of carbon (C) concentration (vertical axis) with respect to the depth direction from the joint surface P2 of the second substrate (lower direction illustrated in FIG. 1B indicated by the arrow Q) (horizontal axis).

As illustrated in FIGS. 1A and 1B, a first substrate of the solid-state imaging device 100-1 includes a first electrode 13-1, a first modification layer 1-1, a first low-permittivity layer 2-1 formed on the first modification layer 1-1 (upper direction in FIG. 1A), and a first joint surface P1 where the first electrode 13-1 and the first modification layer 1-1 are exposed. In addition, the first substrate of the solid-state imaging device 110-1 includes an SiN layer 3-1 formed on the first low-permittivity layer 2-1 (upper direction in FIG. 1A), a first low-permittivity layer 4-1 formed on the SiN layer 3-1 (upper direction in FIG. 1A), an SiN layer 5-1 formed on the first low-permittivity layer 4-1 (upper direction in FIG. 1A), and an interlayer insulating film 6-1 (such as SiO2) formed on the SiN layer 5-1 (upper direction in FIG. 1A). In the interlayer insulating film 6-1 (such as SiO2), first wiring 10-1 is embedded, and the first wiring 10-1 is connected to the first electrode 13-1. The first electrode 13-1 includes a via 11-1 and a trench 12-1.

A second substrate of the solid-state imaging device 100-1 includes a second electrode 13-2, a second modification layer 1-2, a second low-permittivity layer 2-2 formed on the second modification layer 1-2 (lower direction in FIG. 1A), and a second joint surface P2 where the second electrode 13-2 and the second modification layer 1-2 are exposed. In addition, the second substrate of the solid-state imaging device 100-1 includes an SiN layer 3-2 formed on the second low-permittivity layer 2-2 (lower direction in FIG. 1A), a second low-permittivity layer 4-2 formed on the SiN layer 3-2 (lower direction in FIG. 1A), an SiN layer 5-2 formed on the second low-permittivity layer 4-2 (lower direction in FIG. 1A), and an interlayer insulating film 6-2 (such as SiO2) formed on the SiN layer 5-2 (lower direction in FIG. 1A). In the interlayer insulating film 6-2 (such as SiO2), second wiring 10-2 is embedded, and the first wiring 10-2 is connected to the second electrode 13-2. The second electrode 13-2 includes a via 11-2 and a trench 12-2.

A barrier metal layer 14-1 is formed between a group of the first electrode 13-1 and the first wiring 10-1, and a group of the first modification layer 1-1, the first low-permittivity layer 2-1, the SiN layer 3-1, the first low-permittivity layer 4-1, the SiN layer 5-1, and the interlayer insulating film 6-1 (such as $SiO_2$). In addition, a barrier metal layer 14-2 is formed between a group of the second electrode 13-2 and the second wiring 10-2, and a group of the second modification layer 1-2, the second low-permittivity layer 2-2, the SiN layer 3-2, the second low-permittivity layer 4-2, the SiN layer 5-2, and the interlayer insulating film 6-2 (such as $SiO_2$). The barrier metal layers 14-1 and 14-2 include Ta, Ti, Ru, TaN, TiN, or the like, for example.

A joint part P is formed by bonding the first joint surface P1 and the second joint surface P2 of the solid-state imaging device 100-11, and the first substrate and the second substrate form a laminate structure and are electrically connected.

As illustrated in FIGS. 1A and 1B(C-1) and FIGS. 1A and 1B(C-2), the first modification layer 1-1 and the second modification layer 1-2 are formed near the first joint surface P1 of the first substrate and the second joint surface P2 of the second substrate. The first modification layer 1-1 and the second modification layer 1-2 are derived from the first low-permittivity layer 2-1 and the second low-permittivity layer 202 (low-k films) that have low carbon (C) concentration. The first modification layer 1-1 and the second modification layer 1-2 are configured in such a manner that the carbon (C) concentration decreases (in other words, tapers) toward the first joint surface P1 and the second joint surface P2 and the oxygen (O) concentration increases (in other words, escalates) toward the first joint surface P1 and the second joint surface P2. The first substrate and the second substrate are joined by bonding the first joint surface P1 where the first electrode 13-1 and the first modification layer 1-1 are exposed and the second joint surface P2 where the second electrode 13-2 and the second modification layer 1-2 are exposed. The first modification layer 1-1 and the second modification layer 1-2 have more hydroxyl groups on their surface than SiOC. Therefore, many Si—O—Si bonds are formed near the joint part P between the first substrate and the second substrate, and this makes it possible to increase joint strength.

Next, a configuration example (first configuration example to fifth configuration example) of the whole solid-state imaging device to which the present technology is applicable will be described.

First Configuration Example

Figure 14:
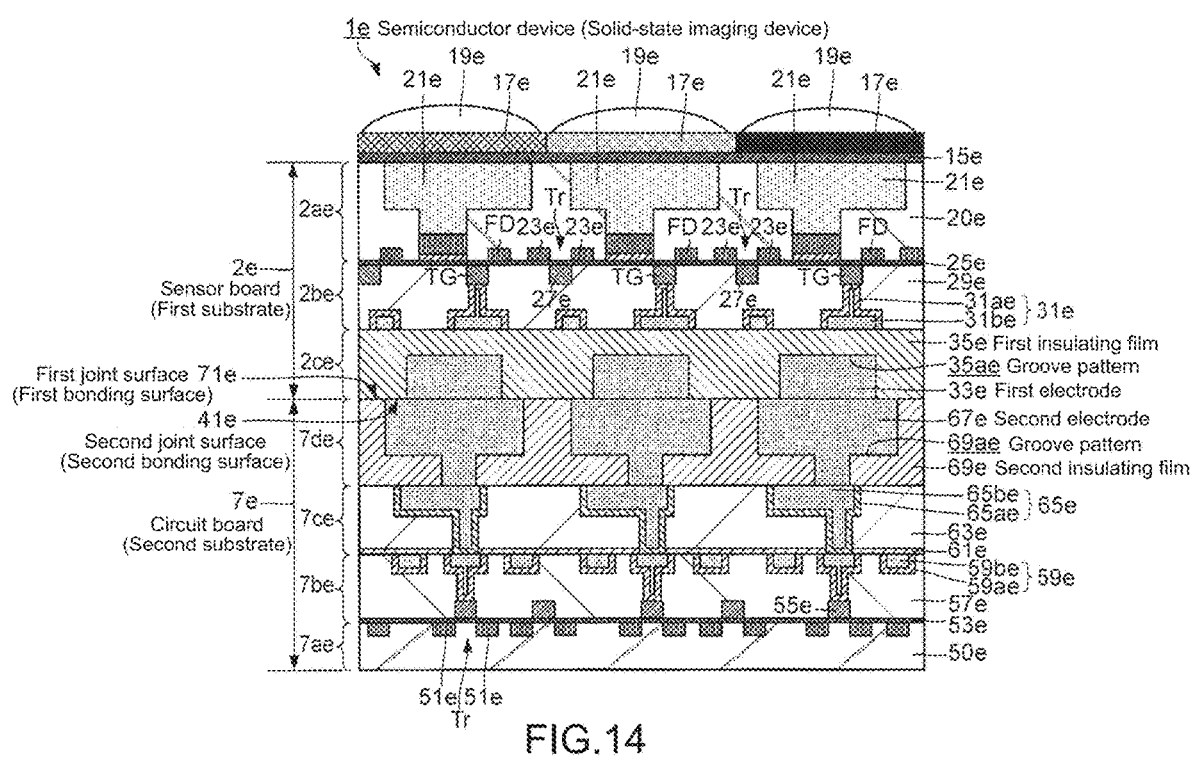
FIG. 14 is a cross-sectional view of a configuration example of a solid-state imaging device according to the present technology.

FIG. 14 is a cross-sectional view of a first configuration example of the solid-state imaging device according to the present technology.

As described above, a semiconductor device 1e illustrated in FIG. 14 is a solid-state imaging device with a three-dimensional structure in which a sensor board 2e (first substrate) and a circuit board 7e (second substrate) are bonded together in a state where they are stacked. The sensor board 2e includes a semiconductor layer 2ae, a wiring layer 2be, and an electrode layer 2ce. The wiring layer 2be is disposed on a surface of the semiconductor layer 2ae which surface is on the side of the circuit board 7e. The circuit board 7e includes a semiconductor layer 7ae, a wiring layer 7be, and an electrode layer 7de. The wiring layer 7be is disposed on a surface of the semiconductor layer 7ae which surface is on the side of the sensor board 2e.

The sensor board 2e and the circuit board 7e are bonded via bonding surfaces, which are a surface of the electrode layer 2ce and a surface of the electrode layer 7de. As will be described in detail, one of features of the first configuration example is the configurations of the electrode layer 2ce and the electrode layer 7de.

In addition, a protective film 15e, a color filter layer 17e, and an on-chip lens 19e are stacked in this order on a surface of the sensor board 2e which surface is on an opposite side from the circuit board 7e.

Next, detailed configurations of the respective layers included in the sensor board 2e and the circuit board 7e will be described successively. In addition, the configurations of the protective film 15e, the color filter layer 17e, and the on-chip lens 19e will be described successively.

[Semiconductor Layer 2ae (on Side of Sensor Board 2e)]

The semiconductor layer 2ae on the side of the sensor board 2e is formed by thinning a semiconductor substrate 20e made of single crystal silicon, for example. In the semiconductor layer 2ae, a photoelectric converter 21e formed of an n-type impurity layer (or a p-type impurity layer), for example, is provided for each pixel on the side of a first surface on which the color filter layer 17e, the on-chip lens 19e, and the like are arranged. In addition, a floating diffusion FD, a source/drain 23e of a transistor Tr, another impurity layer (not illustrated in FIG. 14), and the like are provided on the side of the second surface of the semiconductor layer 2ae. The floating diffusion FD and the source/drain 23e are formed of an n+ type impurity layer.

[Wiring Layer 2be (on Side of Sensor Board 2e)]

The wiring layer 2be on the semiconductor layer 2ae in the sensor board 2e has a transfer gate TG, a gate electrode 27e of the transistor Tr, and other electrodes (not illustrated in FIG. 14) on the side of an interface between the wiring layer 2be and the semiconductor layer 2ae. The transfer gate TG and the gate electrode 27e are provided on a gate insulating film 25e. In addition, the transfer gate TG and the gate electrode 27e are covered with an interlayer insulating film 29e, and an embedded wiring 31e using, for example, copper (Cu) is provided in a groove pattern of the interlayer insulating film 29e.

In this case, for example, the interlayer insulating film 29e is formed by using silicon oxide. Alternatively, if the embedded wirings 31e are densely arranged, the interlayer insulating film 29e is formed by using material having lower permittivity than the silicon oxide to reduce capacity between the embedded wirings 31e. The interlayer insulating film 29e has a groove pattern that is open toward the side of the circuit board 7e. A portion of the groove pattern reaches the transfer gate TG and the gate electrode 27e.

In such a groove pattern, a wiring layer 31be is formed via a barrier metal layer 31ae. The wiring layer 31be is formed of copper (Cu). These two layers form the embedded wiring 31e. Here, the barrier metal layer 31ar is a layer for preventing diffusion of the copper (Cu) into the interlayer insulating film 29e made of silicon oxide or material having lower permittivity than the silicon oxide. For example, the barrier metal layer 31ae is formed by using tantalum (Ta) or tantalum nitride (TaN).

Note that the wiring layer 2be may be a multi-layer wiring layer including more stacked layers.

[Electrode Layer 2ce (on Side of Sensor Board 2e)]

The electrode layer 2ce on the wiring layer 2be in the sensor board 2e has a first electrode 33e and a first insulating film 35e. The first electrode 33e is drawn out to a surface of the sensor board 2e on the side of the circuit board 7e. The first insulating film 35e includes a first low-permittivity layer and a first modification layer covering the first electrode 33e. The first electrode 33e and the first modification layer form a bonding surface 14e of the sensor board 2e. The bonding surface 41e is bonded to the circuit board 7e. The first low-permittivity layer is formed on the first modification layer (in the upper direction in FIG. 14).

The first electrode 33e is made of a single material layer. For example, the first electrode 33e is formed by using copper (Cu). The first electrode 33e is configured as an embedded wiring that is embedded in the first insulating film 35e.

In addition, the first insulating film 35e covers the wiring layer 2be. The first insulating film 35e has a groove pattern 35ae that is open toward the circuit board 7e. The first electrode 33e is embedded in the groove pattern 35ae. In other words, the first insulating film 35e is in contact with a periphery of the first electrode 33e. Although not illustrated, a portion of the groove pattern 35ae of the first insulating film 35e reaches the embedded wiring 31e of the wiring layer 2be. The first electrode 33e embedded in the groove pattern 35ae comes into contact with the embedded wiring 31e if necessary.

The above-described first insulating film 35e is made of anti-diffusion material with regard to diffusion of material constituting the first electrode 33. As such anti-diffusion material, material having small diffusion coefficient is used with respect to diffusion of material constituting the first electrode 33. In particular, in the first configuration example, the first insulating film 35e is configured as a single material layer using the anti-diffusion material. In addition, in the first configuration example, the first insulating film 35e is made of the anti-diffusion material with regard to diffusion of the first electrode 33e and diffusion of material constituting a second electrode 37e that is drawn out to a surface of the circuit board 7e on the side of the sensor board 2e.

For example, in the case where copper (Cu) is used for the first electrode 33e and the second electrode 67e, the anti-diffusion material constituting the first insulating film 35e may be inorganic insulating material or organic insulating material having a denser molecular structure than the silicon oxide. For example, the inorganic insulating material may be silicon nitride (SiN), silicon carbon nitride (SiCN), silicon oxynitride (SiON), or silicon carbide (SiC). For example, the organic insulating material may be benzocyclobutene (BCB), polybenzoxazole (PBO)), polyimide, or polyarylether (PAE). Note that the electrode layer 2ce is an uppermost layer in the sensor board 2e. Therefore, through the layout of the first electrodes 33e is roughly illustrated, sometimes there may be capacity between the first electrodes 33e, and it may be necessary for the first insulating film 35e to have low permittivity.

As described above, the surface of the sensor board 2e on the side of the circuit board 7e is configured as the bonding surface 41e to be bonded to the circuit board 7e, and is made only of the first electrodes 33e and the first insulating film 35e. The bonding surface 41e is desirably a planarized surface.

[Semiconductor Layer Tae (on Side of Circuit Board 7e)]

The semiconductor layer Tae on the side of the circuit board 7e is formed by thinning a semiconductor substrate 50e made of single crystal silicon, for example. In addition, a source/drain 51e of a transistor Tr, an impurity layer (not illustrated in FIG. 14), and the like are provided on a surface layer of the semiconductor layer Tae on the side of the sensor board 2e.

[First Wiring Layer 7be (on Side of Circuit Board 7e)]

The first wiring layer 7be in the circuit board 7e has a gate electrodes 55e and other electrodes (not illustrated in FIG. 14) on the side of an interface between the first wiring layer 7be and the semiconductor layer 7ae. The gate electrodes 55e are provided on a gate insulating film 53e. In addition, the gate electrodes 55e and the other electrodes are covered with an interlayer insulating film 57e, and an embedded wiring 59e using, for example, copper (Cu) is provided in a groove pattern of the interlayer insulating film 57e.

The interlayer insulating film 57e and the embedded wiring 59e have configurations that are similar to the wiring layer 2be of the sensor board 2e. In other words, the interlayer insulating film 57e has a groove pattern that is open toward the side of the sensor board 2e. A portion of the groove pattern reaches the gate electrode 51e and the source/drain 51e. In addition, in such a groove pattern, a wiring layer 59be is formed via a barrier metal layer 59ae. The wiring layer 59be is formed of copper (Cu). These two layers form the embedded wiring 59e.

[Second Wiring Layer Ice (on Side of Circuit Board 7e)]

The second wiring layer Ice of the circuit board 7e includes an interlayer insulating film 63e stacked above an interface between the first wiring layer 7be and the second wiring layer Ice via an anti-diffusion insulating film 61e. An embedded wiring 65e using, for example, copper (Cu) is provided in a groove pattern of the interlayer insulating film 63e and the anti-diffusion insulating film 61e.

The anti-diffusion insulating film 61e is made of anti-diffusion material with regard to diffusion of material constituting the embedded wirings 59e of the first wiring layer 7be. For example, the anti-diffusion insulating film 61e may be silicon nitride (SiN), silicon carbon nitride (SiCN), silicon oxynitride (SiON), or silicon carbide (SiC).

The interlayer insulating film 63e and the embedded wiring 65e have configurations that are similar to the wiring layer 2be of the sensor board 2e. In other words, the interlayer insulating film 63e has a groove pattern that is open toward the side of the sensor board 2e. A portion of the groove pattern reaches the embedded wiring 59e of the first wiring layer 7be. In addition, in such a groove pattern, a wiring layer 65be is formed via a barrier metal layer 65ae. The wiring layer 59be is formed of copper (Cu). These two layers form the embedded wiring 65e.

Note that the first wiring layer 7be and the second wiring layer Ice may be multi-layer wiring layers including more stacked layers.

[Electrode Layer 7de (on Side of Circuit Board 7e)]

The electrode layer 7de in the circuit board 7e serving as the second substrate has a second electrode 67e and a second insulating film 69e. The second electrode 67e is drawn out to a surface of the circuit board 7e on the side of the sensor board 2e and is joined to the first electrode 33e. The second insulating film 69e includes a second low-permittivity layer and a second modification layer covering the second electrode 67e. The second electrode 67e and the second modification layer form a bonding surface 71e of the circuit board 7e. The bonding surface 71e is bonded to the sensor board 2e. As will be described later, the second electrode 67e and the second modification layer are configured in a similar way to the electrode layer 2ce of the sensor board 2e. The second low-permittivity layer is formed on the second modification layer (in the lower direction in FIG. 14).

In other words, the second electrode 67e is made of a single material layer made of material that makes it possible to achieve good joint characteristic with regard to joining of the second electrode 67e and the first electrode 33e of the sensor board 2e. Therefore, the second electrode 67e may be made of same material as the first electrode 33e. For example, the second electrode 67e is formed by using copper (Cu). The second electrode 67e is configured as an embedded wiring that is embedded in the second insulating film 69e. Note that, in FIG. 14, the first electrode 33e and the second electrode 67e are deviated from each other in a left-right direction (left-right direction in FIG. 14). In other words, a left portion and a right portion of the second electrode 67e are connected to the first insulating film 35e. However, the first electrode 33e and the second electrode 67e do not have to be deviated from each other in the left-right direction (left-right direction in FIG. 14). The second electrode 67e does not have to protrude from the first electrode 33e, and vice versa, in the left-right direction (left-right direction in FIG. 14).

In addition, the second insulating film 69e covers the second wiring layer lce. The second insulating film 69e has a groove pattern 69ae that is open toward the sensor board 2e. The second electrode 67e is embedded in the groove pattern 69ae. In other words, the second insulating film 69e is in contact with a periphery of the second electrode 67e. Although not illustrated, a portion of the groove pattern 69ae of the second insulating film 69e reaches the embedded wiring 65e of the lower layer. The second electrode 67e embedded in the groove pattern 69ae comes into contact with the embedded wiring 65e if necessary.

The above-described second insulating film 69e is made of anti-diffusion material with regard to diffusion of material constituting the second electrode 67e. In particular, in the first configuration example, the second insulating film 69e is configured as a single material layer using the anti-diffusion material. In addition, in the first configuration example, the second insulating film 69e and the second electrode 67e may be made of the anti-diffusion material with regard to diffusion of the material constituting the first electrode 33e that is drawn out to the bonding surface of the sensor board 2e on the side of the circuit board 7e.

The second insulating film 69e may be made of material exemplified as the material of the first insulating film 35e of the sensor board 2e. Note that the second insulating film 69e is made of material that makes it possible to achieve good joint characteristic with regard to joining of the second insulating film 69e and the first insulating film 35e of the sensor board 2e. Therefore, the second insulating film 69e may be made of same material as the first insulating film 35e. In addition, the electrode layer 7de is an uppermost layer in the circuit board 7e. Therefore, through the layout of the second electrodes 67e is roughly illustrated, sometimes there may be capacity between the second electrodes 67e, and it may be necessary for the second insulating film 69e to have low permittivity.

As described above, the surface of the circuit board 7e on the side of the sensor board 2e is configured as the bonding surface 71e to be bonded to the sensor board 2e, and is made only of the second electrodes 67e and the second insulating film 69e. The bonding 71e is desirably a planarized surface.

[Protective Film 15e]

The protective film 15e covers the photoelectric converter 21e of the sensor board 2e and is made of a material film having a passivation characteristic. For example, a silicon oxide film, a silicon nitride film, a silicon oxynitride film, or the like is used for the protective film 15e.

[Color Filter Layer 17e]

The color filter layer 17e is made of color filters of respective colors corresponding to respective photoelectric converters 21e on a one-to-one basis. The arrangement of the color filters of the respective colors is not limited.

[On-Chip Lens 19e]

On-chip lenses 19e are provided in such a manner that the respective on-chip lenses 19e correspond to the photoelectric converters 21e and the color filters of the respective colors on a one-to-one basis. The respective color filters constitute the color filter layers 17e. In addition, the on-chip lenses 19e are configured to condense incident light on the respective photoelectric converter 21e.

[Action and Effect of Solid-State Imaging Device (Semiconductor Device) 1e]

The above-described semiconductor device 1 is configured in such a manner that the first electrode 33e is covered with the first insulating film 35e made of the anti-diffusion material with regard to diffusion of the material constituting the first electrode 33e. The barrier metal layer may be interposed between the first electrode 33e and the first insulating film 35e. In a similar way, the second electrode 67e may covered with the second insulating film 69e made of the anti-diffusion material with regard to diffusion of the material constituting the second electrode 67e. The barrier metal layer may be interposed between the second electrode 67e and the second insulating film 69e.

Therefore, the bonding surface 41e of the sensor board 2e may be made only of the insulating film 35e and the electrodes 33e, and the bonding surface 71e of the circuit board 7e may be made only of the insulating film 69e and the electrodes 67e. This makes it possible to ensure enough joint strength, to prevent diffusion of the materials constituting the electrodes 33e and 67e into the insulating films 35e and 69e, and to reduce capacity between the electrodes.

As a result, it is possible to prevent diffusion of the electrode materials into the insulating films 35e and 69e, to ensure enough joint strength, to reduce capacity between the electrodes, and to improve reliability of the solid-state imaging device 1 with the three-dimensional structure in which the sensor board 2e and the circuit board 7e are bonded together and the electrodes 33e and the electrodes 67e are joined.

Second Configuration Example

Figure 15:
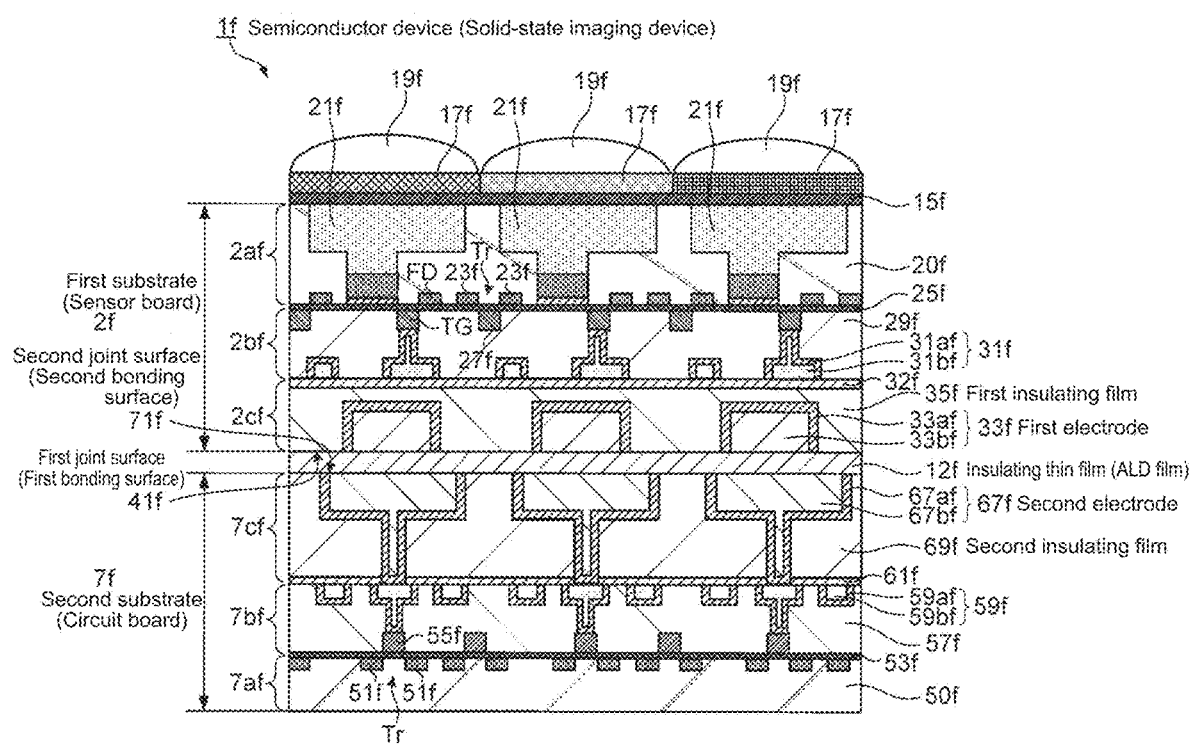
FIG. 15 is a cross-sectional view of a configuration example of a solid-state imaging device according to the present technology.

FIG. 15 is a cross-sectional view of a second configuration example of the solid-state imaging device according to the present technology.

A semiconductor device 1f illustrated in FIG. 15 is a solid-state imaging device with a three-dimensional structure in which a bonding surface 41f of a first substrate 2f and a bonding surface 71f of a second substrate 7f are opposed to each other in a state of sandwiching an insulating thin film 12f therebetween, and the first substrate 2f and the second substrate 7f are bonded. One of features of the second configuration example is that the first substrate 2f and the second substrate 7f are bonded via the insulating thin film 12f.

Here, the first substrate 2f includes a semiconductor layer 2af, a wiring layer 2bf, and an electrode layer 2cf that are stacked in this order from an opposite side of the second substrate 7f. In addition, a surface of the electrode layer 2cf is configured as the bonding surface 41f to be bonded to the second substrate 7f. On the other hand, the second substrate 7f includes a semiconductor layer 7af, a wiring layer 7bf, and an electrode layer 7cf that are stacked in this order from an opposite side of the first substrate 2f. In addition, a surface of the electrode layer 7cf is configured as the bonding surface 71f to be bonded to the first substrate 2f.

In addition, a protective film 15*f*, a color filter layer 17*f*, and an on-chip lens 19*f* are stacked in the order illustrated in FIG. 15 on a surface of the first substrate 2*f* which surface is on an opposite side from the second substrate 7*f*.

Next, detailed configurations of the insulating thin film 12*f* and the respective layers included in first substrate 2*f* and the second substrate 7*f* will be described successively. In addition, the configurations of the protective film 15*f*, the color filter layer 17*f*, and the on-chip lens 19*f* will be described successively.

[Semiconductor Layer 2*af* (on Side of First Substrate 2*f*)]

The semiconductor layer 2*af* of the first substrate 2*f* is formed by thinning a semiconductor substrate 20*f* made of single crystal silicon, for example. In the semiconductor layer 2*af*, a photoelectric converter 21*f* formed of an n-type impurity layer (or a p-type impurity layer), for example, is provided for each pixel on the side of a first surface on which the color filter layer 17*f*, the on-chip lens 19*f*, and the like are arranged. On the other hand, a floating diffusion FD, a source/drain 23*f* of a transistor Tr, another impurity layer (not illustrated in FIG. 15), and the like are provided on the side of the second surface of the semiconductor layer 2*ae*. The floating diffusion FD and the source/drain 23*e* are formed of an n+ type impurity layer.

[Wiring Layer 2*bf* (on Side of First Substrate 2*f*)]

The wiring layer 2*bf* on the semiconductor layer 2*af* in the first substrate 2*f* has a transfer gate TG, a gate electrode 27*f* of the transistor Tr, and other electrodes (not illustrated in FIG. 15) that are provided on a gate insulating film 25*f* on the side of an interface between the wiring layer 2*bf* and the semiconductor layer 2*af*. The transfer gate TG and the gate electrode 27*f* are covered with an interlayer insulating film 29*f*, and an embedded wiring 31*f* is provided in a groove pattern of the interlayer insulating film 29*f*. The embedded wiring 31*f* includes a barrier metal layer 31*af* and a wiring layer 31*bf*. The barrier metal layer 31*af* covers an inner wall of the groove pattern. The wiring layer 31*bf* is made of copper (Cu) and is embedded in the groove pattern via the barrier metal layer 31*af*.

Note that the wiring layer 2*bf* may be a multi-layer wiring layer including more stacked layers.

[Electrode Layer 2*cf* (on Side of First Substrate 2*f*)]

The electrode layer 2*cf* is provided on the wiring layer 2*bf* of the first substrate 2*f*, and the electrode layer 2*cf* includes an anti-diffusion insulating film 32*f* and a first insulating film 35*f* stacked thereon. The anti-diffusion insulating film 32*f* is provided on an interface between the electrode layer 2*cf* and the wiring layer 2*bf* to prevent diffusion of copper (Cu). For example, the first insulating film 35*f* includes a first modification layer. a first low-permittivity layer, and a TEOS film. A first electrode 33*f* serving as an embedded electrode is provided in a groove pattern of the first insulating film 35*f*. Note that the TEOS film is a silicon oxide film formed using chemical vapor deposition (hereinafter CVD) in which tetraethoxy silane (TEOS) gas having a composition of $Si(OC_2H_5)_4$ is used as raw material gas. In addition, the first electrode 33*f* includes a barrier metal layer 33*af* and a first electrode film 33*bf*. The barrier metal layer 33*af* covers an inner wall of the groove pattern. The first electrode film 33*bf* is made of copper (Cu) and is embedded in the groove pattern via the barrier metal layer 33*af*.

The surface of the electrode layer 2*cf* having the above-described configuration serves as the first joint surface (first bonding surface) 41*f* of the first substrate 2*f* to be bonded to the second substrate 7*f*. The bonding surface 41*f* is configured to expose the first electrodes 33*f* and the first modification layer, and is flattened through, for example, chemical mechanical polishing (hereinafter referred to as CMP). Note that the first low-permittivity layer is formed on the first modification layer (in the upper direction in FIG. 15).

Although not illustrated, a portion of the groove pattern of the first insulating film 35*f* reaches the embedded wiring 31*f* of the wiring layer 2*bf*. The first electrode 33*f* embedded in the groove pattern comes into contact with the embedded wiring 31*f* if necessary.

[Semiconductor Layer 7*af* (on Side of Second Substrate 7*f*)]

On the other hand, the semiconductor layer 7*af* of the second substrate 7*f* is formed by thinning a semiconductor substrate 50*f* made of single crystal silicon, for example. In addition, a source/drain 51*f* of a transistor Tr, an impurity layer (not illustrated in FIG. 14), and the like are provided on a surface layer of the semiconductor layer 7*af* on the side of the first substrate 2*f*.

[Wiring Layer 7*bf* (on Side of Second Substrate 7*f*)]

The wiring layer 7*bf* on the semiconductor layer 7*af* in the second substrate 7*f* has gate electrodes 55*f*, and other electrodes (not illustrated in FIG. 15) that are provided on a gate insulating film 53*f* on the side of an interface between the wiring layer 7*bf* and the semiconductor layer 7*af*. The gate electrodes 55*f* and the other electrodes are covered with an interlayer insulating film 57*f*, and an embedded wiring 59*f* is provided in a groove pattern of the interlayer insulating film 57*f*. The embedded wiring 59*f* includes a barrier metal layer 59*af* and a wiring layer 59*bf*. The barrier metal layer 59*af* covers an inner wall of the groove pattern. The wiring layer 59*bf* is made of copper (Cu) and is embedded in the groove pattern via the barrier metal layer 59*af*. Note that the wiring layer 7*bf* may have a multi-layer wiring layer structure.

[Electrode Layer 7*cf* (on Side of Second Substrate 7*f*)]

The electrode layer 7*cf* is provided on the wiring layer 7*bf* of the second substrate 7*f*, and the electrode layer 7*cf* includes an anti-diffusion insulating film 61*f* and a second insulating film 69*f* stacked thereon. The anti-diffusion insulating film 61*f* is provided on an interface between the electrode layer 7*cf* and the wiring layer 7*bf* to prevent diffusion of copper (Cu). For example, the second insulating film 69*f* includes a second modification layer. a second low-permittivity layer, and a TEOS film. A second electrode 67*f* serving as an embedded electrode is provided in a groove pattern of the second insulating film 69*f*. The second electrode 67*f* includes a barrier metal layer 67*af* and a second electrode film 67*bf*. The barrier metal layer 67*af* covers an inner wall of the groove pattern. The second electrode film 67*bf* is made of copper (Cu) and is embedded in the groove pattern via the barrier metal layer 67*af*. The second electrode 67*f* is arranged in such a manner that the second electrode 67*f* corresponds to the first electrode 33*f* of the first substrate 2*f*. The second electrode 67*f* is electrically connected to the first electrode 33*f* of the first substrate 2*f* via the insulating thin film 12*f*. A surface of the electrode layer 7*cf* serves as the bonding surface 71*f* of the second substrate 7*f* to be bonded to the first substrate 2*f*. The bonding surface 71*f* is configured to expose the second electrodes 67*f* and the second modification layer, and is flattened through the CMP, for example. Note that the second low-permittivity layer is formed on the second modification layer (in the lower direction in FIG. 15).

[Insulating Thin Film 12*f*]

The insulating thin film 12*f* is sandwiched between the bonding surface 41*f* of the first substrate 2*f* and the bonding surface 71*f* of the second substrate 7*f*, and covers the whole bonding surface 41*f* and the whole bonding surface 71*f*. In other words, the first substrate 2*f* and the second substrate 7*f* are bonded together via the insulating thin film 12*f*. Note that, in FIG. 15, the first electrode 33e and the second electrode 67e are deviated from each other in a left-right direction (left-right direction in FIG. 15). In other words, a left portion and a right portion of the second electrode 67f are connected to the first insulating film 35f via the insulating thin film 12f. However, the first electrode 33f and the second electrode 67f do not have to be deviated from each other in the left-right direction (left-right direction in FIG. 15). The second electrode 67f does not have to protrude from the first electrode 33f, and vice versa, in the left-right direction (left-right direction in FIG. 15).

The above-described insulating thin film 12 is made of, for example, an oxidized film and a nitride film, which are generally used for semiconductors. Next, constituent materials of the insulating thin film 12f will be described in detail.

In the case where the insulating thin film 12f is made of the oxidized film, for example, silicon oxide ($SiO_2$) or hafnium oxide ($HfO_2$) is used. In the case where the insulating thin film 12f is made of the oxidized film and the first electrode 33f and the second electrode 67f are made of copper (Cu), the copper (Cu) serving as the electrode material easily diffuses into the insulating thin film 12f. Such diffusion of copper (Cu) lowers electric resistance of the insulating thin film 12f. This improves electrical conductivity between the first electrode 33f and the second electrode 37f via the insulating thin film 12f. Accordingly, the insulating thin film 12f may be formed a little thicker in the case where the insulating thin film 12f is made of the oxidized film.

In the case where the insulating thin film 12f is made of the nitride film, for example, silicon nitride (SiN) is used. The insulating thin film 12f made of the nitride film has an anti-diffusion characteristic with regard to diffusion of the materials of the first electrode 33f and the second electrode 67f.

This makes it possible to prevent leakage current from flowing between electrodes in a same substrate via the insulating thin film 12f. In other words, it is possible to prevent the leakage current from flowing between the adjacent first electrodes 33f of the first substrate 2f via the insulating thin film 12f. In a similar way, it is possible to prevent the leakage current from flowing between the adjacent second electrodes 67f of the second substrate 7f via the insulating thin film 12f. On the other hand, with regard to the different substrates, it is possible to prevent the electrode material from diffusing into an insulating film of an opposed substrate. In other words, it is possible to prevent the material of the first electrode 33f of the first substrate 2f from diffusing into the second insulating film 69f of the second substrate 7f that is opposed to the first substrate 2f. In a similar way, it is possible to prevent the material of the second electrode 67f of the second substrate 7f from diffusing into the first insulating film 35f of the first substrate 2f that is opposed to the second substrate 7f. Therefore, sometimes it is not necessary to form a barrier film at a position on the bonding surface of each substrate where the insulating film is exposed. The barrier film is made of anti-diffusion material for preventing diffusion of the material of the electrode of the opposed substrate.

In particular in the second configuration example, it is important that the first electrode 33f of the first substrate 2f is electrically connected to the second electrode 67f of the second substrate 7f via the insulating thin film 12f. Therefore, the insulating thin film 12f has an extremely thin film thickness. While the film thickness varies depending on the material of the insulating thin film 12f, the film thickness is approximately 2 nm or less for, for example, oxides such as silicon oxide ($SiO_2$) and hafnium oxide ($HfO_2$) and most of other materials. However, it is also possible to use a thicker film depending on the film qualities of the insulating thin film 12f. A tunneling current flows between the first electrode 33f and the second electrode 67f that are opposed to each other via the insulating thin film 12f. In addition, if dielectric breakdown is caused by applying a voltage of a certain level or more, the first electrode 33f and the second electrode 67f become completely conductive, and a current flows.

The insulating thin film 12f of the semiconductor device 1f according to the second configuration example is not limited to the single layer structure as described above. A laminate structure using a single material may be used, or a laminate structure using different materials may be used.

[Protective Film 15f, Color Filter Layer 17f, and On-Chip Lens 19f]

The protective film 15f covers the photoelectric converter 21f of the first substrate 2f. The protective film 15f is made of a material film having a passivation characteristic. For example, a silicon oxide film, a silicon nitride film, a silicon oxynitride film, or the like is used for the protective film 15f. The color filter layer 17f is made of color filters of respective colors corresponding to respective photoelectric converters 21f on a one-to-one basis. The arrangement of the color filters of the respective colors is not limited. On-chip lenses 19f are provided in such a manner that the respective on-chip lenses 19f correspond to the photoelectric converters 21f and the color filters of the respective colors on a one-to-one basis. The respective color filters constitute the color filter layers 17f. In addition, the on-chip lenses 19f are configured to condense incident light on the respective photoelectric converter 21f.

[Effect of Configuration of Semiconductor Device (Solid-State Imaging Device) 1f according to Second Configuration Example]

The semiconductor device 1f according to the second configuration example configured as described above is formed of the first substrate 2f and the second substrate 7f bonded to each other via the insulating thin film 12f as illustrated in FIG. 15. Therefore, the bonding surface 41f of the first substrate 2f and the bonding surface 71f of the second substrate 7f are not in direct contact. Thus, it is possible to prevent voids from generating in a joint interface in a configuration in which the bonding surfaces are directly joined together, it is possible to flatten the joint interface, it is possible to further increase the joint strength between the first substrate and the second substrate, and it is possible to reduce capacity between electrodes. This makes it possible to obtain the semiconductor device having improved reliability.

In particular, if the first insulating film 35f and the second insulating film 69f include the TEOS films, the TEOS films have more hydroxyl groups on their surfaces. Therefore, dehydration condensation causes generation of voids on the joint interface where the insulating films made of the TEOS films are directly joined together. As described above, even if the insulating films are the TEOS films, the substrates are bonded via the insulating thin film 12f in the semiconductor device 1f according to the second configuration example. Therefore, the TEOS films are not directly joined together, and it is possible to prevent the voids from generating due to the dehydration condensation. This makes it possible to increase the joint strength between the two substrates, and to obtain the semiconductor device having improved reliability.

Third Configuration Example

Figure 16:
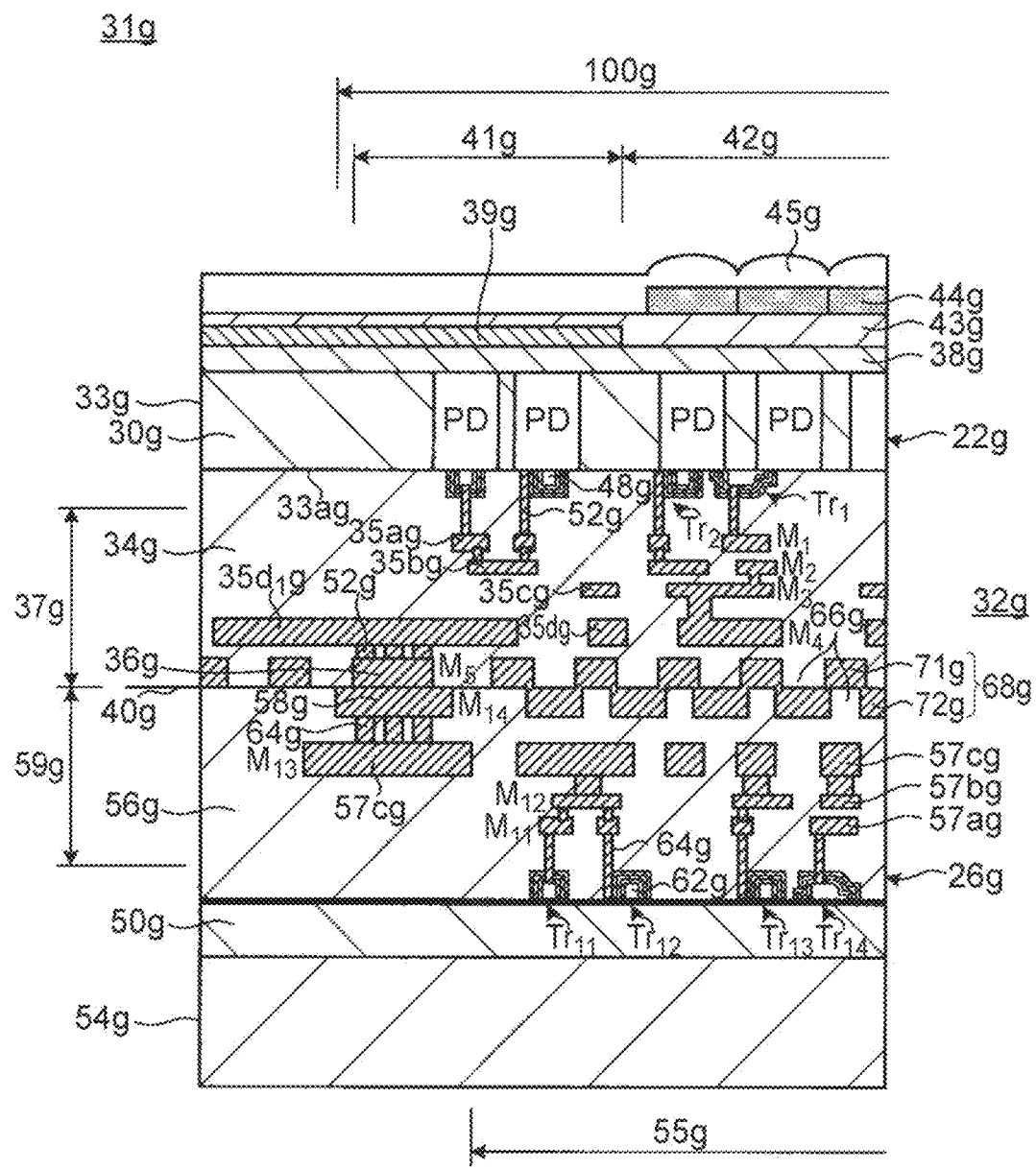
FIG. 16 is a diagram illustrating a configuration example of a solid-state imaging device according to the present technology.

FIG. 16 is a cross-sectional view of a third configuration example of the solid-state imaging device according to the present technology.

FIG. 16 illustrates the third configuration example of the solid-state imaging device according to the present technology, that is, illustrates a back-illuminated CMOS solid-state imaging device. A solid-state imaging device 31g according to the third configuration example includes a laminated semiconductor chip 32g including a first semiconductor chip section 22g and a second semiconductor chip section 26g, which are bonded to each other. The first semiconductor chip section 22g includes a pixel array and a control circuit. The second semiconductor chip section 26g includes a logic circuit. The first semiconductor chip section 22g (first substrate) and the second semiconductor chip section 26g (second substrate) are bonded in such a manner that their multi-layer wiring layers (to be described later) are opposed to each other, and connection wirings are directly joined.

In the first semiconductor chip section 22g, the pixel array 100g in which a plurality of pixels each including a photodiode PD serving as a photoelectric converter and a plurality of pixel transistors Tr1 and Tr2 are two-dimensionally arranged in a row is formed in a first semiconductor substrate 33g formed of silicon processed into a thin film form. Although not illustrated, a plurality of MOS transistors is formed on the semiconductor substrate 33g. The plurality of MOS transistors forms a control circuit. Over the side of a front surface 33ag a of the semiconductor substrate 33g, a multi-layer wiring layer 37g is formed in which wirings 35g (35ag to 35dg) and 36g formed of a plurality (five layers in this example) of metals M1 to M5 are disposed via an interlayer insulating film 34g. Copper (Cu) wirings formed through a dual damascene method are used as the wirings 35g and 36g. On a back surface side of the semiconductor substrate 33g, a light blocking film 39g is formed. The light blocking film 39g covers an area over an optical black region 41g via an insulating film 38g. Furthermore, a color filter 44g and an on-chip lens 45g are formed on a planarized film 38g in an effective pixel area 42g. It is also possible to form the on-chip lens 45g also over the optical black region 41g.

In FIG. 16, the pixel transistors Tr1 and Tr2 are illustrated as representatives of the plurality of pixel transistors. FIG. 16 schematically illustrates the pixels of the pixel array 100g. In the first semiconductor chip section 22g, the photodiode PD is formed in the semiconductor substrate 33g processed into a thin film form. The photodiode PD has, for example, an n-type semiconductor region and a p-type semiconductor region on the substrate surface side. Over the substrate surface to configure the pixels, gate electrodes are formed via a gate insulating film, and the pixel transistors Tr1 and Tr2 includes the gate electrode and a pair of source and drain regions. The pixel transistor Tr1 adjacent to the photodiode PD corresponds to the floating diffusion FD. Each unit pixel is isolated by an element isolation area. The element isolation region is formed into a shallow trench isolation (STI) structure obtained by embedding an insulating film such as an $SiO_2$ film into a groove formed in the substrate, for example.

In the multi-layer wiring layer 37g of the first semiconductor chip section 22g52g, connection is established via conductive vias 52g between the corresponding pixel transistor and the wirings 35g and between the wirings 35g of upper and lower layers that are adjacent to each other. Furthermore, the joint wiring 36g formed of the fifth-layer metal M5 is formed in such a manner that the joint wiring 36g faces a joint surface 40g to be joined to the second semiconductor chip section 26g. The joint wiring 36g is connected to a required wiring 35dg formed of the fourth-layer metal M4 via the conductive vias 52g.

In the second semiconductor chip section 26g, a logic circuit 55g serving as a peripheral circuit is formed in a region serving as each chip section in a second semiconductor substrate 54g formed of silicon. The logic circuit 55g includes a plurality of MOS transistors Tr11 to Tr14 including a CMOS transistor. Over the side of a front surface of the semiconductor substrate 54f, a multi-layer wiring layer 59g is formed in which wirings 57g (57ag to 57cg) and 58g formed of a plurality (four layers in this example) of metals M11 to M14 are disposed via an interlayer insulating film 56g. Copper (Cu) wirings formed through the dual damascene method are used as the wirings 57g and 58g.

In FIG. 16, the MOS transistors Tr11 to Tr14 are illustrated as representatives of the plurality of MOS transistors of the logic circuit 55g. FIG. 16 schematically illustrates the MOS transistors Tr11 to Tr14. In the second semiconductor chip section 26g, each of the MOS transistors Tr11 and Tr12 is formed in such a manner that each of the MOS transistors Tr11 and Tr12 has a pair of source and drain regions and a gate electrode 62g formed via a gate insulating film in a semiconductor well region on the front surface side of the semiconductor substrate 54g. Each of the MOS transistors Tr11 and Tr12 is isolated by an element isolation region having, for example, the STI structure.

In the multi-layer wiring layer 59 of the second semiconductor chip section 26g, connection is established via conductive vias 64g between the MOS transistors Tr11 to Tr14 and the wirings 57g and between the wirings 57g of upper and lower layers adjacent to each other. Furthermore, the connection wiring 58g formed of the fourth-layer metal M14 is formed in such a manner that the connection wiring 58g faces a joint surface 40g to be joined to the first semiconductor chip section 22g. The connection wiring 58g is connected to a required wiring 57cg formed of the third-layer metal M13 via the conductive vias 64g.

The first semiconductor chip section 22g and the second semiconductor chip section 26g are electrically connected to each other in such a manner that their multi-layer wiring layers 37g and 59g are opposed to each other and the joint wirings 36g and 58g facing the joint surface 40g are directly joined to each other. Interlayer insulating films 66g near the joint are formed of a combination of a Cu diffusion barrier insulating film for preventing Cu diffusion of the Cu wiring, an insulating film that does not have the Cu diffusion barrier characteristic, a first modification layer, and a first low-permittivity layer. In addition, an interlayer insulating film 56g near the joint is formed of a combination of a Cu diffusion barrier insulating film for preventing Cu diffusion of the Cu wiring, an insulating film that does not have the Cu diffusion barrier characteristic, a second modification layer, and a second low-permittivity layer. Note that the first semiconductor chip section 22g and the second semiconductor chip section 26g are bonded to each other in such a manner that the joint wiring 26g and the first modification layer are exposed on the joint surface 40g (out of the pixel area) on the side of the first semiconductor chip section 22g, and the joint wiring 58g and the second modification layer are exposed on the joint surface 40g (out of the pixel area) on the side of the second semiconductor chip section 26g. In addition, the first low-permittivity layer is formed on the first modification layer (in the upper direction in FIG. 16), and the second low-permittivity layer is formed on the second modification layer (in the lower direction in FIG. 16).

Note that, in FIG. 16, the first electrode 36g and the second electrode 58g are deviated from each other in a left-right direction (left-right direction in FIG. 16). In other words, a left portion and a right portion of the second electrode 58g are connected to the interlayer insulating film 66g. However, the first electrode 36g and the second electrode 58g do not have to be deviated from each other in the left-right direction (left-right direction in FIG. 16). The second electrode 58g does not have to protrude from the first electrode 36g, and vice versa, in the left-right direction (left-right direction in FIG. 16).

The joint wirings 36g and 58g formed of Cu wirings is directly joined to each other through thermal diffusion bonding. The insulating films 66g other than the joint wiring 36g or 58g are joined to each other through plasma bonding or with an adhesive.

Next, in the third configuration example, in particular, as illustrated in FIG. 16, a light blocking layer 68g formed of conductive films of the same layers as those of the connection wirings is formed near the joint between the first and second semiconductor chip sections 22g and 26g. The light blocking layer 68g according to the third configuration example is includes a light blocking section 71g and a light blocking section 72g. The light blocking section 71g is formed of the metal M5 of the same layer as that of the connection wiring 36g of the first semiconductor chip section 22g. The light blocking section 72g is formed of the metal M14 of the same layer as that of the connection wiring 58g of the second semiconductor chip section 26g. Either one of the light blocking sections 71g and 72g, i.e. the light blocking section 71g is formed into a shape having a plurality of openings at predetermined pitches in the vertical and horizontal directions in top view. Furthermore, the other light blocking component 72g is formed into a shape of dots covering the openings of the light blocking component 71g in top view. The light blocking layer 68g is configured in such a manner that the both light blocking sections 71g and 72g overlap with each other in such a manner that the light blocking sections 71g and 72g are uniformly closed in top view.

The light blocking section 71g and the light blocking section 72g covering the openings of the light blocking section 71g are formed in such a manner that the light blocking sections 71g and 72g partially overlap with each other. When the connection wirings 36g and 58g are directly joined to each other, the light blocking section 71g and the light blocking section 72g are directly joined to each other at the overlapped part. Various shapes are possible as the shape of the openings of the light blocking section 71g. For example, the opening is formed into a rectangular shape. On the other hand, the light blocking section 72g formed into a shape of dots covers the openings. In FIG. 16, the light blocking section 72g is formed into a rectangular shape having an area larger than that of the openings. A fixed potential, e.g. ground potential, is desirably applied to the light blocking layer 68g, and the light blocking layer 68g may be stable in terms of electric potential.

As described above, the interlayer insulating films 66g near the joint are formed of a combination of a Cu diffusion barrier insulating film for preventing Cu diffusion of the Cu wiring, an insulating film that does not have the Cu diffusion barrier characteristic, a first modification layer, and a first low-permittivity layer. In addition, the interlayer insulating film 56g near the joint is formed of a combination of a Cu diffusion barrier insulating film for preventing Cu diffusion of the Cu wiring, an insulating film that does not have the Cu diffusion barrier characteristic, a second modification layer, and a second low-permittivity layer. Note that the first semiconductor chip section 22g and the second semiconductor chip section 26g are bonded to each other in such a manner that the light blocking section 71g and the first modification layer are exposed on the joint surface 40g (within the pixel area) on the side of the first semiconductor chip section 22g, and the light blocking section 72g and the second modification layer are exposed on the joint surface 40g (within the pixel area) on the side of the second semiconductor chip section 26g. In addition, the first low-permittivity layer is formed on the first modification layer (in the upper direction in FIG. 16), and the second low-permittivity layer is formed on the second modification layer (in the lower direction in FIG. 16).

Note that, in FIG. 16, the light blocking section 71g and the light blocking section 72g are deviated from each other in the left-right direction (left-right direction in FIG. 16). In other words, the light blocking section 71g is connected to the interlayer insulating film 56g, and the light blocking section 72g is connected to the interlayer insulating film 66g. However, the light blocking section 71g and the light blocking section 72g do not have to be deviated from each other in the left-right direction (left-right direction in FIG. 16). The light blocking section 72g does not have to protrude from the light blocking section 71g, and vice versa, in the left-right direction (left-right direction in FIG. 16).

Fourth Configuration Example

Figure 18:
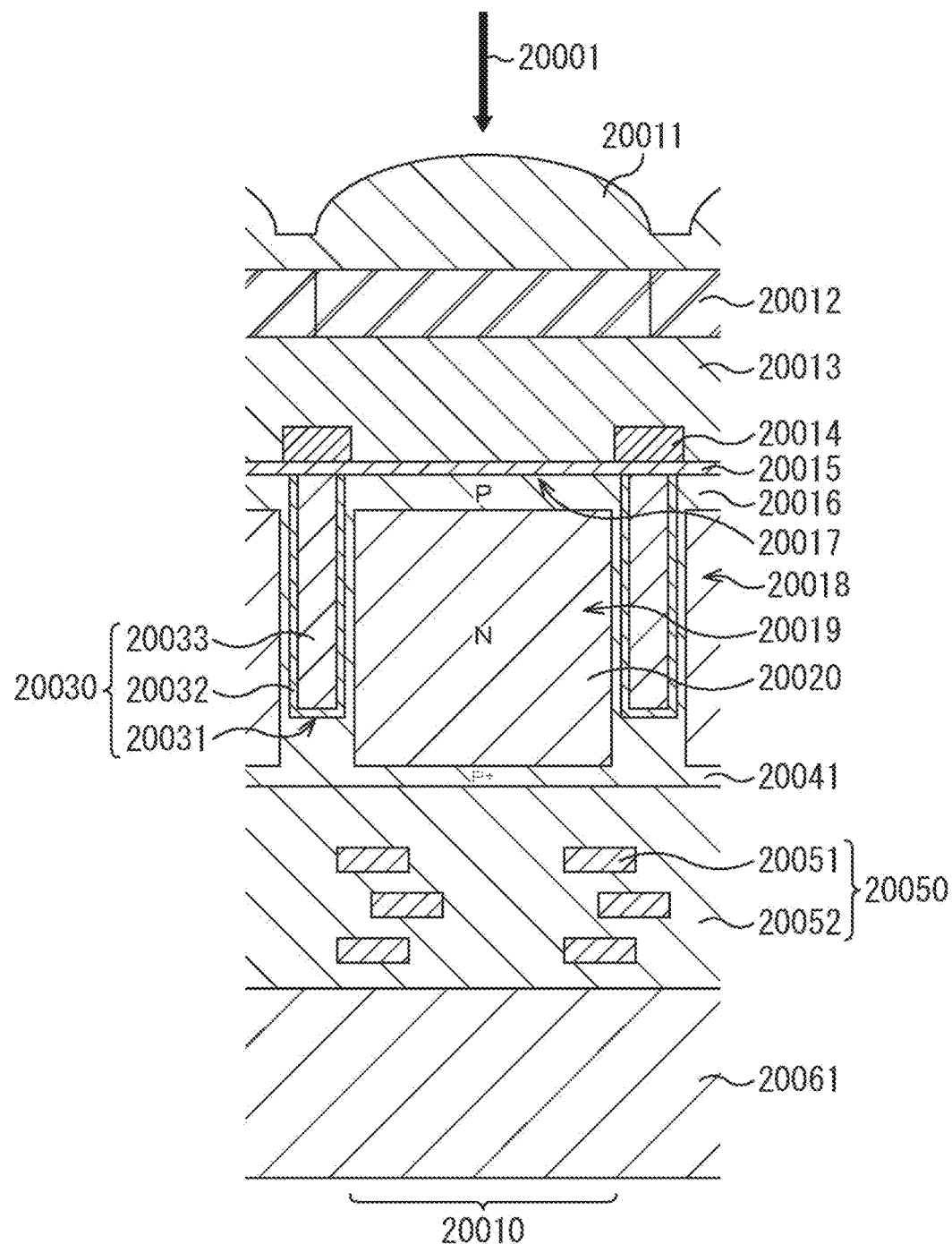
FIG. 18 is a cross-sectional view of a configuration example of a solid-state imaging device according to the present technology.

FIG. 18 is a cross-sectional view of a fourth configuration example of the solid-state imaging device according to the present technology.

A photodiode (PD) 20019 receives light 20001 incident from a back surface (upper surface in FIG. 18) side of a semiconductor substrate 20018. A planarized film 20013, a color filter (CF) 20012 and a microlens 20011 are provided above the PD 20019. The incident light 20001, which passes through the above-described portions sequentially, is received by a light receiving surface 20017, and photoelectric conversion of the light is performed.

For example, the PD 20019 is formed as a charge accumulation region in which an n-type semiconductor region 20020 accumulates a charge (electrons). In the PD 20019, the n-type semiconductor region 20020 is provided in the inner portion of p-type semiconductor regions 20016 and 20041 of the semiconductor substrate 20018. In the n-type semiconductor region 20020, the p-type semiconductor region 20041, which has a higher impurity concentration than the back surface (upper surface in FIG. 18) side, is provided in the front surface (lower surface in FIG. 18) side of the semiconductor substrate 20018. That is, the PD 20019 is a hole-accumulation diode (HAD) structure, and the p-type semiconductor regions 20016 and 20041 are formed in each interface of the upper surface side and the lower surface side of the n-type semiconductor region 20020 in order to suppress occurrence of a dark current.

A pixel separation section 20030 which electrically separates the plurality of pixels 20010 is provided in the inner portion of the semiconductor substrate 20018, and the PD 20019 is provided in a region which is divided by the pixel separation section 20030. In FIG. 18, in the case where the solid-state imaging device is viewed from the upper face side, the pixel separation section 20030 is, for example, formed in a grid-like form so as to be interposed between the pixels 20010. The PD 20019 is formed inside the region separated by the pixel separation section 20030.

In each PD 20019, an anode is grounded. In the solid-state imaging device, signal charges (e.g., electrons) accumulated by the PD 20019 are read through a transfer Tr (MOSFET, not illustrated) or the like and output as electric signals to a vertical signal line (VSL, not illustrated).

A wiring layer 20050 is disposed on the front surface (lower surface) of the semiconductor substrate 20018 which is opposite to the back surface (upper surface) on which a light blocking film 20014, a CF 20012, a microlens 20011, and the like are disposed.

The wiring layer 20050 includes wirings 20051 and an insulating layer 20052. The wiring layer 20050 is formed in such a manner that the wirings 20051 are electrically connected to respective elements inside the insulating layer 20052. The wiring layer 20050 is a so-called multi-layer wiring layer and formed by alternately stacking the wirings 20051 and interlayer insulating films which constitute the insulating layer 20052 a plurality of times. Here, as the wirings 20051, wiring to a Tr for reading charges from the PD 20019 such as the transfer Tr and various wirings such as a VSL are stacked with the insulating layer 20052 interposed therebetween. The insulating layer 20052 may include a modification layer and a low-permittivity layer. The modification layer may be formed on an interface between the interlayer insulating film and the wiring. The low-permittivity layer may be formed on the modification layer.

A support substrate 20061 is disposed on a surface of the wiring layer 20050 at the side opposite to the side having the PD 20019. For example, a substrate made of a silicon semiconductor having a thickness of several hundred μm is provided as the support substrate 20061.

The light blocking film 20014 is disposed on the back surface side (the upper surface side in FIG. 18) of the semiconductor substrate 20018.

The light blocking film 20014 is configured to block a portion of the incident light 20001 which travels toward the back surface of the semiconductor substrate 20018 from above the semiconductor substrate 20018.

The light blocking film 20014 is disposed above the pixel separation section 20030 which is disposed inside the semiconductor substrate 20018. Here, the light blocking film 20014 is formed in a projecting shape on the back surface (upper surface) of the semiconductor substrate 20018 with an insulating film 20015 such as a silicon oxide film interposed therebetween. On the other hand, the light blocking film 20014 is not located above the PD 20019 which is disposed inside the semiconductor substrate 20018 and this part is open in such a manner that the incident light 20001 enters the PD 20019.

That is, in FIG. 18, in the case where the solid-state imaging device is viewed from the upper surface side, the plane shape of the light blocking film 20014 is a grid-like shape, and openings through which the incident light 20001 to the light receiving surface 20017 passes are formed on the light shielding film 20014.

The light blocking film 20014 is formed of a light blocking material which blocks light. For example, the light blocking film 20014 is formed by sequentially stacking a titanium (Ti) film and a tungsten (W) film. Alternatively, the light blocking film 20014 may be formed by sequentially stacking a titanium nitride (TiN) film and a tungsten (W) film.

The light blocking film 20014 is covered with the planarized film 20013. The planarized film 20013 is formed by using an insulating material which transmits light.

The pixel separation section 20030 includes a groove section 20031, a fixed charge film 20032, and an insulating film 20033.

The fixed charge film 20032 covers the groove section 20031 which separates the pixels 20010 at the back surface side (upper surface side) of the semiconductor substrate 20018.

Specifically, the fixed charge film 20032 covers the inner surface of the groove section 20031, which is formed at the back surface side (upper surface side) of the semiconductor substrate 20018, with a constant thickness. Further, the insulating film 20033 is formed (filled) so as to fill up the inside of the groove section 20031 which is covered with the fixed charge film 20032.

Here, the fixed charge film 20032 is formed by using a high dielectric having a negative fixed charge in such a manner that a positive charge (hole) accumulation region is formed in the interface part with the semiconductor substrate 20018 to reduce the occurrence of a dark current. Since the fixed charge film 20032 has a negative fixed charge, an electric field is applied to the interface with the semiconductor substrate 20018 by the negative fixed charge, and the positive charge (hole) accumulation region is formed.

The fixed charge film 20032 may be formed of, for example, a hafnium oxide film ($HfO_2$ film). Further, for example, the fixed charge film 20032 may include at least one of oxides of hafnium, zirconium, aluminum, tantalum, titanium, magnesium, yttrium, lanthanoid, or the like.

Fifth Configuration Example

Figure 19:
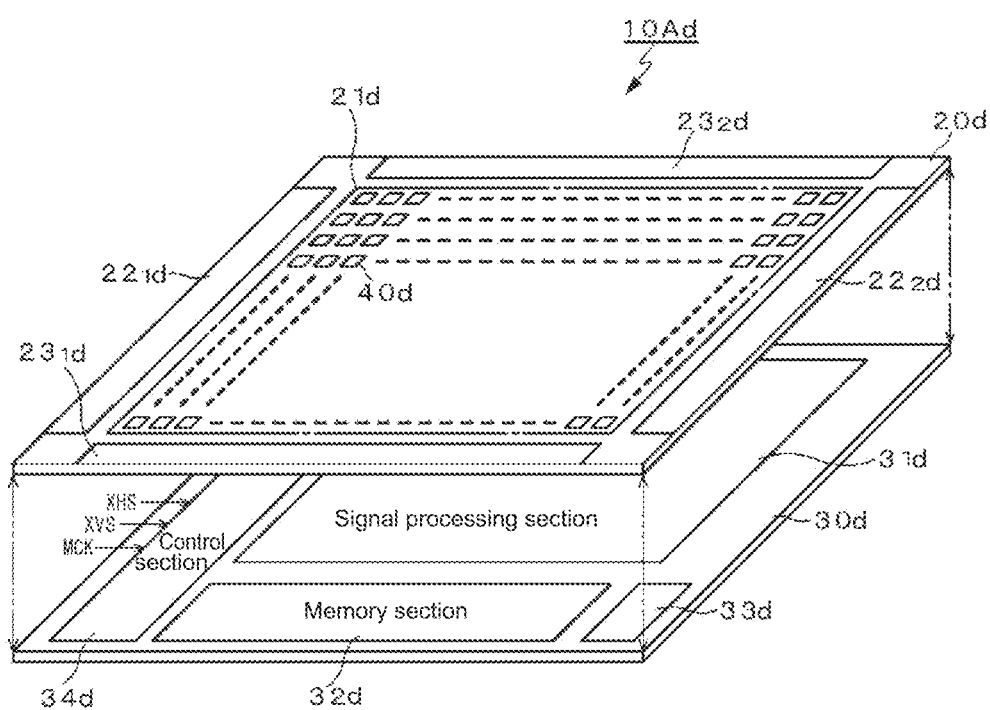
FIG. 19 is a conceptual diagram illustrating a solid-state imaging device according to the present technology.
Figure 20:
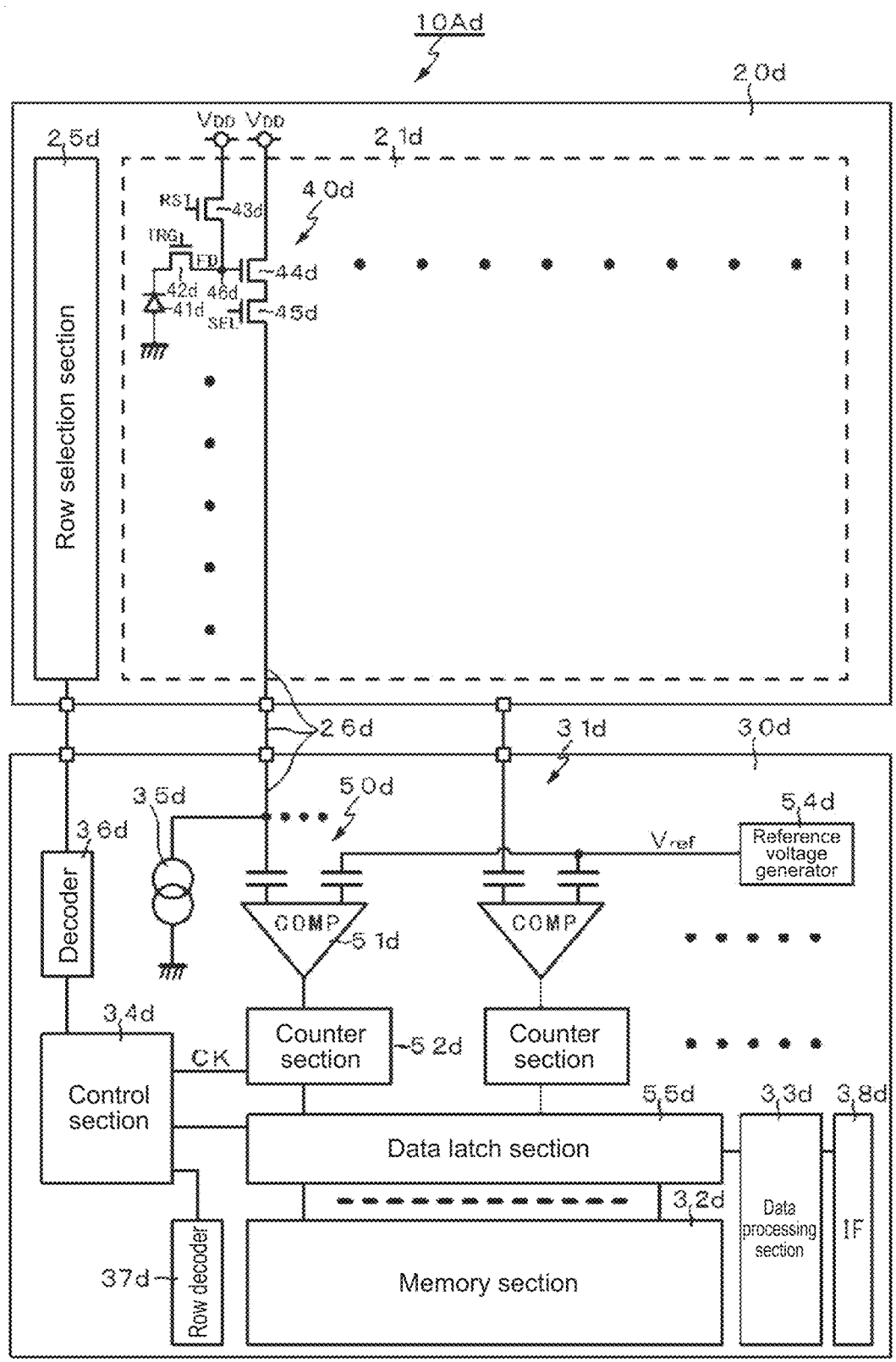
FIG. 20 is a circuit diagram illustrating a specific configuration of a circuit of a first semiconductor chip and a circuit of a second semiconductor chip in the solid-state imaging device illustrated in FIG. 19.

FIG. 19 and FIG. 20 are cross-sectional views of a fifth configuration example of the solid-state imaging device (circuit configuration of laminated substrate) according to the present technology.

An electronic device (laminated solid-state imaging device) 10Ad illustrated in FIG. 19 includes a first semiconductor chip 20d that has a sensor section 21d in which a plurality of sensors 40d is arranged, and a second semiconductor chip 30d that has a signal processing section 31d in which a signal obtained by the sensor 40d is processed. The first semiconductor chip 20d (first substrate, sensor board) and the second semiconductor chip 30d (second substrate, circuit board) are stacked. At least a portion of the signal processing section 31d has a depletion-type field effect transistor. The plurality of sensors 40d is arranged in a two-dimensional matrix (in a matrix). The same applies to the following description. Note that, in FIG. 19, for convenience of description, the first semiconductor chip 20d and the second semiconductor chip 30d are illustrated in a state of being separated from each other.

Alternatively, the electronic device 10Ad includes a first semiconductor chip 20d that has a sensor section 21d in which a plurality of sensors 40d is arranged, and a second semiconductor chip 30d that has a signal processing section 31d in which a signal obtained by the sensors 40d is processed. The first semiconductor chip 20d and the second semiconductor chip 30d are stacked. The signal processing portion 31d has a high breakdown voltage transistor system circuit and a low breakdown voltage transistor system circuit. At least a portion of the low breakdown voltage transistor system circuit has a depletion-type field effect transistor.

The depletion-type field effect transistor has a complete depletion-type SOI structure, has a partial depletion-type SOI structure, has a fin structure (also referred to as the double-gate structure or the tri-gate structure), or has a deeply depleted channel structure. The configurations and the structures of these depletion-type field effect transistors will be described below.

Specifically, as illustrated in FIG. 20, the sensor section 21*d* and a row selection section 25*d* are disposed in the first semiconductor chip 20*d*. On the other hand, the signal processing section 31*d* is disposed in the second semiconductor chip 30*d*. The signal processing section 31*d* has an analog-digital converter (hereinafter, abbreviated to "AD converter") 50*d* including a comparator 51*d* and a counter section 52*d*, a ramp voltage generator (hereinafter, may also be referred to as the "reference voltage generator") 54*d*, a data latch section 55*d*, a parallel/serial conversion section 56*d*, a memory section 32*d*, a data processing section 33*d*, a control section 34*d* (including a clock supply section connected to the AD converter 50*d*), a current source 35*d*, a decoder 36*d*, a row decoder 37*d*, and an interface (IF) section 38*b*.

In the electronic device, the high breakdown voltage transistor system circuit (the specific configuration circuit will be described later) in the second semiconductor chip 30*d* and the sensor section 21*d* in the first semiconductor chip 20*d* planarly overlap with each other. In the second semiconductor chip 30*d*, a light blocking region is formed above the high breakdown voltage transistor system circuit which faces the sensor portion 21*d* of the first semiconductor chip 20*d*. In the second semiconductor chip 30*d*, the light blocking region which is arranged below the sensor section 21*d* can be secured by appropriately arranging wirings (not illustrated) formed in the second semiconductor chip 30*d*. In addition, in the second semiconductor chip 30*d*, the AD converter 50*d* is arranged below the sensor section 21*d*. Here, the signal processing section 31*d* or the low breakdown voltage transistor system circuit (the specific configuration circuit will be described later) includes a portion of the AD converter 50*d*, and at least a portion of the AD converter 50*d* has the depletion-type field effect transistor. Specifically, the AD converter 50*d* has a single slope-type AD converter of which the circuit diagram is illustrated in FIG. 20. Otherwise, with regard to the electronic device, as another layout, the high breakdown voltage transistor system circuit in the second semiconductor chip 30*d* and the sensor section 21*d* in the first semiconductor chip 20*d* can be configured not to planarly overlap with each other. In other words, in the second semiconductor chip 30*d*, a portion and the like of the analog-digital converter (AD converter) 50*d* are arranged on an outer periphery portion of the second semiconductor chip 30*d*. Accordingly, it is not necessary to form the light blocking region, and thus, it is possible to achieve simplification of steps, structures, and configurations, improvement of the degree of freedom in terms of design, and reduction of limitation in layout design.

One AD converter 50*d* is provided with respect to the plurality of sensors 40*d* (the sensors 40*d* belonging to one sensor column). The AD converter 50*d* which is the single slope-type analog-digital converter has the ramp voltage generator (reference voltage generator) 54*d*, the comparator 51*d* to which an analog signal obtained by the sensors 40*d* and a ramp voltage from the ramp voltage generator (reference voltage generator) 54*d* are input, and the counter section 52*d* to which a clock CK is supplied from the clock supply section (not illustrated) provided in the control section 34*d* and which operates based on an output signal of the comparator 51*d*. Note that the clock supply section connected to the AD converter 50*d* is included in the signal processing section 31 or the low breakdown voltage transistor system circuit (more specifically, included in the control section 34*d*) and has an existing PLL circuit. In addition, at least a portion of the counter section 52*d*, and the clock supply portion have the depletion-type field effect transistor.

In other words, in addition to the column selection section, the sensor section 21*d* (sensors 40*d*) and the row selection section 25*d* which are provided in the first semiconductor chip 20*d* correspond to the high breakdown voltage transistor system circuit. In addition, the comparator 51*d* which configures the AD converter 50*d*, the ramp voltage generator (reference voltage generator) 54*d*, the current source 35*d*, the decoder 36*d*, and the interface (IF) section 38*b* in the signal processing section 31*d* provided in the second semiconductor chip 30*d* correspond to the high breakdown voltage transistor system circuit. On the other hand, the counter section 52*d* which configure the AD converter 50*d*, the data latch portion 55*d*, the parallel/serial conversion section 56, the memory section 32*d*, the data processing section 33*d* (including the image signal processing section), the control section 34*d* (including the clock supply section and a timing control circuit connected to the AD converter 50*d*), and the row decoder 37*d* in addition to a multiplexer (MUX) 57 and a data compression section 58 (that are to be described later) in the signal processing section 31*d* provided in the second semiconductor chip 30*d* correspond to the low breakdown voltage transistor system circuit. In addition, all the counter section 52*d* and the clock supply section which is included in the control section 34*d* have the depletion-type field effect transistor.

In order to obtain a laminate structure of the first semiconductor chip 20*d* and the second semiconductor chip 30*d*, initially, based on an existing method, the various predetermined circuits described above are formed on a first silicon semiconductor substrate configuring the first semiconductor chip 20*d* and a second silicon semiconductor substrate configuring the second semiconductor chip 30*d*. Then, the first silicon semiconductor substrate and the second silicon semiconductor substrate are bonded together based on an existing method. Subsequently, a penetration hole extending from wiring formed on the first silicon semiconductor substrate side to wiring formed on the second silicon semiconductor substrate is formed, and the penetration hole is filled with a conductive material, thereby forming the TC(S)V. Thereafter, a color filter and a microlens are formed in the sensor 40*d* as desired, and then, a bonding structure of the first silicon semiconductor substrate and the second silicon semiconductor substrate are subjected to dicing. Thus, it is possible to obtain the electronic device 10A in which the first semiconductor chip 20*d* and the second semiconductor chip 30*d* are stacked.

The first semiconductor chip 20*d* may include the first electrode, the first modification layer, the first low-permittivity layer formed on the first modification layer, and the first joint surface where the first electrode and the first modification layer are exposed. The first semiconductor chip 20*d* may include the second electrode, the second modification layer, the second low-permittivity layer formed on the second modification layer, and the second joint surface where the second electrode and the second modification layer are exposed. The first substrate and the second substrate form the laminate structure, and electrically connected electronic device 10A (laminated solid-state imaging device) by bonding the first joint surface and the second joint surface. When using the electronic device 10A (laminated solid-state imaging device), the first low-permittivity layer and the second low-permittivity layer (low-k films) are used as passivation films around the first electrode and the second electrode, and a modification layer having higher hydrophilicity is formed on a joint surface (front surface) of the first substrate chip 20d and a joint surface (front surface) of the second substrate ship 30d. This makes it possible to reduce capacity between adjacent electrodes (for example, capacity between the first electrodes and capacity between the second electrodes), and to bond the first substrate and the second substrate with high joint strength. In addition, when using the electronic device 10A (laminated solid-state imaging device) it is possible to reduce capacity between adjacent electrodes (for example, capacity between the first electrodes and capacity between the second electrodes) while maintaining high joint strength between the first substrate chip 20d and the second substrate chip 30d.

The sensor 40d is specifically an image sensor, and is more specifically a CMOS image sensor having an existing configuration and structure. The electronic device 10A has the solid-state imaging device. The solid-state imaging device is an X-Y address-type solid-state imaging device which can read out a signal (analog signal) from the sensor 40d in each sensor group by one sensor as a unit, by a plurality of sensors as a unit, or by one or a plurality of rows (lines) as a unit. In the sensor section 21d, a control line (row control line) is wired for each sensor row and a signal line (column signal line/vertical signal line) 26d is wired for each sensor column with respect to sensor arrays in a matrix. Each signal line 26d can be connected to the current source 35d. A signal (analog signal) is read out from the sensor 40d of the sensor section 21d through the signal line 26d. For example, the readout can be performed under rolling shutters in which exposure is carried out having the sensor group of one sensor or one line (one row) as a unit. The readout under the rolling shutters may also be referred to as the "rolling readout".

In a peripheral edge section of the first semiconductor chip 20d, pad sections 221 and 222 to be electrically connected to the outside, and via section 231 and 232 having the TC(S)V structure to be electrically connected to the second semiconductor chip 30d are provided. Note that, in the drawings, via sections may be indicated as "VIA". Here, the pad section 221 and the pad section 232 are provided on both the right and left sides interposing the sensor section 21d therebetween. However, the pad section can be provided on either the right or left side. In addition, the via section 231 and the via section 23 are provided on both the upper and lower sides interposing the sensor section 21d therebetween. However, the via section can be provided on either the upper or lower side. In addition, a bonding pad section is provided in the second semiconductor chip 30d on the lower side, and an opening section is provided in the first semiconductor chip 20d. It is possible to adopt a configuration in which wire bonding is performed to the bonding pad section provided in the second semiconductor chip 30d through the opening section provided in the first semiconductor chip 20d, or have a configuration of substrate mounting by adopting the TC(S)V structure from the second semiconductor chip 30d. Otherwise, the electrical connection between the circuit in the first semiconductor chip 20d and the circuit in the second semiconductor chip 30d can be achieved through a bump on the basis of a chip-on-chip method. The analog signal obtained from each sensor 40d of the sensor section 21d is transmitted from the first semiconductor chip 20d to the second semiconductor chip 30d through the via sections 231 and 232. Note that, in this specification, the concepts of the "left side", the "right side", the "upper side", the "lower side", the "upper and lower", the "up-down direction", the "right and left", and the "left-right direction" indicate a relative positional relation when viewing the drawings. The same applies to the following description.

The circuit configuration on the first semiconductor chip 20d side will be described with reference to FIG. 20. On the first semiconductor chip 20d side, in addition to the sensor section 21d in which the sensors 40d are arranged in a matrix, there is provided the row selection section 25d which selects each sensor 40 of the sensor section 21d by row as a unit on the basis of an address signal applied from the second semiconductor chip 30d side. Note that, here, the row selection section 25d is provided on the first semiconductor chip 20d. However, the row selection section 25 can be provided on the second semiconductor chip 30d side as well.

As illustrated in FIG. 20, the sensor 40d has a photodiode 41d as a photoelectric converting element, for example. In addition to the photodiode 41d, the sensor 40d has four transistors, for example, a transfer transistor (transfer gate) 42, a reset transistor 43d, an amplification transistor 44d, and a selection transistor 45d. As the four transistors 42d, 43d, 44d, and 45d, N-channel-type transistors are used, for example. However, the conductive-type combination of the transfer transistor 42d, the reset transistor 43d, the amplification transistor 44d, and the selection transistor 45d exemplified herein is merely an example, without being limited to the combination. In other words, it is possible to provide a combination using P-channel-type transistors as necessary. In addition, the transistors 42d, 43d, 44d, and 45d are the high breakdown voltage MOS transistors. In other words, the sensor section 21d is the high breakdown voltage transistor system circuit in its entirety, as described above.

With respect to the sensor 40d, a transfer signal TRG, a reset signal RST, and a selection signal SEL which are drive signals to drive the sensor 40d are appropriately applied from the row selection portion 25d. In other words, the transfer signal TRG is applied to a gate electrode of the transfer transistor 42d, the reset signal RST is applied to a gate electrode of the reset transistor 43d, and the selection signal SEL is applied to a gate electrode of the selection transistor 45d.

In the photodiode 41d, an anode electrode is connected to a low potential side power supply (for example, to a ground), and received light (incident light) is photoelectrically converted into a photoelectrical charge (herein, photoelectron) having an electrical charge in accordance with an amount of light thereof, thereby accumulating the photoelectrical charge. A cathode electrode of the photodiode 41d is electrically connected to a gate electrode of an amplification transistor 44d through the transfer transistor 42d. A node 46 which is electrically linked to the gate electrode of the amplification transistor 44d is referred to as a floating diffusion (FD) section (floating diffusion region section).

The transfer transistor 42d is connected between the cathode electrode of the photodiode 41d and a FD section 46d. A transfer signal TRG of which the high level (for example, $V_{DD}$ level) is active (hereinafter, expressed as "highly active") is applied from the row selection section 25d to the gate electrode of the transfer transistor 42d. In response to the transfer signal TRG, the transfer transistor 42d enters a conduction state, and the photoelectrical charge which is photoelectrically converted in the photodiode 41d is transferred to the FD section 46d. A drain region of the reset transistor 43d is connected to a sensor power supply VDD, and a source region is connected to the FD section 46d. The highly active reset signal RST is applied from the row selection section 25d to the gate electrode of the reset transistor 43d. In response to the reset signal RST, the reset transistor 43d enters the conduction state, and the electrical charge of the FD section 46d is discarded to the sensor power supply $V_{DD}$, thereby resetting the FD section 46d. The gate electrode of the amplification transistor 44d is connected to the FD section 46d, and the drain region is connected to the sensor power supply $V_{DD}$. Then, the amplification transistor 44d outputs the electrical potential of the FD section 46d which has been reset by the reset transistor 43d as a reset signal (reset level: $V_{Reset}$). Furthermore, the amplification transistor 44d outputs the electrical potential of the FD section 46d of which the signal charge has been transferred by the transfer transistor 42d as a photoelectrical accumulation signal (signal level) $V_{Sig}$. For example, the drain region of the selection transistor 45d is connected to the source region of the amplification transistor 44d, and the source region is connected to the signal line 26d. The highly active selection signal SEL is applied from the row selection section 25d to the gate electrode of the selection transistor 45d. In response to the selection signal SEL, the selection transistor 45d enters the conduction state, and the sensor 40d enters a selection state, and thus, the signal (analog signal) of the signal level $V_{Sig}$ which is output from the amplification transistor 44d is transmitted out to the signal line 26d.

As described above, the electrical potential of the FD section 46d which has been reset is read out as the reset level $V_{Reset}$, and then, the electrical potential of the FD section 46d of which the signal charge has been transferred is read out as signal level $V_{Si}$, sequentially from the sensor 40d to the signal line 26d. The signal level $V_{Sig}$ includes the component of the reset level $V_{Reset}$. Note that, regarding the selection transistor 45d, the circuit configuration is adopted to be connected between the source region of the amplification transistor 44d and the signal line 26d. However, it is possible to adopt a circuit configuration to be connected between the sensor power supply $V_{DD}$ and the drain region of the amplification transistor 44d.

In addition, the sensor 40d is not limited to the configuration of adopting such four transistors. For example, a configuration of three transistors in which the amplification transistor 44d also functions as the selection transistor 45d, a configuration in which the transistors after the FD section 46d are shared between a plurality of the photoelectric converting elements (between the sensors), and the like can be adopted regardless of the configuration of the circuit.

As illustrated in FIG. 19 and FIG. 20, and as described above, in the electronic device 10A, the memory section 32d, the data processing section 33d, the control section 34d, the current source 35d, the decoder 36d, the row decoder 37d, the interface (IF) section 38b, and the like are provided in the second semiconductor chip 30d, in which a sensor drive section (not illustrated) which drives each sensor 40d of the sensor section 21d is also provided. In the signal processing portion 31d, a predetermined signal process including digitization (AD conversion) in parallel (column parallel) can be performed by sensor column as a unit with respect to an analog signal which is read out from each sensor 40d of the sensor section 21d for each sensor row. In addition, the signal processing section 31d has the AD converter 50d for digitizing an analog signal which is read out from each sensor 40d of the sensor section 21d to the signal line 26d, and transfers image data (digital data) which is subjected to the AD conversion to the memory section 32d. The memory section 32d stores the image data which is subjected to predetermined signal process in the signal processing section 31d. The memory section 32d may have a non-volatile memory or may have a volatile memory. The data processing section 33d reads out the image data stored in the memory section 32d in a predetermined order, and performs various processes, thereby outputting the image data outside the chip. The control section 34d controls each operation in the signal processing section 31d such as a sensor drive section, the memory section 32d, and the data processing section 33d on the basis of reference signals, for example, a horizontal synchronizing signal XHS, a vertical synchronizing signal XVS, and a master clock MCK which are applied from the outside of the chip. In this case, the control section 34d performs control while performing synchronization between the circuit on the first semiconductor chip 20d side (the row selection section 25d or the sensor section 21d) and the signal processing section 31d on the second semiconductor chip 30d side (the memory section 32d, the data processing section 33d, and the like).

The current source 35d is connected to each signal line 26d to which analog signals are read out from each sensor 40d of the sensor section 21d for each sensor column. For example, the current source 35d has a so-called load MOS circuit configuration having an MOS transistor of which the gate potential is biased to a constant potential so as to supply a constant electrical current to the signal line 26d. The current source 35d having the load MOS circuit supplies the constant current to the amplification transistor 44d of the sensor 40d included in the selected row, thereby operating the amplification transistor 44d as a source follower. The decoder 36d applies an address signal which designates an address of a selected row to the row selection section 25d when selecting each sensor 40d of the sensor section 21d by row as a unit under the control of the control section 34d. The row decoder 37d designates a row address when writing image data to the memory section 32d, or reading out image data from the memory section 32d under the control of the control section 34d.

As described above, the signal processing section 31d has at least the AD converter 50d which digitizes (AD conversion) an analog signal read out from each sensor 40d of the sensor section 21d through the signal line 26d, and performs the signal process (column parallel AD) in parallel by sensor column as a unit with respect to the analog signal. The signal processing section 31d has the ramp voltage generator (reference voltage generator) 54d which generates a reference voltage Vref to be used at the time of the AD conversion in the AD converter 50d. The reference voltage generator 54d generates the reference voltage Vref having a so-called ramp waveform (inclined waveform) of which the voltage value exhibits stepwise changes with the lapse of time. For example, the reference voltage generator 54d can be configured by using the DA converter (digital-analog converter), without being limited thereto.

Figures 2A, 2B:
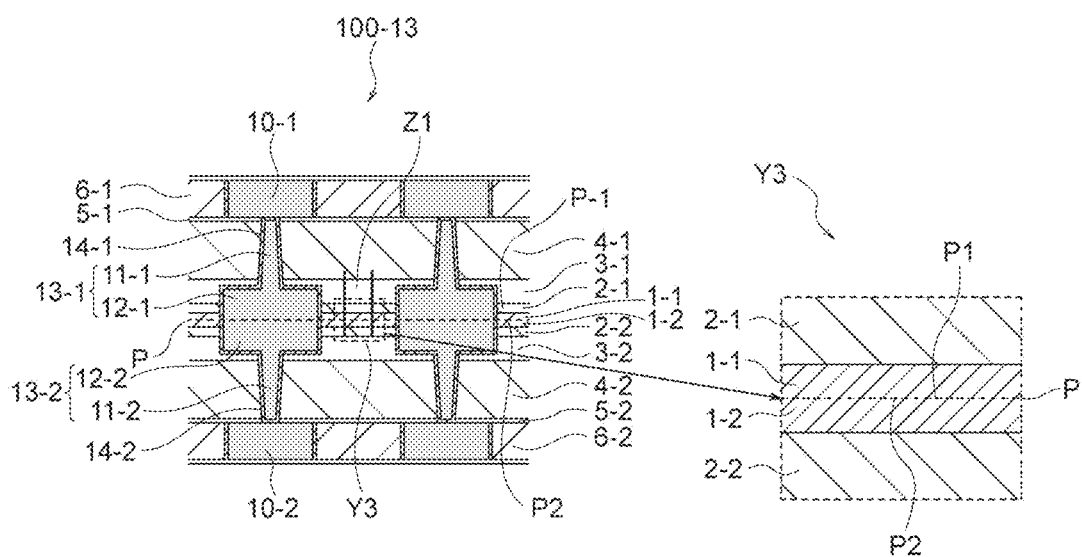
FIGS. 2A and 2B are cross-sectional views of a configuration example of a solid-state imaging device according to a first embodiment of the present technology.

For example, the AD converter 50d is provided in each sensor column of the sensor portion 21d, that is, for each signal line 26d. In other words, the AD converter 50d is a so-called column parallel AD converter which is arranged as many as the number of the sensor columns in the sensor portion 21d. In addition, for example, the AD converter 50d generates a pulse signal having the magnitude (the width of a pulse) in a time axis direction corresponding to the magnitude of the level of the analog signal, and measures the period length of the width of a pulse of the pulse signal, thereby performing the AD conversion process. More specifically, as illustrated in FIGS. 2A and 2B, the AD converter 50d has at least the comparator (COMP) 51d and the counter section 52d. The comparator 51d takes the analog signal (the signal level VSig and the reset level VReset described above) which is read out from each sensor 40d of the sensor section 21d through the signal line 26d as a comparison input, and takes the reference voltage Vref having the ramp waveform supplied from the reference voltage generator 54d as a reference input, thereby comparing both of the inputs. The ramp waveform is a waveform of which a voltage changes in an inclined state (stepwise) with the lapse of time. For example, an output of the comparator 51d is in a first state (for example, high level) when the reference voltage Vref becomes higher than the analog signal. On the other hand, when the reference voltage Vref is equal to or lower than the analog signal, the output thereof is in a second state (for example, low level). The output signal of the comparator 51d becomes a pulse signal having the width of a pulse corresponding to the magnitude of the level of the analog signal.

For example, an up/down counter is used as the counter section 52d. The clock CK is applied to the counter section 52d at the same timing as the supply start timing of the reference voltage Vref to the comparator 51d. The counter section 52d which is the up/down counter performs a down count or an up count being synchronized with the clock CK, thereby measuring the period of the width of a pulse of the output pulse from the comparator 51d, that is, the comparison period from the beginning of a comparison operation to the ending of the comparison operation. During the measuring operation, regarding the reset level $V_{Reset}$ and the signal level $V_{Sig}$ which are sequentially read out from the sensors 40d, the counter section 52d performs a down-count with respect to the reset level $V_{Reset}$ and performs an up-count with respect to the signal level $V_{Sig}$. Then, it is possible to obtain a difference between the signal level $V_{Sig}$ and the reset level $V_{Reset}$ on account of the operations of the down-count and up-count. As a result, in addition to the AD conversion process, a correlated double sampling (CDS) process is performed in the AD converter 50d. Here, the "CDS process" indicates a process for eliminating fixed pattern noise typical of the sensor such as a threshold variation of the amplification transistor 44d or reset noise of the sensor 40d by obtaining the difference between the signal level $V_{Sig}$ and the reset level $V_{Reset}$. Thus, the result of the count (count value) by the counter section 52d becomes a digital value (image data) in which an analog signal is digitized.

As described above, since the electronic device 10Ad that is the solid-state imaging device in which the first semiconductor chip 20d and the second semiconductor chip 30d are stacked may have a minimal size (area) as long as the sensor section 21d can be formed as the first semiconductor chip 20d, not only the size (area) of the first semiconductor chip 20d but also the size of the entire chips can be minimized. Moreover, since a process suitable for producing the sensor 40d can be applied to the first semiconductor chip 20d, and a process suitable for producing various circuits can be applied to the second semiconductor chip 30d respectively, it is possible to optimize the processes when producing the electronic device 10Ad. In addition, the analog signal is transmitted from the first semiconductor chip 20d side to the second semiconductor chip 30d side. On the other hand, the portion of the circuit performing the analog-digital process is provided within a single substrate (the second semiconductor chip 30d), circuit on the first semiconductor chip 20d side and the circuit on the second semiconductor chip 30d side are synchronized with each other and are controlled, thereby making it possible to realize the high-speed processing.

According to the present technology, with regard to the whole configuration of the solid-state imaging device, it is possible to combine two or more structural elements selected from the first to fifth configuration examples described above, as long as no technical contradiction occurs.

Next, solid-state imaging devices according to embodiments (first embodiment to seventh embodiment) of the present technology will be described in detail.

2. First Embodiment (First Example of Solid-State Imaging Device and Method of Producing Solid-State Imaging Device of First Example)

A solid-state imaging device according to a first embodiment of the present technology (first example of solid-state imaging device) is a solid-state imaging device including: a first substrate including at least a first electrode, a first modification layer, a first low-permittivity layer formed on the first modification layer, and a first joint surface where the first electrode and the first modification layer are exposed; and a second substrate including at least a second electrode, a second modification layer, a second low-permittivity layer formed on the second modification layer, and a second joint surface where the second electrode and the second modification layer are exposed. The first substrate and the second substrate form a laminate structure and are electrically connected by bonding the first joint surface and the second joint surface. The solid-state imaging device according to the first embodiment of the present technology (first example of solid-state imaging device) is a solid-state imaging device produced through the dual damascene method.

In the solid-state imaging device according to the first embodiment of the present technology (first example of solid-state imaging device), the first modification layer has higher hydrophilicity than the first low-permittivity layer, and the second modification layer has higher hydrophilicity than the second low-permittivity layer. The first modification layer and the second modification layer may have any thickness. For example, the first modification layer and the second modification layer has thicknesses that are 10 to 100 times smaller than the thickness of the first low-permittivity layer or the second low-permittivity layer.

With regard to the solid-state imaging device according to the first embodiment of the present technology (first example of solid-state imaging device), the first low-permittivity layer and the second low-permittivity layer (low-k films) are used as passivation films around the first electrode and the second electrode, and a modification layer having higher hydrophilicity is formed on a joint surface (front surface) of the first substrate and a joint surface (front surface) of the second substrate. This makes it possible to reduce capacity between adjacent electrodes (for example, capacity between the first electrodes and capacity between the second electrodes), and to bond the first substrate and the second substrate with high joint strength. In addition, when using the solid-state imaging device according to the first embodiment of the present technology (first example of solid-state imaging device), it is possible to reduce capacity between adjacent electrodes (for example, capacity between the first electrodes and capacity between the second electrodes) while maintaining high joint strength between the first substrate and the second substrate.

Each of the first low-permittivity layer and the second low-permittivity layer may include at least one selected from a group consisting of SiOC, SiOF, SiOCH, SiCOH, hydrogen silsesquioxane, and methylsilsesquioxane. In addition, for example, each of the first low-permittivity layer and the second low-permittivity layer may be made of low-permittivity material (low-k material) having relative permittivity of about 2.7 or less, and may be made of an insulating film having permittivity that is substantially equal to or less than permittivity of an insulating film made of silicon dioxide (SiO$_2$) or the like.

When using the solid-state imaging device according to the first embodiment of the present technology (first example of solid-state imaging device), the first low-permittivity layer may include SiOC, the first modification layer may include Si atoms, O atoms, and C atoms, concentration of the C atoms in the first modification layer may decrease toward the first joint surface, concentration of the O atoms in the first modification layer may increase toward the first joint surface, concentration of the C atoms in the first modification layer may decrease toward the first joint surface, and concentration of the O atoms in the first modification layer may increase toward the first joint surface.

When using the solid-state imaging device according to the first embodiment of the present technology (first example of solid-state imaging device), the second low-permittivity layer may include SiOC, the second modification layer may include Si atoms, O atoms, and C atoms, concentration of the C atoms in the second modification layer may decrease toward the second joint surface, concentration of the O atoms in the second modification layer may increase toward the second joint surface, concentration of the C atoms in the second modification layer may decrease toward the second joint surface, and concentration of the O atoms in the second modification layer may increase toward the second joint surface.

When using the solid-state imaging device according to the first embodiment of the present technology (first example of solid-state imaging device), the first low-permittivity layer may include SiOC, the second low-permittivity layer may include SiOC, the first modification layer may include Si atoms, O atoms, and C atoms, the second modification layer may include Si atoms, O atoms, and C atoms, concentration of the C atoms in the first modification layer may decrease toward the first joint surface, concentration of the C atoms in the second modification layer may decrease toward the second joint surface, concentration of the O atoms in the first modification layer may increase toward the first joint surface, or concentration of the O atoms in the second modification layer may increase toward the second joint surface.

When using the solid-state imaging device according to the first embodiment of the present technology (first example of solid-state imaging device), the first low-permittivity layer may include SiOC, the second low-permittivity layer may include SiOC, the first modification layer may include Si atoms, O atoms, and C atoms, the second modification layer may include Si atoms, O atoms, and C atoms, concentration of the C atoms in the first modification layer may decrease toward the first joint surface, and concentration of the O atoms in the first modification layer may increase toward the first joint surface. Alternatively, concentration of the C atoms in the second modification layer may decrease toward the second joint surface, and concentration of the O atoms in the second modification layer may increase toward the second joint surface.

When using the solid-state imaging device according to the first embodiment of the present technology (first example of solid-state imaging device), the first low-permittivity layer may include SiOC, the second low-permittivity layer may include SiOC, the first modification layer may include Si atoms, O atoms, and C atoms, the second modification layer may include Si atoms, O atoms, and C atoms, concentration of the C atoms in the first modification layer may decrease toward the first joint surface, concentration of the O atoms in the first modification layer may increase toward the first joint surface, and concentration of the C atoms in the second modification layer may decrease toward the second joint surface. Alternatively, concentration of the C atoms in the first modification layer may decrease toward the first joint surface, concentration of the O atoms in the first modification layer may increase toward the first joint surface, and concentration of the O atoms in the second modification layer may increase toward the second joint surface.

When using the solid-state imaging device according to the first embodiment of the present technology (first example of solid-state imaging device), the first low-permittivity layer may include SiOC, the second low-permittivity layer may include SiOC, the first modification layer may include Si atoms, O atoms, and C atoms, the second modification layer may include Si atoms, O atoms, and C atoms, concentration of the C atoms in the first modification layer may decrease toward the first joint surface, concentration of the C atoms in the second modification layer may decrease toward the second joint surface, and concentration of the O atoms in the second modification layer may increase toward the second joint surface. Alternatively, concentration of the O atoms in the first modification layer may increase toward the first joint surface, concentration of the C atoms in the second modification layer may decrease toward the second joint surface, and concentration of the O atoms in the second modification layer may increase toward the second joint surface.

The first example of the solid-state imaging device according to the first embodiment of the present technology and a method of producing the solid-state imaging device of the first example will be described with reference to FIGS. 2A, 2B, 3A, 3B, 3C, 3D, 4A, 4B, 4C, 5A, and 5B. FIGS. 2A and 2B are cross-sectional views of the first example of the solid-state imaging device according to the first embodiment of the present technology. FIG. 2A is a cross-sectional view of a solid-state imaging device 100-13, and FIG. 2B is an enlarged cross-sectional view of a portion Y3 illustrated in FIG. 2A. FIGS. 3A, 3B, 3C, and 3D are cross-sectional views for describing a first example of a method of producing the first example of the solid-state imaging device according to the first embodiment of the present technology (solid-state imaging device 100-2). FIGS. 4A, 4B, 4C, 5A and 5B are cross-sectional views for describing a second example of a method of producing the first example of the solid-state imaging device according to the first embodiment of the present technology (solid-state imaging device 100-4).

First, the following description will be given with reference to FIGS. 2A and 2B. As illustrated in FIGS. 2A and 2B, a first substrate of the solid-state imaging device 100-13 includes a first electrode 13-1, a first modification layer 1-1, a first low-permittivity layer 2-1 formed on the first modification layer 1-1 (upper direction in FIG. 2A), and a first joint surface P1 where the first electrode 13-1 and the first modification layer 1-1 are exposed. In addition, the first substrate of the solid-state imaging device 100-13 includes an SiN layer 3-1 formed on the first low-permittivity layer 2-1 (upper direction in FIG. 2A), a first low-permittivity layer 4-1 formed on the SiN layer 3-1 (upper direction in FIG. 2A), an SiN layer 5-1 formed on the first low-permittivity layer 4-1 (upper direction in FIG. 2A), and an interlayer insulating film 6-1 (such as SiO2) formed on the SiN layer 5-1 (upper direction in FIG. 2A). In the interlayer insulating film 6-1 (such as SiO2), first wiring 10-1 is embedded, and the first wiring 10-1 is connected to the first electrode 13-1. The first electrode 13-1 includes a via 11-1 and a trench 12-1.

A second substrate of the solid-state imaging device 100-13 includes a second electrode 13-2, a second modification layer 1-2, a second low-permittivity layer 2-2 formed on the second modification layer 1-2 (lower direction in FIG. 2A), and a second joint surface P2 where the second electrode 13-2 and the second modification layer 1-2 are exposed. In addition, the second substrate of the solid-state imaging device 100-13 includes an SiN layer 3-2 formed on the second low-permittivity layer 2-2 (lower direction in FIG. 2A), a second low-permittivity layer 4-2 formed on the SiN layer 3-2 (lower direction in FIG. 2A), an SiN layer 5-2 formed on the second low-permittivity layer 4-2 (lower direction in FIG. 2A), and an interlayer insulating film 6-2 (such as SiO2) formed on the SiN layer 5-2 (lower direction in FIG. 2A). In the interlayer insulating film 6-2 (such as SiO2), second wiring 10-2 is embedded, and the first wiring 10-2 is connected to the second electrode 13-2. The second electrode 13-2 includes a via 11-2 and a trench 12-2.

A barrier metal layer 14-1 is formed between a group of the first electrode 13-1 and the first wiring 10-1, and a group of the first modification layer 1-1, the first low-permittivity layer 2-1, the SiN layer 3-1, the first low-permittivity layer 4-1, the SiN layer 5-1, and the interlayer insulating film 6-1 (such as SiO$_2$). In addition, a barrier metal layer 14-2 is formed between a group of the second electrode 13-2 and the second wiring 10-2, and a group of the second modification layer 1-2, the second low-permittivity layer 2-2, the SiN layer 3-2, the second low-permittivity layer 4-2, the SiN layer 5-2, and the interlayer insulating film 6-2 (such as SiO$_2$). The barrier metal layers 14-1 and 14-2 include Ta, Ti, Ru, TaN, TiN, or the like, for example.

A joint part P is formed by bonding the first joint surface P1 and the second joint surface P2 of the solid-state imaging device 100-13, and the first substrate and the second substrate form a laminate structure and are electrically connected.

A method of producing the solid-state imaging device 100-2 will be described with reference to FIGS. 3A, 3B, 3C, and 3D.

As illustrated in FIG. 3A, the wiring 10-2 is formed in the second substrate to be bonded to the first substrate, and then a process of forming an insulating film is performed more than once (second low-permittivity layer 2-2, SiN layer 3-2, second low-permittivity layer 4-2, SiN layer 5-2, and interlayer insulating film 6-2 (such as SiO2). Next, a trench (serving as a trench 12-2 after being subjected to a metal plating process, which will be described later) and a via (serving as a via 11-2 after being subjected to the metal plating process, which will be described later) are formed for use in the dual damascene method, a barrier layer 14-2 and a seed layer (not illustrated) is formed through sputtering, and then the metal plating process is performed by using Cu, Au, or the like. After the plating process, the electrode 13-2 (including via 11-2 and trench 12-2) are formed by performing Cu (Au) CMP on the second substrate until the insulating film (second low-permittivity layer 2-2) is exposed on a front surface. Note that it is also possible to form the electrode 13-1 (including via 11-1 and trench 12-1) in the first substrate in a way similar to the above.

As illustrated in FIG. 3B, for example, the modification layer 1-2 is formed on an uppermost surface of the second low-permittivity layer 2-2 (low-k film) made of SiOC or the like, by radiating O2 plasma R to the second low-permittivity layer 2-2. In the modification layer 1-2, an amount of carbon (C) decreases (gradually) toward the upper surface of the film (upper direction in FIG. 3B). Therefore, the uppermost surface of the modification layer 1-2 has a film quality that is similar to SiO2. Next, for example, as illustrated in FIG. 3C, surface activation is performed on the surface of the modification layer 1-2 by radiating N2 plasma S, the surface is washed with purified water, and the surface become hydrophilic.

Finally, as illustrated in FIG. 3D, the modification layer 1-1 of the first substrate and 1-2 of the second substrate are bonded in such a manner that they face each other, the joint strength between the first substrate and the second substrate increases through heating, and thereby the solid-state imaging device 100-2 is produced.

A method of producing the solid-state imaging device 100-4 will be described with reference to FIGS. 4A, 4B, 4C, 5A, and 5B.

As illustrated in FIG. 4A, the wiring 10-2 is formed in the second substrate to be bonded to the first substrate, and then a process of forming an insulating film is performed more than once (second low-permittivity layer 2-2, SiN layer 3-2, second low-permittivity layer 4-2, SiN layer 5-2, and interlayer insulating film 6-2 (such as SiO2). Next, a trench (serving as a trench 12-2 after being subjected to a metal plating process, which will be described later) and a via (serving as a via 11-2 after being subjected to the metal plating process, which will be described later) are formed for use in the dual damascene method, a barrier layer 14-2 and a seed layer (not illustrated) is formed through sputtering, and then the metal plating process is performed by using Cu, Au, or the like. After the plating process, the electrode 13-2 (including via 11-2 and trench 12-2) are formed by performing Cu (Au) CMP on the second substrate until the insulating film (second low-permittivity layer 2-2) is exposed on a front surface. Note that it is also possible to form the electrode 13-1 (including via 11-1 and trench 12-1) in the first substrate in a way similar to the above.

As illustrated in FIG. 4B, for example, the modification layer 1-2 is formed on an uppermost surface of the second low-permittivity layer 2-2 (low-k film) made of SiOC or the like, by radiating O2 plasma R to the second low-permittivity layer 2-2. In the modification layer 1-2, an amount of carbon (C) decreases (gradually) toward the upper surface of the film (upper direction in FIG. 4B). Therefore, the uppermost surface of the modification layer 1-2 has a film quality that is similar to SiO2. In addition, at the same time, oxides 15-2 formed on a Cu or Au pad surface are removed through reduction treatment using H2 plasma T, as illustrated in FIG. 4C, for example.

Next, for example, as illustrated in FIG. 5A, surface activation is performed on the surface of the modification layer 1-2 by radiating N2 plasma S, the surface is washed with purified water, and the surface become hydrophilic.

Finally, as illustrated in FIG. 5B, the modification layer 1-1 of the first substrate and 1-2 of the second substrate are bonded in such a manner that they face each other, the joint strength between the first substrate and the second substrate increases through heating, and thereby the solid-state imaging device 100-4 is produced.

In addition to the above description, the following descriptions regarding solid-state imaging devices according to second to seventh embodiments of the present technology is applicable to the solid-state imaging device according to the first embodiment of the present technology, as long as no technical contradiction occurs.

3. Second Embodiment (Second Example of Solid-State Imaging Device and Method of Producing Solid-State Imaging Device of Second Example)

A solid-state imaging device according to a second embodiment of the present technology (second example of solid-state imaging device) is a solid-state imaging device including: a first substrate including at least a first electrode, a first modification layer, a first low-permittivity layer formed on the first modification layer, an insulating thin film, and a first joint surface where the insulating thin film is exposed; and a second substrate including at least a second electrode, a second modification layer, a second low-permittivity layer formed on the second modification layer, and a second joint surface where the second electrode and the second modification layer are exposed. The first substrate and the second substrate form a laminate structure and are electrically connected by bonding the first joint surface and the second joint surface.

In addition, the solid-state imaging device according to the second embodiment of the present technology (second example of solid-state imaging device) is a solid-state imaging device including: a first substrate including at least a first electrode, a first modification layer, a first low-permittivity layer formed on the first modification layer, and a first joint surface where the first electrode and the first modification layer are exposed; and a second substrate including at least a second electrode, a second modification layer, a second low-permittivity layer formed on the second modification layer, an insulating thin film, and a second joint surface where the insulating thin film is exposed. The first substrate and the second substrate form a laminate structure and are electrically connected by bonding the first joint surface and the second joint surface.

The solid-state imaging device according to the second embodiment of the present technology (second example of solid-state imaging device) is a solid-state imaging device produced through the dual damascene method.

In the solid-state imaging device according to the second embodiment of the present technology (second example of solid-state imaging device), the first modification layer has higher hydrophilicity than the first low-permittivity layer, and the second modification layer has higher hydrophilicity than the second low-permittivity layer.

With regard to the solid-state imaging device according to the second embodiment of the present technology (second example of solid-state imaging device), the first low-permittivity layer and the second low-permittivity layer (low-k films) are used as passivation films around the first electrode and the second electrode, and a modification layer having higher hydrophilicity is formed on a joint surface (front surface) of the first substrate and a joint surface (front surface) of the second substrate. This makes it possible to reduce capacity between adjacent electrodes (for example, capacity between the first electrodes and capacity between the second electrodes), and to bond the first substrate and the second substrate with high joint strength. In addition, when using the solid-state imaging device according to the second embodiment of the present technology (second example of solid-state imaging device), it is possible to reduce capacity between adjacent electrodes (for example, capacity between the first electrodes and capacity between the second electrodes) while maintaining high joint strength between the first substrate and the second substrate. In addition, the solid-state imaging device according to the second embodiment of the present technology (second example of solid-state imaging device) includes the insulating thin film. This makes it possible to further increase the joint strength.

The second example of the solid-state imaging device according to the second embodiment of the present technology and a method of producing the solid-state imaging device of the second example will be described with reference to FIGS. 6 A, 6B, 6C, 7A, and 7B. FIGS. 6A, 6B, 6C, 7A, and 7B are cross-sectional views for describing a first example of the method of producing the second example of the solid-state imaging device according to the second embodiment of the present technology (solid-state imaging device 100-6).

A method of producing the solid-state imaging device 100-6 will be described with reference to FIGS. 6A, 6B, 6C, 7A, and 7B.

As illustrated in FIG. 6A, the wiring 10-2 is formed in the second substrate to be bonded to the first substrate, and then a process of forming an insulating film is performed more than once (second low-permittivity layer 2-2, SiN layer 3-2, second low-permittivity layer 4-2, SiN layer 5-2, and interlayer insulating film 6-2 (such as SiO2). Next, a trench (serving as a trench 12-2 after being subjected to a metal plating process, which will be described later) and a via (serving as a via 11-2 after being subjected to the metal plating process, which will be described later) are formed for use in the dual damascene method, a barrier layer 14-2 and a seed layer (not illustrated) is formed through sputtering, and then the metal plating process is performed by using Cu, Au, or the like. After the plating process, the electrode 13-2 (including via 11-2 and trench 12-2) are formed by performing Cu (Au) CMP on the second substrate until the insulating film (second low-permittivity layer 2-2) is exposed on a front surface. Note that it is also possible to form the electrode 13-1 (including via 11-1 and trench 12-1) in the first substrate in a way similar to the above.

As illustrated in FIG. 6B, for example, the modification layer 1-2 is formed on an uppermost surface of the second low-permittivity layer 2-2 (low-k film) made of SiOC or the like, by radiating O2 plasma R to the second low-permittivity layer 2-2. In the modification layer 1-2, an amount of carbon (C) decreases (gradually) toward the upper surface of the film (upper direction in FIG. 6B). Therefore, the uppermost surface of the modification layer 1-2 has a film quality that is similar to SiO2.

Next, as illustrated in FIG. 6C, an ALD film 7-2 is formed on the modification layer 1-2 (in an upper direction in FIG. 6C).

Figures 7A, 7B:
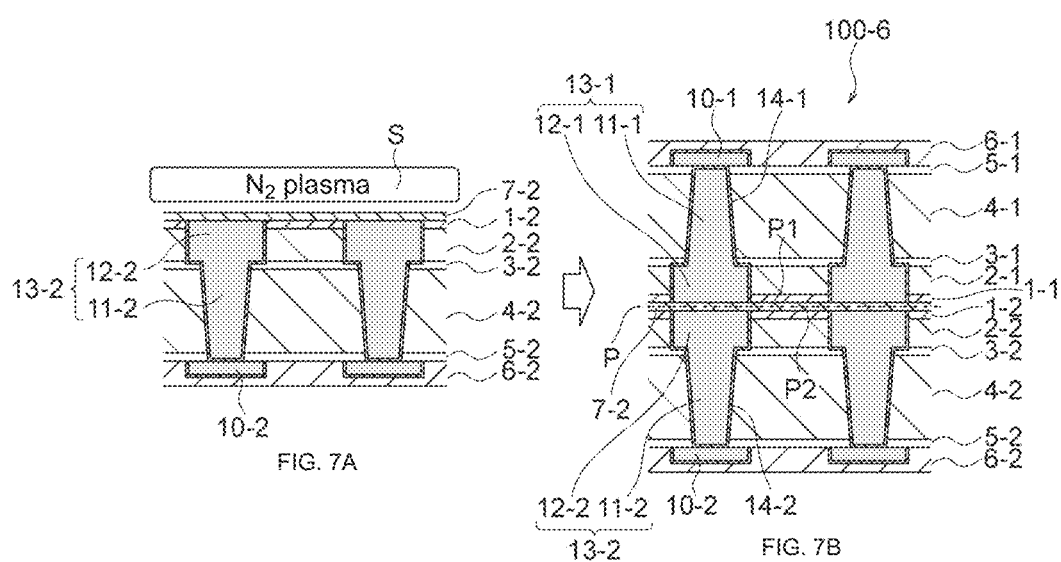
FIGS. 7A and 7B are cross-sectional views for describing the method of producing a solid-state imaging device according to the second embodiment of the present technology.

Next, for example, as illustrated in FIG. 7A, surface activation is performed on the surface of the modification layer 1-2 (and the insulating thin film 7-2) by radiating N2 plasma S, the surface is washed with purified water, and the surface become hydrophilic.

Finally, as illustrated in FIG. 7B, the modification layer 1-1 of the first substrate and 1-2 of the second substrate are bonded in such a manner that they face each other, the joint strength between the first substrate and the second substrate increases through heating, and thereby the solid-state imaging device 100-6 is produced. The insulating thin film 7-2 is interposed between the joint surface P1 of the first substrate and the joint surface P2 of the second substrate. The joint surface P1 of the first substrate, the joint surface p2 of the second substrate, and the insulating thin film 7-2 form a joint part P.

In addition to the above description, the above description regarding the solid-state imaging device according to the first embodiment of the present technology and the following descriptions regarding solid-state imaging devices according to third to seventh embodiments of the present technology are applicable to the solid-state imaging device according to the second embodiment of the present technology, as long as no technical contradiction occurs.

4. Third Embodiment (Third Example of Solid-State Imaging Device)

A solid-state imaging device according to a third embodiment of the present technology (third example of solid-state imaging device) is a solid-state imaging device including: a first substrate including at least a first electrode, a first modification layer, a first low-permittivity layer formed on the first modification layer, and a first joint surface where the first electrode and the first modification layer are exposed; and a second substrate including at least a second electrode, a second modification layer, a second low-permittivity layer formed on the second modification layer, and a second joint surface where the second electrode and the second modification layer are exposed. In addition, the first joint surface and the second joint surface of the solid-state imaging device according to the third embodiment of the present technology (third example of solid-state imaging device) are bonded to each other. Therefore, the first substrate and the second substrate form a laminate structure. The first substrate includes a pixel area where a plurality of pixels including photoelectric converters is arrayed. The second substrate includes a peripheral circuit section including at least a logic circuit. The peripheral circuit section is formed on a periphery of the pixel area. The first electrode of the first substrate is formed in an area outside of the pixel area and is electrically connected to the second electrode of the second substrate. The solid-state imaging device according to the third embodiment of the present technology (third example of solid-state imaging device) is a solid-state imaging device produced through the dual damascene method or a single damascene method.

In the solid-state imaging device according to the third embodiment of the present technology (third example of solid-state imaging device), the first modification layer has higher hydrophilicity than the first low-permittivity layer, and the second modification layer has higher hydrophilicity than the second low-permittivity layer.

With regard to the solid-state imaging device according to the third embodiment of the present technology (third example of solid-state imaging device), the first low-permittivity layer and the second low-permittivity layer (low-k films) are used as passivation films around the first electrode and the second electrode, and a modification layer having higher hydrophilicity is formed on a joint surface (front surface) of the first substrate and a joint surface (front surface) of the second substrate. This makes it possible to reduce capacity between adjacent electrodes (for example, capacity between the first electrodes and capacity between the second electrodes), and to bond the first substrate and the second substrate with high joint strength. In addition, when using the solid-state imaging device according to the third embodiment of the present technology (third example of solid-state imaging device), it is possible to reduce capacity between adjacent electrodes (for example, capacity between the first electrodes and capacity between the second electrodes) while maintaining high joint strength between the first substrate and the second substrate.

The third example of the solid-state imaging device according to the third embodiment of the present technology will be described with reference to FIGS. 8A and 8B. FIGS. 8A and 8B are perspective views of the third example of the solid-state imaging device according to the third embodiment of the present technology (solid-state imaging device 100-7).

As illustrated in FIGS. 8A and 8B, the first joint surface and the second joint surface of the solid-state imaging device 100-7 are bonded, and thereby the first substrate 10 (such as pixel chip) and the second substrate 20 (such as logic chip) form a laminate structure. The first substrate 10 includes a pixel area 11 where a plurality of pixels including photoelectric converters is arrayed. The second substrate 20 includes a peripheral circuit section including at least a logic circuit. The peripheral circuit section is formed on a periphery of the pixel area. Connection sections 12 and connection sections 22 are electrically connected to each other via the electrodes 13, and signal lines or power source lines of the first substrate 10 and the second substrate 20 are connected. The connection sections 12 are formed in an area outside of the pixel area of the first substrate 10, and the connection sections 22 of the second substrate 20 are formed in an area corresponding to the area outside of the pixel area.

In addition to the above description, the above descriptions regarding the solid-state imaging devices according to the first and second embodiments of the present technology and the following descriptions regarding solid-state imaging devices according to fourth to seventh embodiments of the present technology are applicable to the solid-state imaging device according to the third embodiment of the present technology, as long as no technical contradiction occurs.

5. Fourth Embodiment (Fourth Example of Solid-State Imaging Device)

A solid-state imaging device according to a fourth embodiment of the present technology (fourth example of solid-state imaging device) is a solid-state imaging device including: a first substrate including at least a first electrode, a first modification layer, a first low-permittivity layer formed on the first modification layer, and a first joint surface where the first electrode and the first modification layer are exposed; and a second substrate including at least a second electrode, a second modification layer, a second low-permittivity layer formed on the second modification layer, and a second joint surface where the second electrode and the second modification layer are exposed. In addition, the first joint surface and the second joint surface of the solid-state imaging device according to the fourth embodiment of the present technology (fourth example of solid-state imaging device) are bonded to each other. Therefore, the first substrate and the second substrate form a laminate structure. The first substrate includes a pixel area where a plurality of pixels including photoelectric converters is arrayed. The second substrate includes a peripheral circuit section including at least a logic circuit. The peripheral circuit section is formed on a periphery of the pixel area. The first electrode of the first substrate is formed in the pixel area and an area outside of the pixel area and is electrically connected to the second electrode of the second substrate. Note that, in the solid-state imaging device according to the fourth embodiment of the present technology (fourth example of solid-state imaging device), the first electrode of the first substrate is formed in the pixel area and is electrically connected to the second electrode of the second substrate. The solid-state imaging device according to the fourth embodiment of the present technology (fourth example of solid-state imaging device) is a solid-state imaging device produced through the dual damascene method or a single damascene method.

In the solid-state imaging device according to the fourth embodiment of the present technology (fourth example of solid-state imaging device), the first modification layer has higher hydrophilicity than the first low-permittivity layer, and the second modification layer has higher hydrophilicity than the second low-permittivity layer.

With regard to the solid-state imaging device according to the fourth embodiment of the present technology (fourth example of solid-state imaging device), the first low-permittivity layer and the second low-permittivity layer (low-k films) are used as passivation films around the first electrode and the second electrode, and a modification layer having higher hydrophilicity is formed on a joint surface (front surface) of the first substrate and a joint surface (front surface) of the second substrate. This makes it possible to reduce capacity between adjacent electrodes (for example, capacity between the first electrodes and capacity between the second electrodes), and to bond the first substrate and the second substrate with high joint strength. In addition, when using the solid-state imaging device according to the fourth embodiment of the present technology (fourth example of solid-state imaging device), it is possible to reduce capacity between adjacent electrodes (for example, capacity between the first electrodes and capacity between the second electrodes) while maintaining high joint strength between the first substrate and the second substrate.

The fourth example of the solid-state imaging device according to the fourth embodiment of the present technology will be described with reference to FIGS. 9A and 9B. FIGS. 9A and 9B are perspective views of the fourth example of the solid-state imaging device according to the fourth embodiment of the present technology (solid-state imaging device 100-8).

The first joint surface and the second joint surface of the solid-state imaging device 100-8 are bonded, and thereby the first substrate 10 (such as pixel chip) and the second substrate 20 (such as logic chip) form a laminate structure. The first substrate 10 includes a pixel area 11 where a plurality of pixels including photoelectric converters is arrayed. The second substrate 20 includes a peripheral circuit section including at least a logic circuit. The peripheral circuit section is formed on a periphery of the pixel area. Connection sections 12 and connection sections 22 are electrically connected to each other via the electrodes 13. The connection sections 12 are formed in an area outside of the pixel area of the first substrate 10, and the connection sections 22 of the second substrate 20 are formed in an area corresponding to the area outside of the pixel area. In addition, connection sections X1 and connection sections X2 are electrically connected to each other via electrodes 14. The connection section X1 is formed in a pixel or between pixels in the pixel area of the first substrate 10, and the connection section X2 of the second substrate 20 is formed in an area corresponding to an area within the pixel or an area between the pixels in the pixel area. Signal lines or power source lines of the first substrate 10 and the second substrate 20 are connected. The electrode 14 is formed in the pixel or between the pixels in the pixel area. Therefore, in general, spaces the electrodes 14 are narrow, and capacity is easily generated between the electrodes 14. However, the solid-state imaging device 100-8 has the first modification layer and the second modification layer. Therefore, it is possible to reduce the capacity.

In addition to the above description, the above descriptions regarding the solid-state imaging devices according to the first to third embodiments of the present technology and the following descriptions regarding solid-state imaging devices according to fifth to seventh embodiments of the present technology are applicable to the solid-state imaging device according to the fourth embodiment of the present technology, as long as no technical contradiction occurs.

6. Fifth Embodiment (Fifth Example of Solid-State Imaging Device and Method of Producing Solid-State Imaging Device of Fifth Example)

A solid-state imaging device according to a fifth embodiment of the present technology (fifth example of solid-state imaging device) is a solid-state imaging device including: a first substrate including at least a first electrode, a first modification layer, and a first joint surface where the first electrode and the first modification layer are exposed; and a second substrate including at least a second electrode, a second modification layer, a second low-permittivity layer formed on the second modification layer, and a second joint surface where the second electrode and the second modification layer are exposed. The first substrate and the second substrate form a laminate structure and are electrically connected by bonding the first joint surface and the second joint surface. The solid-state imaging device according to the fifth embodiment of the present technology (fifth example of solid-state imaging device) is a solid-state imaging device produced through the dual damascene method.

In the solid-state imaging device according to the fifth embodiment of the present technology (fifth example of solid-state imaging device), the first modification layer has higher hydrophilicity than the first low-permittivity layer, and the second modification layer has higher hydrophilicity than the second low-permittivity layer.

With regard to the solid-state imaging device according to the fifth embodiment of the present technology (fifth example of solid-state imaging device), the low-permittivity layer (low-k film) is used as a passivation film around the first electrode and the second electrode, and a modification layer having higher hydrophilicity is formed on a joint surface (front surface) of the first substrate and a joint surface (front surface) of the second substrate. This makes it possible to reduce capacity between adjacent electrodes (for example, capacity between the first electrodes and capacity between the second electrodes), and to bond the first substrate and the second substrate with high joint strength. In addition, when using the solid-state imaging device according to the fifth embodiment of the present technology (fifth example of solid-state imaging device), it is possible to reduce capacity between adjacent electrodes (for example, capacity between the first electrodes and capacity between the second electrodes) while maintaining high joint strength between the first substrate and the second substrate.

The low-permittivity layer may include at least one selected from a group consisting of SiOC, SiOF, SiOCH, SiCOH, hydrogen silsesquioxane, and methylsilsesquioxane. In addition, for example, each of the first low-permittivity layer and the second low-permittivity layer may be made of low-permittivity material (low-k material) having relative permittivity of about 2.7 or less, and may be made of an insulating film having permittivity that is substantially equal to or less than permittivity of an insulating film made of silicon dioxide ($SiO_2$) or the like.

When using the solid-state imaging device according to the fifth embodiment of the present technology (fifth example of solid-state imaging device), the first modification layer may include Si atoms, O atoms, and C atoms, the low-permittivity layer may include SiOC, the second modification layer may include Si atoms, O atoms, and C atoms, concentration of the C atoms in the second modification layer may decrease toward the second joint surface, concentration of the O atoms in the second modification layer may increase toward the second joint surface, concentration of the C atoms in the second modification layer may decrease toward the second joint surface, and concentration of the O atoms in the second modification layer may increase toward the second joint surface.

The fifth example of the solid-state imaging device according to the fifth embodiment of the present technology and a method of producing the solid-state imaging device of the fifth example will be described with reference to FIGS. 10A, 10B, 10C and 10D. FIGS. 10A, 10B, 10C and 10D are cross-sectional views for describing a first example of the method of producing the fifth example of the solid-state imaging device according to the fifth embodiment of the present technology (solid-state imaging device 100-9).

A method of producing the solid-state imaging device 100-9 will be described with reference to FIGS. 3A, 3B, 3C, and 3D.

As illustrated in FIG. 10A, the wiring 10-2 is formed in the second substrate to be bonded to the first substrate, and then a process of forming an insulating film is performed more than once (low-permittivity layer 2-2, SiN layer 3-2, low-permittivity layer 4-2, SiN layer 5-2, and interlayer insulating film 6-2 (such as SiO2). Next, a trench (serving as a trench 12-2 after being subjected to a metal plating process, which will be described later) and a via (serving as a via 11-2 after being subjected to the metal plating process, which will be described later) are formed for use in the dual damascene method, a barrier layer 14-2 and a seed layer (not illustrated) is formed through sputtering, and then the metal plating process is performed by using Cu, Au, or the like. After the plating process, the electrode 13-2 (including via 11-2 and trench 12-2) are formed by performing Cu (Au) CMP on the second substrate until the insulating film (low-permittivity layer 2-2) is exposed on a front surface. Note that it is also possible to form the electrode 13-1 (including via 11-1 and trench 12-1) in the first substrate in a way similar to the above. However, it is not necessary to radiating O2 plasma R (to be described later) to the first substrate to form a modification layer, because the first substrate of the solid-state imaging device 100-p includes no low-permittivity layer (low-k material). In the solid-state imaging device 100-9, the first substrate includes no low-permittivity layer (low-k material) but the second substrate includes the low-permittivity layer (low-k material). However, the first substrate may include the low-permittivity layer (low-k material) and the second substrate does not have to include the low-permittivity layer (low-k material).

As illustrated in FIG. 10B, for example, the modification layer 1-2 is formed on an uppermost surface of the low-permittivity layer 2-2 (low-k film) made of SiOC or the like, by radiating O2 plasma R to the low-permittivity layer 2-2. In the modification layer 1-2, an amount of carbon (C) decreases (gradually) toward the upper surface of the film (upper direction in FIG. 10B). Therefore, the uppermost surface of the modification layer 1-2 has a film quality that is similar to SiO2. Next, for example, as illustrated in FIG. 10C, surface activation is performed on the surface of the modification layer 1-2 by radiating N2 plasma S, the surface is washed with purified water, and the surface become hydrophilic.

Finally, as illustrated in FIG. 10D, the modification layer 1-1 of the first substrate and 1-2 of the second substrate are bonded in such a manner that they face each other, the joint strength between the first substrate and the second substrate increases through heating, and thereby the solid-state imaging device 100-9 is produced.

A first substrate of the solid-state imaging device 100-9 includes a first electrode 13-1, an SiO2 layer (insulating layer) 8-1, and a first joint surface P1 where the first electrode 13-1 and the SiO2 layer (insulating layer) 8-1 are exposed. In addition, the first substrate of the solid-state imaging device 110-9 includes an SiN layer 3-1 formed on the SiO2 layer 8-1 (upper direction in FIG. 10D), an SiO2 layer 9-1 formed on the SiN layer 3-1 (upper direction in FIG. 10D), an SiN layer 5-1 formed on the SiO2 layer 9-1 (upper direction in FIG. 10D), and an interlayer insulating film 6-1 (such as SiO2) formed on the SiN layer 5-1 (upper direction in FIG. 10D). In the interlayer insulating film 6-1 (such as SiO2), first wiring 10-1 is embedded, and the first wiring 10-1 is connected to the first electrode 13-1. The first electrode 13-1 includes a via 11-1 and a trench 12-1.

A second substrate of the solid-state imaging device 100-9 includes a second electrode 13-2, a modification layer 1-2, a low-permittivity layer 2-2 formed on the modification layer 1-2 (lower direction in FIG. 10D), and a second joint surface P2 where the second electrode 13-2 and the modification layer 1-2 are exposed. In addition, the second substrate of the solid-state imaging device 100-9 includes an SiN layer 3-2 formed on the low-permittivity layer 2-2 (lower direction in FIG. 10D), a low-permittivity layer 4-2 formed on the SiN layer 3-2 (lower direction in FIG. 10D), an SiN layer 5-2 formed on the low-permittivity layer 4-2 (lower direction in FIG. 10D), and an interlayer insulating film 6-2 (such as SiO2) formed on the SiN layer 5-2 (lower direction in FIG. 10D). In the interlayer insulating film 6-2 (such as SiO2), second wiring 10-2 is embedded, and the first wiring 10-2 is connected to the second electrode 13-2. The second electrode 13-2 includes a via 11-2 and a trench 12-2.

A barrier metal layer 14-1 is formed between a group of the first electrode 13-1 and the first wiring 10-1, and a group of the SiO2 layer (insulating layer) 8-1, the SiN layer 3-1, the SiO2 layer (insulating layer) 9-1, the SiN layer 5-1, and the interlayer insulating film 6-1 (such as $SiO_2$). In addition, a barrier metal layer 14-2 is formed between a group of the second electrode 13-2 and the second wiring 10-2, and a group of the modification layer 1-2, the second low-permittivity layer 2-2, the SiN layer 3-2, the low-permittivity layer 4-2, the SiN layer 5-2, and the interlayer insulating film 6-2 (such as $SiO_2$). The barrier metal layers 14-1 and 14-2 include Ta, Ti, Ru, TaN, TiN, or the like, for example.

A joint part P is formed by bonding the first joint surface P1 and the second joint surface P2 of the solid-state imaging device 100-9, and the first substrate and the second substrate form a laminate structure and are electrically connected.

In addition to the above description, the above descriptions regarding the solid-state imaging devices according to the first to fourth embodiments of the present technology and the following descriptions regarding solid-state imaging devices according to sixth to seventh embodiments of the present technology are applicable to the solid-state imaging device according to the fifth embodiment of the present technology, as long as no technical contradiction occurs.

7. Sixth Embodiment (Sixth Example of Solid-State Imaging Device and Method of Producing Solid-State Imaging Device of Sixth Example)

A solid-state imaging device according to a sixth embodiment of the present technology (sixth example of solid-state imaging device) is a solid-state imaging device including: a first substrate including at least a first electrode, a first modification layer, a first low-permittivity layer formed on the first modification layer, and a first joint surface where the first electrode and the first modification layer are exposed; and a second substrate including at least a second electrode, a second modification layer, a second low-permittivity layer formed on the second modification layer, and a second joint surface where the second electrode and the second modification layer are exposed. The first substrate and the second substrate form a laminate structure and are electrically connected by bonding the first joint surface and the second joint surface. The solid-state imaging device according to the sixth embodiment of the present technology (sixth example of solid-state imaging device) is a solid-state imaging device produced through the single damascene method.

In the solid-state imaging device according to the sixth embodiment of the present technology (sixth example of solid-state imaging device), the first modification layer has higher hydrophilicity than the first low-permittivity layer, and the second modification layer has higher hydrophilicity than the second low-permittivity layer.

With regard to the solid-state imaging device according to the sixth embodiment of the present technology (sixth example of solid-state imaging device), the first low-permittivity layer and the second low-permittivity layer (low-k films) are used as passivation films around the first electrode and the second electrode, and a modification layer having higher hydrophilicity is formed on a joint surface (front surface) of the first substrate and a joint surface (front surface) of the second substrate. This makes it possible to reduce capacity between adjacent electrodes (for example, capacity between the first electrodes and capacity between the second electrodes), and to bond the first substrate and the second substrate with high joint strength. In addition, when using the solid-state imaging device according to the sixth embodiment of the present technology (sixth example of solid-state imaging device), it is possible to reduce capacity between adjacent electrodes (for example, capacity between the first electrodes and capacity between the second electrodes) while maintaining high joint strength between the first substrate and the second substrate.

The sixth example of the solid-state imaging device according to the sixth embodiment of the present technology and a method of producing the solid-state imaging device of the sixth example will be described with reference to FIGS. 11A, 11B, 11C, and 11D. FIGS. 11A, 11B, 11C, and 11D are cross-sectional views for describing a first example of the method of producing the sixth example of the solid-state imaging device according to the sixth embodiment of the present technology (solid-state imaging device 100-10).

A method of producing the solid-state imaging device 100-10 will be described with reference to FIGS. 11A, 11B, 11C, and 11D.

As illustrated in FIG. 11A, the wiring 20-2 is formed in the second substrate to be bonded to the first substrate, and then a process of forming an insulating film is performed more than once (second low-permittivity layer 4-2, SiN layer 5-2, and interlayer insulating film 6-2 (such as SiO2)). Next, a via (serving as an electrode 21-2 after being subjected to a metal plating process, which will be described later) are formed for use in the single damascene method, a barrier layer 14-2 and a seed layer (not illustrated) is formed through sputtering, and then the metal plating process is performed by using Cu, Au, or the like. After the plating process, the electrode 21-2 (including via) is formed by performing Cu (Au) CMP on the second substrate until the insulating film (second low-permittivity layer 2-2) is exposed on a front surface. Note that it is also possible to form the electrode 21-1 (including via) in the first substrate in a way similar to the above.

As illustrated in FIG. 11B, for example, the modification layer 1-2 is formed on an uppermost surface of the second low-permittivity layer 2-2 (low-k film) made of SiOC or the like, by radiating O2 plasma R to the second low-permittivity layer 2-2. In the modification layer 1-2, an amount of carbon (C) decreases (gradually) toward the upper surface of the film (upper direction in FIG. 11B). Therefore, the uppermost surface of the modification layer 1-2 has a film quality that is similar to SiO2. Next, for example, as illustrated in FIG. 11C, surface activation is performed on the surface of the modification layer 1-2 by radiating N2 plasma S, the surface is washed with purified water, and the surface become hydrophilic.

Finally, as illustrated in FIG. 11D, the modification layer 1-1 of the first substrate and 1-2 of the second substrate are bonded in such a manner that they face each other, the joint strength between the first substrate and the second substrate increases through heating, and thereby the solid-state imaging device 100-10 is produced.

A first substrate of the solid-state imaging device 100-10 includes a first electrode 21-1, a first modification layer 1-1, a first low-permittivity layer 4-1 formed on the first modification layer 1-1 (upper direction in FIG. 11D), and a first joint surface P1 where the first electrode 21-1 and the first modification layer 1-1 are exposed. In addition, the first substrate of the solid-state imaging device 100-10 includes an SiN layer 5-1 formed on the first low-permittivity layer 4-1 (upper direction in FIG. 11D), and an interlayer insulating film 6-1 (such as SiO2) formed on the SiN layer 5-1 (upper direction in FIG. 11D). In the interlayer insulating film 6-1 (such as SiO2), first wiring 20-1 is embedded, and the first wiring 20-1 is connected to the first electrode 21-1. The first electrode 21-1 includes a via.

A second substrate of the solid-state imaging device 100-10 includes a second electrode 21-2, a second modification layer 1-2, a second low-permittivity layer 4-2 formed on the second modification layer 1-2 (lower direction in FIG. 11D), and a second joint surface P2 where the second electrode 21-2 and the second modification layer 1-2 are exposed. In addition, the second substrate of the solid-state imaging device 100-10 includes an SiN layer 5-2 formed on the second low-permittivity layer 4-2 (lower direction in FIG. 11D), and an interlayer insulating film 6-2 (such as SiO2) formed on the SiN layer 5-2 (lower direction in FIG.

11D). In the interlayer insulating film 6-2 (such as SiO2), second wiring 20-2 is embedded, and the second wiring 20-2 is connected to the second electrode 21-2. The second electrode 21-2 includes a via.

A barrier metal layer 14-1 is formed between a group of the first electrode 21-1 and the first wiring 20-1, and a group of the first modification layer 1-1, the first low-permittivity layer 4-1, the SiN layer 5-1, and the interlayer insulating film 6-1 (such as $SiO_2$). In addition, a barrier metal layer 14-2 is formed between a group of the second electrode 21-2 and the second wiring 20-2, and a group of the second modification layer 1-2, the second low-permittivity layer 4-2, the SiN layer 5-2, and the interlayer insulating film 6-2 (such as $SiO_2$). The barrier metal layers 14-1 and 14-2 include Ta, Ti, Ru, TaN, TiN, or the like, for example.

A joint part P is formed by bonding the first joint surface P1 and the second joint surface P2 of the solid-state imaging device 100-10, and the first substrate and the second substrate form a laminate structure and are electrically connected.

In addition to the above description, the above descriptions regarding the solid-state imaging devices according to the first to fifth embodiments of the present technology and the following description regarding a solid-state imaging device according to a seventh embodiment of the present technology are applicable to the solid-state imaging device according to the sixth embodiment of the present technology, as long as no technical contradiction occurs.

8. Seventh Embodiment (Seventh Example of Solid-State Imaging Device and Method of Producing Solid-State Imaging Device of Seventh Example)

A solid-state imaging device according to a seventh embodiment of the present technology (seventh example of solid-state imaging device) is a solid-state imaging device including: a first substrate including at least a first electrode, a first modification layer, a first low-permittivity layer formed on the first modification layer, and a first joint surface where the first electrode and the first modification layer are exposed; and a second substrate including at least a second electrode, a second modification layer, a second low-permittivity layer formed on the second modification layer, and a second joint surface where the second electrode and the second modification layer are exposed. The first substrate and the second substrate form a laminate structure and are electrically connected by bonding the first joint surface and the second joint surface. In the solid-state imaging device according to the seventh embodiment of the present technology (seventh example of solid-state imaging device), the first joint surface and the second joint surface are bonded via the first electrode and the second electrode, and are bonded via the first modification layer and the second electrode. Alternatively, the first joint surface and the second joint surface are bonded via the first electrode and the second electrode, and are bonded via the first electrode and the second modification layer. Alternatively, the first joint surface and the second joint surface are bonded via the first electrode and the second electrode, are bonded via the first modification layer and the second electrode, and are bonded via the first electrode and the modification layer. The solid-state imaging device according to the seventh embodiment of the present technology (seventh example of solid-state imaging device) is a solid-state imaging device produced through the dual damascene method.

In the solid-state imaging device according to the seventh embodiment of the present technology (seventh example of solid-state imaging device), the first modification layer has higher hydrophilicity than the first low-permittivity layer, and the second modification layer has higher hydrophilicity than the second low-permittivity layer.

With regard to the solid-state imaging device according to the seventh embodiment of the present technology (seventh example of solid-state imaging device), the first low-permittivity layer and the second low-permittivity layer (low-k films) are used as passivation films around the first electrode and the second electrode, and a modification layer having higher hydrophilicity is formed on a joint surface (front surface) of the first substrate and a joint surface (front surface) of the second substrate. This makes it possible to reduce capacity between adjacent electrodes (for example, capacity between the first electrodes and capacity between the second electrodes), and to bond the first substrate and the second substrate with high joint strength. In addition, when using the solid-state imaging device according to the seventh embodiment of the present technology (seventh example of solid-state imaging device), it is possible to reduce capacity between adjacent electrodes (for example, capacity between the first electrodes and capacity between the second electrodes) while maintaining high joint strength between the first substrate and the second substrate.

The seventh example of the solid-state imaging device according to the seventh embodiment of the present technology and a method of producing the solid-state imaging device of the seventh example will be described with reference to FIGS. 12 A, 12B, 12C, 13A, and 13B. FIGS. 12A, 12B, 12C, 13A, and 13B are cross-sectional views for describing a first example of the method of producing the seventh example of the solid-state imaging device according to the seventh embodiment of the present technology (solid-state imaging device 100-12).

A method of producing the solid-state imaging device 100-12 will be described with reference to FIGS. 12A, 12B, 12C, 13A, and 13B.

As illustrated in FIG. 12A, the wiring 10-2 is formed in the second substrate to be bonded to the first substrate, and then a process of forming an insulating film is performed more than once (second low-permittivity layer 2-2, SiN layer 3-2, second low-permittivity layer 4-2, SiN layer 5-2, and interlayer insulating film 6-2 (such as SiO2). Next, a trench (serving as a trench 12-2 after being subjected to a metal plating process, which will be described later) and a via (serving as a via 11-2 after being subjected to the metal plating process, which will be described later) are formed for use in the dual damascene method, a barrier layer 14-2 and a seed layer (not illustrated) is formed through sputtering, and then the metal plating process is performed by using Cu, Au, or the like. After the plating process, the electrode 13-2 (including via 11-2 and trench 12-2) are formed by performing Cu (Au) CMP on the second substrate until the insulating film (second low-permittivity layer 2-2) is exposed on a front surface. Note that it is also possible to form the electrode 13-1 (including via 11-1 and trench 12-1) in the first substrate in a way similar to the above.

As illustrated in FIG. 12B, for example, the modification layer 1-2 is formed on an uppermost surface of the second low-permittivity layer 2-2 (low-k film) made of SiOC or the like, by radiating O2 plasma R to the second low-permittivity layer 2-2. In the modification layer 1-2, an amount of carbon (C) decreases (gradually) toward the upper surface of the film (upper direction in FIG. 12B). Therefore, the uppermost surface of the modification layer 1-2 has a film quality that is similar to SiO2. Next, for example, as illustrated in FIG. 12C, surface activation is performed on the surface of the modification layer 1-2 by radiating N2 plasma S, the surface is washed with purified water, and the surface become hydrophilic.

Figure 13A:
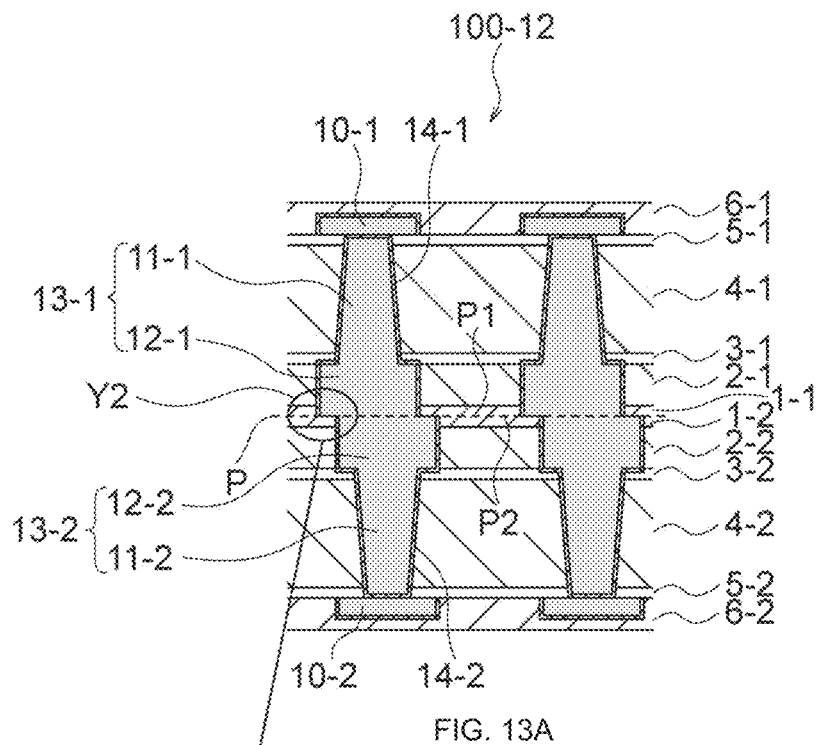
FIGS. 13A and 13B are cross-sectional views for describing the method of producing the solid-state imaging device according to the seventh embodiment of the present technology.

Finally, as illustrated in FIG. 13A, the modification layer 1-1 of the first substrate and 1-2 of the second substrate are bonded in such a manner that they face each other. When bonding the modification layers, misalignment of the first substrate and the second substrate occurs. Next, the joint strength between the first substrate and the second substrate increases through heating, and thereby the solid-state imaging device 100-12 is produced.

Figure 13B:
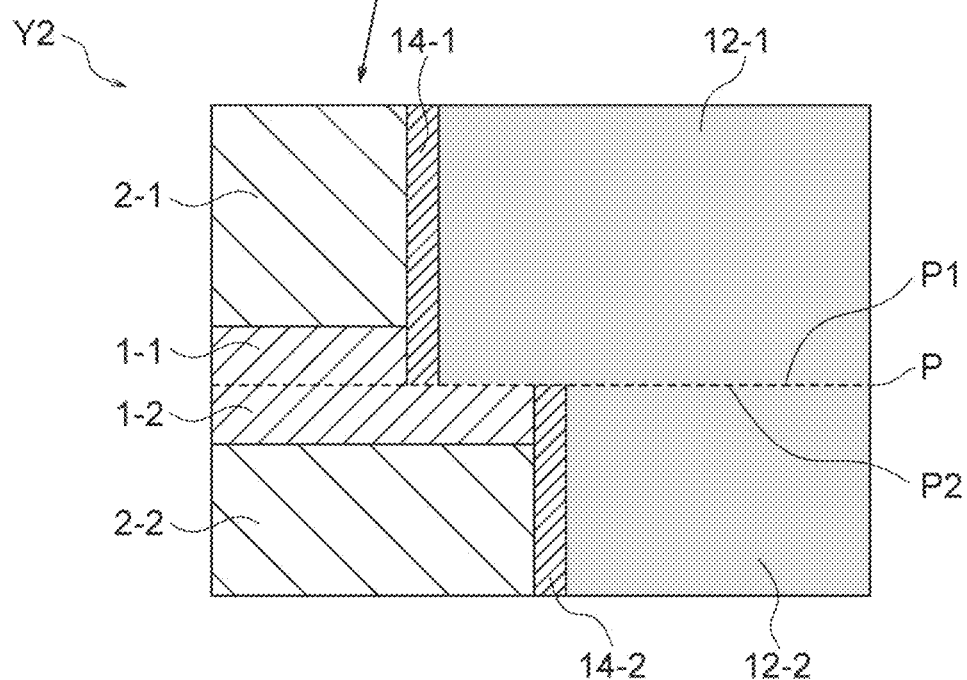

As illustrated in FIGS. 13A and 13B, a first substrate of the solid-state imaging device 100-12 includes a first electrode 13-1, a first modification layer 1-1, a first low-permittivity layer 2-1 formed on the first modification layer 1-1 (upper direction in FIG. 2A), and a first joint surface P1 where the first electrode 13-1 and the first modification layer 1-1 are exposed. In addition, the first substrate of the solid-state imaging device 100-12 includes an SiN layer 3-1 formed on the first low-permittivity layer 2-1 (upper direction in FIG. 13A), a first low-permittivity layer 4-1 formed on the SiN layer 3-1 (upper direction in FIG. 13A), an SiN layer 5-1 formed on the first low-permittivity layer 4-1 (upper direction in FIG. 13A), and an interlayer insulating film 6-1 (such as SiO2) formed on the SiN layer 5-1 (upper direction in FIG. 13A). In the interlayer insulating film 6-1 (such as SiO2), first wiring 10-1 is embedded, and the first wiring 10-1 is connected to the first electrode 13-1. The first electrode 13-1 includes a via 11-1 and a trench 12-1.

A second substrate of the solid-state imaging device 100-12 includes a second electrode 13-2, a second modification layer 1-2, a second low-permittivity layer 2-2 formed on the second modification layer 1-2 (lower direction in FIG. 13A), and a second joint surface P2 where the second electrode 13-2 and the second modification layer 1-2 are exposed. In addition, the second substrate of the solid-state imaging device 100-12 includes an SiN layer 3-2 formed on the second low-permittivity layer 2-2 (lower direction in FIG. 13A), a second low-permittivity layer 4-2 formed on the SiN layer 3-2 (lower direction in FIG. 2A), an SiN layer 5-2 formed on the second low-permittivity layer 4-2 (lower direction in FIG. 13A), and an interlayer insulating film 6-2 (such as SiO2) formed on the SiN layer 5-2 (lower direction in FIG. 13A). In the interlayer insulating film 6-2 (such as SiO2), second wiring 10-2 is embedded, and the second wiring 10-2 is connected to the second electrode 13-2. The second electrode 13-2 includes a via 11-2 and a trench 12-2.

A barrier metal layer 14-1 is formed between the first electrode 13-1, the first wiring 10-1, and a group of the first modification layer 1-1, the first low-permittivity layer 2-1, the SiN layer 3-1, the first low-permittivity layer 4-1, the SiN layer 5-1, and the interlayer insulating film 6-1 (such as $SiO_2$). In addition, a barrier metal layer 14-2 is formed between the second electrode 13-2, the second wiring 10-2, and a group of the second modification layer 1-2, the second low-permittivity layer 2-2, the SiN layer 3-2, the second low-permittivity layer 4-2, the SiN layer 5-2, and the interlayer insulating film 6-2 (such as $SiO_2$). The barrier metal layers 14-1 and 14-2 include Ta, Ti, Ru, TaN, TiN, or the like, for example.

A joint part P is formed by bonding the first joint surface P1 and the second joint surface P2 of the solid-state imaging device 100-12, and the first substrate and the second substrate form a laminate structure and are electrically connected.

As illustrated in FIG. 13B, misalignment of the first substrate and the second substrate occurs in the solid-state imaging device 100-12. The barrier metal layer 14-1 of the first substrate is joined to the second modification layer 1-2 of the second substrate. The first electrode 13-1 (trench 12-1) of the first substrate is joined to the second modification layer of the second substrate and the barrier metal layer 14-2 of the second substrate. Note that, if the misalignment of the first substrate and the second substrate does not occur in the solid-state imaging device 100-12, the first modification layer 1-1 of the first substrate is joined to the second modification layer 1-2 of the first substrate, the barrier metal layer 14-1 of the first substrate is joined to the barrier metal layer 14-2 of the second substrate, and the first electrode 13-1 (trench 12-1) of the first substrate is joined to the second electrode 13-2 (trench 12-2) of the second substrate.

In addition to the above description, the above-described descriptions regarding solid-state imaging devices according to the first to sixth embodiments of the present technology is applicable to the solid-state imaging device according to the seventh embodiment of the present technology, as long as no technical contradiction occurs.

9. Eighth Embodiment (Example of Electronic Apparatus)

An electronic apparatus according to an eighth embodiment of the present technology is an electronic apparatus provided with one of the solid-state imaging devices according to the first to seventh embodiments of the present technology. Next, details of the electronic apparatus according to the eighth embodiment of the present technology will be described.

Figure 21:
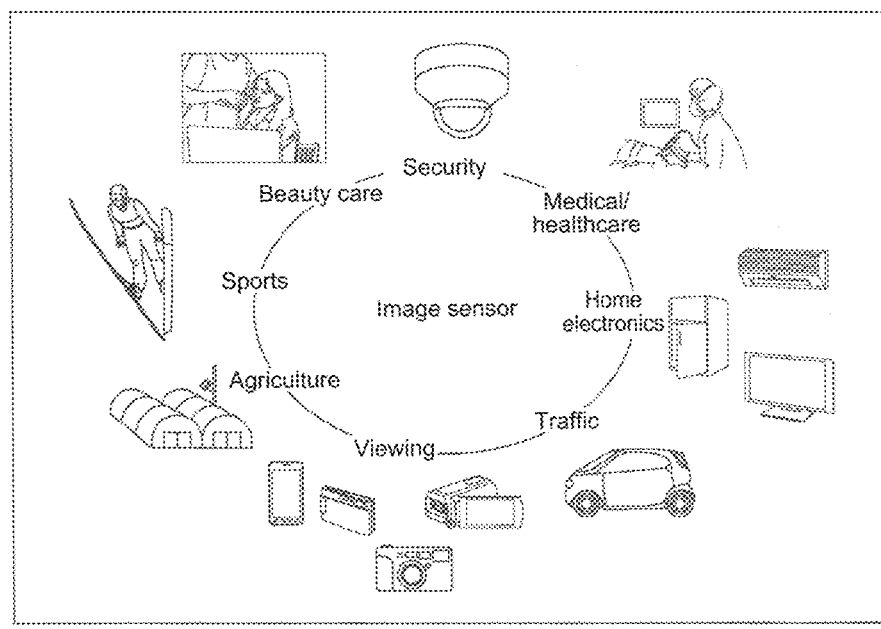
FIG. 21 is a diagram illustrating an example of how to use the solid-state imaging devices according to the first to seventh embodiments of the present technology.

10. Example of How to Use Solid-State Imaging Device According to Present Technology FIG. 21 is a diagram illustrating an example of how to use, as image sensors, the solid-state imaging devices according to the first to seventh embodiments of the present technology.

For example, the solid-state imaging devices of the first to seventh embodiments described above can be used in various cases of sensing light such as visible light, infrared light, ultraviolet light, and X-rays, as indicated below. In other words, as illustrated in FIG. 21, one of the solid-state imaging devices of the first to seventh embodiments can be used for an apparatus (for example, the electronic apparatus of the eighth embodiment described above) that is used in, for example, a field of viewing in which an image for viewing is captured, a field of traffic, a field of home electronics, a medical/healthcare field, a field of security, a field of beauty care, a field of sports, or a field of agriculture.

Specifically, in the field of viewing, one of the solid-state imaging devices of the first to seventh embodiments can be used for an apparatus that is used to capture an image for viewing. Examples of the apparatus used to capture an image for viewing include a digital camera, a smartphone, and a cellular phone with a camera function.

In the field of traffic, one of the solid-state imaging devices of the first to seventh embodiments can be used for an apparatus used for traffic, in order to, for example, drive safely by automatic stopping or the like, and recognize a state of a driver. Examples of the apparatus used for traffic include an in-vehicle sensor that captures, for example, images of regions ahead of and behind an automobile, an image of the surroundings of the automobile, and an image of the inside of the automobile; a monitoring camera that monitors a travelling vehicle and a road; and a ranging sensor that measures a distance between vehicles.

In the field of home electronics, one of the solid-state imaging devices of the first to seventh embodiments can be used for an apparatus used for home electronics such as a television set, a refrigerator, and an air-conditioner, in order to, for example, capture an image of a gesture of a user, and perform an apparatus operation according to the gesture.

In the medical/healthcare field, one of the solid-state imaging devices of the first to seventh embodiments can be used for an apparatus for medical/healthcare use, such as an endoscope, and an apparatus that performs angiography using reception of infrared light.

In the field of security, one of the solid-state imaging devices of the first to seventh embodiments can be used for an apparatus used for security, such as a surveillance camera and a personal authentication camera.

In the field of beauty care, one of the solid-state imaging devices of the first to seventh embodiments can be used for an apparatus used for beauty care, such as a skin measuring apparatus that captures an image of a skin, and a microscope that captures an image of a scalp.

In the field of sports, one of the solid-state imaging devices of the first to seventh embodiments can be used for an apparatus used for sports, such as an action camera and a wearable camera that are used for sports or the like.

In the field of agriculture, one of the solid-state imaging devices of the first to seventh embodiments can be used for an apparatus used for agriculture, such as a camera used to monitor a state of a farm and a crop.

One of the solid-state imaging devices according to the first to seventh embodiments is applicable to various electronic apparatuses including imaging devices such as digital still cameras and digital video cameras, cellular phones having imaging functions, and other devices having imaging functions, for example.

Figure 22:
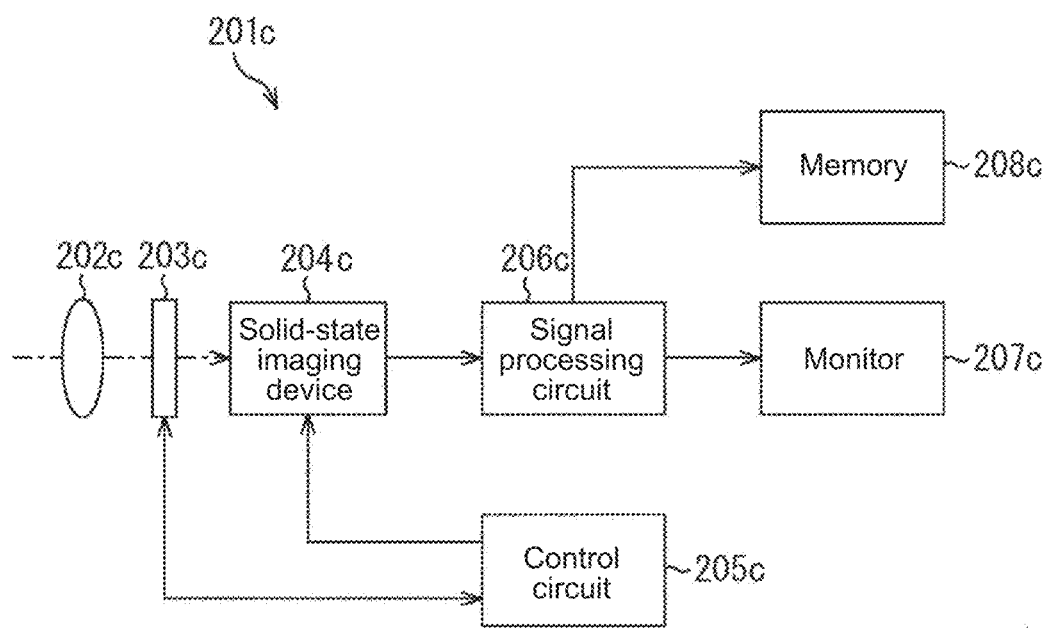
FIG. 22 is a diagram for describing a configuration of an imaging device or electronic apparatus that uses the solid-state imaging device according to the present technology.

FIG. 22 is a block diagram illustrating a configuration example of an imaging device serving as the electronic apparatus according to the present technology.

An imaging device 201c illustrated in FIG. 22 includes an optical system 202c, a shutter 203c, a solid-state imaging device 204c, a control circuit 205c, a signal processing circuit 206c, a monitor 207c, and a memory 208c, and is capable of taking still images and video.

The optical system 202c includes one or more lenses, and is configure to guide light (incident light) from an object to the solid-state imaging device 204c, and focus the light onto a light receiving surface of the solid-state imaging device 204c.

The shutter 203c is disposed between the optical system 202c and the solid-state imaging device 204c, and controls the light radiation period and the light blocking period of light to the solid-state imaging device 204c under the control of the control circuit 205c.

The solid-state imaging device 204c accumulates signal charge for a certain period according to light focused on the light receiving surface via the optical system 202c and the shutter 203c. The signal charge accumulated in the solid-state imaging device 204c is transferred according to a drive signal (timing signal) supplied from the control circuit 205c.

The control circuit 205c outputs drive signals for controlling the transfer operation of the solid-state imaging device 204c and the shutting operation of the shutter 203c to drive the solid-state imaging device 204c and the shutter 203c.

The signal processing circuit 206c performs various signal processes on the signal charge output from the solid-state imaging device 204c. An image (image data) obtained through the signal process performed by the signal processing circuit 206c is supplied to the monitor 207c for display or supplied to the memory 208c for storage (recording).

11. Example of Application of Solid-State Imaging Device According to Present Technology Next, examples of application of the above-described solid-state imaging device (image sensor) according to the first to seventh embodiment (first and second application examples) will be described. The solid-state imaging devices according to the above-described embodiments are applicable to electronic apparatuses in various kinds of fields. Next, for example, an endoscopic surgical system (first application example) and mobile object (second application example) will be described. Note that the imaging device described in the chapter <10. Example of Usage of Solid-State Imaging Device according to Present Technology> is one of the above-described solid-state imaging devices (image sensors) according to the first to seventh embodiments of the present technology.

Application Example 1

[Example of Application to Endoscopic Surgery System]

The present technology can be applied to various products. For example, the technology according to the present disclosure (present technology) may be applied to an endoscopic surgery system.

Figure 23:
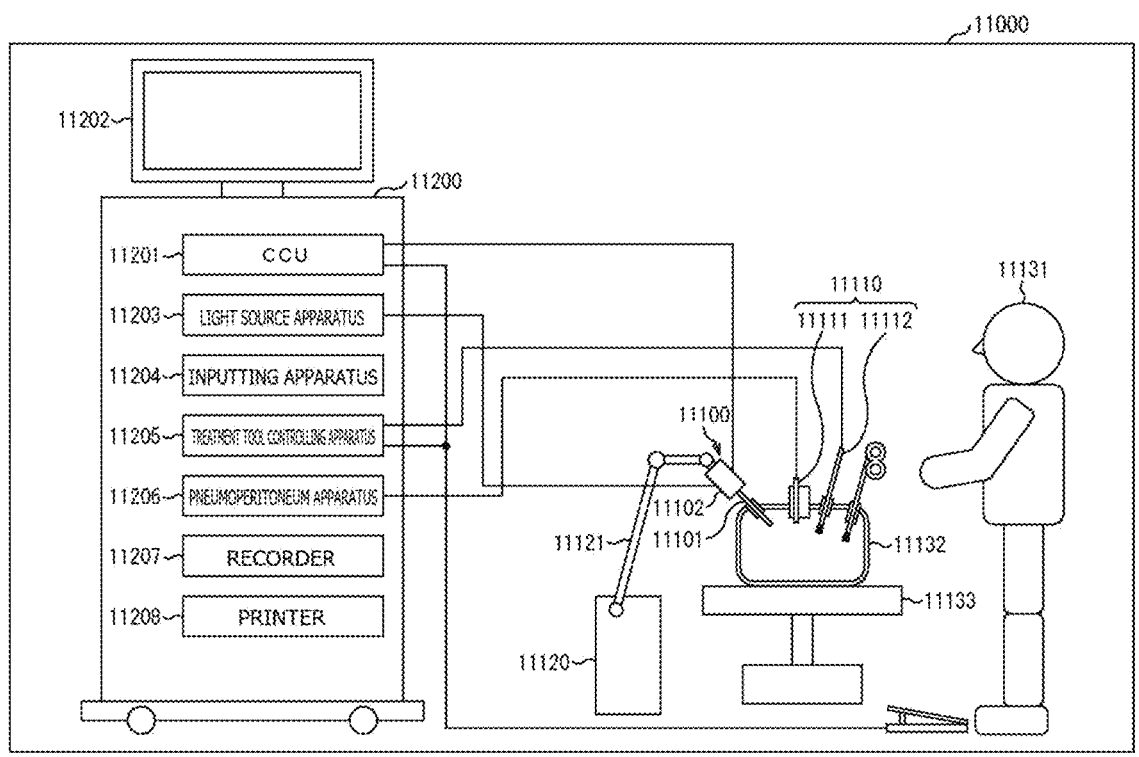
FIG. 23 is a view depicting an example of a schematic configuration of a first application example (an endoscopic surgery system).

FIG. 23 is a view depicting an example of a schematic configuration of an endoscopic surgery system to which the technology according to an embodiment of the present disclosure (present technology) can be applied.

In FIG. 23, a state is illustrated in which a surgeon (medical doctor) 11131 is using an endoscopic surgery system 11000 to perform surgery for a patient 11132 on a patient bed 11133. As depicted, the endoscopic surgery system 11000 includes an endoscope 11100, other surgical tools 11110 such as a pneumoperitoneum tube 11111 and an energy device 11112, a supporting arm apparatus 11120 which supports the endoscope 11100 thereon, and a cart 11200 on which various apparatus for endoscopic surgery are mounted.

The endoscope 11100 includes a lens barrel 11101 having a region of a predetermined length from a distal end thereof to be inserted into a body cavity of the patient 11132, and a camera head 11102 connected to a proximal end of the lens barrel 11101. In the example depicted, the endoscope 11100 is depicted which includes as a rigid endoscope having the lens barrel 11101 of the hard type. However, the endoscope 11100 may otherwise be included as a flexible endoscope having the lens barrel 11101 of the flexible type.

The lens barrel 11101 has, at a distal end thereof, an opening in which an objective lens is fitted. A light source apparatus 11203 is connected to the endoscope 11100 such that light generated by the light source apparatus 11203 is introduced to a distal end of the lens barrel 11101 by a light guide extending in the inside of the lens barrel 11101 and is irradiated toward an observation target in a body cavity of the patient 11132 through the objective lens. It is to be noted that the endoscope 11100 may be a forward-viewing endoscope or may be an oblique-viewing endoscope or a side-viewing endoscope.

An optical system and an image pickup element are provided in the inside of the camera head 11102 such that reflected light (observation light) from the observation target is condensed on the image pickup element by the optical system. The observation light is photo-electrically converted by the image pickup element to generate an electric signal corresponding to the observation light, namely, an image signal corresponding to an observation image. The image signal is transmitted as RAW data to a CCU 11201.

The CCU 11201 includes a central processing unit (CPU), a graphics processing unit (GPU) or the like and integrally controls operation of the endoscope 11100 and a display apparatus 11202. Further, the CCU 11201 receives an image signal from the camera head 11102 and performs, for the image signal, various image processes for displaying an image based on the image signal such as, for example, a development process (demosaic process).

The display apparatus 11202 displays thereon an image based on an image signal, for which the image processes have been performed by the CCU 11201, under the control of the CCU 11201.

The light source apparatus 11203 includes a light source such as, for example, a light emitting diode (LED) and supplies irradiation light upon imaging of a surgical region to the endoscope 11100.

An inputting apparatus 11204 is an input interface for the endoscopic surgery system 11000. A user can perform inputting of various kinds of information or instruction inputting to the endoscopic surgery system 11000 through the inputting apparatus 11204. For example, the user would input an instruction or a like to change an image pickup condition (type of irradiation light, magnification, focal distance or the like) by the endoscope 11100.

A treatment tool controlling apparatus 11205 controls driving of the energy device 11112 for cautery or incision of a tissue, sealing of a blood vessel or the like. A pneumoperitoneum apparatus 11206 feeds gas into a body cavity of the patient 11132 through the pneumoperitoneum tube 11111 to inflate the body cavity in order to secure the field of view of the endoscope 11100 and secure the working space for the surgeon. A recorder 11207 is an apparatus capable of recording various kinds of information relating to surgery. A printer 11208 is an apparatus capable of printing various kinds of information relating to surgery in various forms such as a text, an image or a graph.

It is to be noted that the light source apparatus 11203 which supplies irradiation light when a surgical region is to be imaged to the endoscope 11100 may include a white light source which includes, for example, an LED, a laser light source or a combination of them. Where a white light source includes a combination of red, green, and blue (RGB) laser light sources, since the output intensity and the output timing can be controlled with a high degree of accuracy for each color (each wavelength), adjustment of the white balance of a picked up image can be performed by the light source apparatus 11203. Further, in this case, if laser beams from the respective RGB laser light sources are irradiated time-divisionally on an observation target and driving of the image pickup elements of the camera head 11102 are controlled in synchronism with the irradiation timings. Then images individually corresponding to the R, G and B colors can be also picked up time-divisionally. According to this method, a color image can be obtained even if color filters are not provided for the image pickup element.

Further, the light source apparatus 11203 may be controlled such that the intensity of light to be outputted is changed for each predetermined time. By controlling driving of the image pickup element of the camera head 11102 in synchronism with the timing of the change of the intensity of light to acquire images time-divisionally and synthesizing the images, an image of a high dynamic range free from underexposed blocked up shadows and overexposed highlights can be created.

Further, the light source apparatus 11203 may be configured to supply light of a predetermined wavelength band ready for special light observation. In special light observation, for example, by utilizing the wavelength dependency of absorption of light in a body tissue to irradiate light of a narrow band in comparison with irradiation light upon ordinary observation (namely, white light), narrow band observation (narrow band imaging) of imaging a predetermined tissue such as a blood vessel of a superficial portion of the mucous membrane or the like in a high contrast is performed. Alternatively, in special light observation, fluorescent observation for obtaining an image from fluorescent light generated by irradiation of excitation light may be performed. In fluorescent observation, it is possible to perform observation of fluorescent light from a body tissue by irradiating excitation light on the body tissue (autofluorescence observation) or to obtain a fluorescent light image by locally injecting a reagent such as indocyanine green (ICG) into a body tissue and irradiating excitation light corresponding to a fluorescent light wavelength of the reagent upon the body tissue. The light source apparatus 11203 can be configured to supply such narrow-band light and/or excitation light suitable for special light observation as described above.

Figure 24:
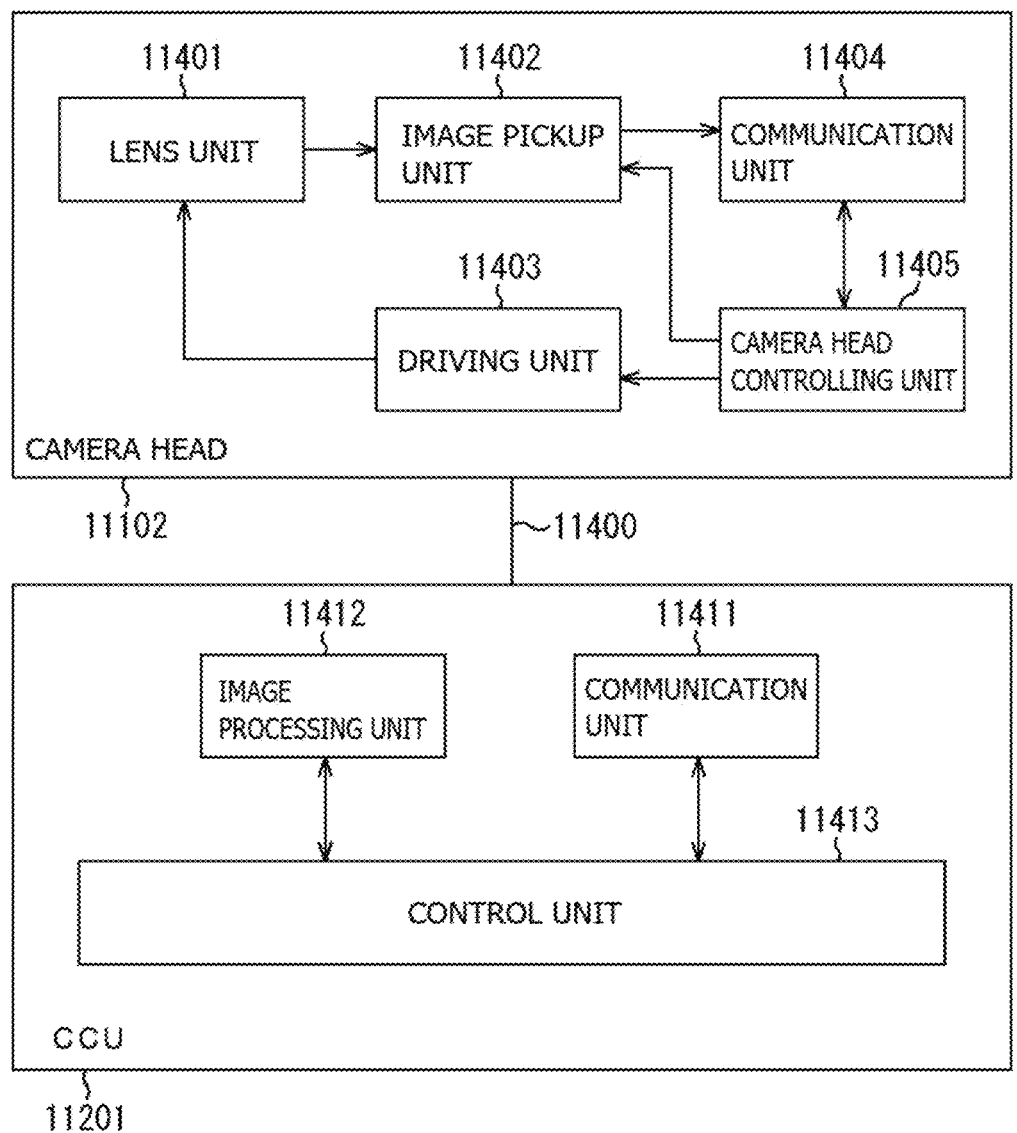
FIG. 24 is a block diagram depicting an example of a functional configuration of a camera head and a camera control unit (CCU).

FIG. 24 is a block diagram depicting an example of a functional configuration of the camera head 11102 and the CCU 11201 depicted in FIG. 23.

The camera head 11102 includes a lens unit 11401, an image pickup unit 11402, a driving unit 11403, a communication unit 11404 and a camera head controlling unit 11405. The CCU 11201 includes a communication unit 11411, an image processing unit 11412 and a control unit 11413. The camera head 11102 and the CCU 11201 are connected for communication to each other by a transmission cable 11400.

The lens unit 11401 is an optical system, provided at a connecting location to the lens barrel 11101. Observation light taken in from a distal end of the lens barrel 11101 is guided to the camera head 11102 and introduced into the lens unit 11401. The lens unit 11401 includes a combination of a plurality of lenses including a zoom lens and a focusing lens.

The image pickup unit 11402 includes an image pickup device (the image pickup element). The number of image pickup elements which is included by the image pickup unit 11402 may be one (single-plate type) or a plural number (multi-plate type). Where the image pickup unit 11402 is configured as that of the multi-plate type, for example, image signals corresponding to respective R, G and B are generated by the image pickup elements, and the image signals may be synthesized to obtain a color image. The image pickup unit 11402 may also be configured so as to have a pair of image pickup elements for acquiring respective image signals for the right eye and the left eye ready for three dimensional (3D) display. If 3D display is performed, then the depth of a living body tissue in a surgical region can be comprehended more accurately by the surgeon 11131. It is to be noted that, where the image pickup unit 11402 is configured as that of stereoscopic type, a plurality of systems of lens units 11401 are provided corresponding to the individual image pickup elements.

Further, the image pickup unit 11402 may not necessarily be provided on the camera head 11102. For example, the image pickup unit 11402 may be provided immediately behind the objective lens in the inside of the lens barrel 11101.

The driving unit 11403 includes an actuator and moves the zoom lens and the focusing lens of the lens unit 11401 by a predetermined distance along an optical axis under the control of the camera head controlling unit 11405. Consequently, the magnification and the focal point of a picked up image by the image pickup unit 11402 can be adjusted suitably.

The communication unit 11404 includes a communication apparatus for transmitting and receiving various kinds of information to and from the CCU 11201. The communication unit 11404 transmits an image signal acquired from the image pickup unit 11402 as RAW data to the CCU 11201 through the transmission cable 11400.

In addition, the communication unit 11404 receives a control signal for controlling driving of the camera head 11102 from the CCU 11201 and supplies the control signal to the camera head controlling unit 11405. The control signal includes information relating to image pickup conditions such as, for example, information that a frame rate of a picked up image is designated, information that an exposure value upon image picking up is designated and/or information that a magnification and a focal point of a picked up image are designated.

It is to be noted that the image pickup conditions such as the frame rate, exposure value, magnification or focal point may be designated by the user or may be set automatically by the control unit 11413 of the CCU 11201 on the basis of an acquired image signal. In the latter case, an auto exposure (AE) function, an auto focus (AF) function and an auto white balance (AWB) function are incorporated in the endoscope 11100.

The camera head controlling unit 11405 controls driving of the camera head 11102 on the basis of a control signal from the CCU 11201 received through the communication unit 11404.

The communication unit 11411 includes a communication apparatus for transmitting and receiving various kinds of information to and from the camera head 11102. The communication unit 11411 receives an image signal transmitted thereto from the camera head 11102 through the transmission cable 11400.

Further, the communication unit 11411 transmits a control signal for controlling driving of the camera head 11102 to the camera head 11102. The image signal and the control signal can be transmitted by electrical communication, optical communication or the like.

The image processing unit 11412 performs various image processes for an image signal in the form of RAW data transmitted thereto from the camera head 11102.

The control unit 11413 performs various kinds of control relating to image picking up of a surgical region or the like by the endoscope 11100 and display of a picked up image obtained by image picking up of the surgical region or the like. For example, the control unit 11413 creates a control signal for controlling driving of the camera head 11102.

Further, the control unit 11413 controls, on the basis of an image signal for which image processes have been performed by the image processing unit 11412, the display apparatus 11202 to display a picked up image in which the surgical region or the like is imaged. Thereupon, the control unit 11413 may recognize various objects in the picked up image using various image recognition technologies. For example, the control unit 11413 can recognize a surgical tool such as forceps, a particular living body region, bleeding, mist when the energy device 11112 is used and so forth by detecting the shape, color and so forth of edges of objects included in a picked up image. The control unit 11413 may cause, when it controls the display apparatus 11202 to display a picked up image, various kinds of surgery supporting information to be displayed in an overlapping manner with an image of the surgical region using a result of the recognition. Where surgery supporting information is displayed in an overlapping manner and presented to the surgeon 11131, the burden on the surgeon 11131 can be reduced and the surgeon 11131 can proceed with the surgery with certainty.

The transmission cable 11400 which connects the camera head 11102 and the CCU 11201 to each other is an electric signal cable ready for communication of an electric signal, an optical fiber ready for optical communication or a composite cable ready for both of electrical and optical communications.

Here, while, in the example depicted, communication is performed by wired communication using the transmission cable 11400, the communication between the camera head 11102 and the CCU 11201 may be performed by wireless communication.

The example of the endoscopic surgery system to which the technology according to the present disclosure may be applied has been described above. The technology according to the present disclosure may be applied to the endoscope 11100, (the image pickup unit 11402 of) the camera head 11102, etc. among the above-described structural elements. Specifically, the solid-state imaging device according to the present technology is applicable to the image pickup unit 10402. Application of the technology according to the present disclosure to (the image pickup unit 11402 of) the camera head 11102 makes it possible to improve performance, quality, and reliability of (the image pickup unit 11402 of) the camera head 11102.

It is to be noted that the endoscopic surgery system has been described here as an example, but the technology according to the present disclosure may be additionally applied to, for example, a microscopic surgery system or the like.

Application Example 2

[Example of Application to Mobile Body]

The technology according to the present disclosure (present technology) can be applied to various products. For example, the technology according to the present disclosure may be provided as an apparatus that is included in one of the types of mobile bodies such as vehicle, electric vehicle, hybrid electric vehicle, motorcycle, bicycle, personal mobility, airplane, drone, ship, and robot.

Figure 25:
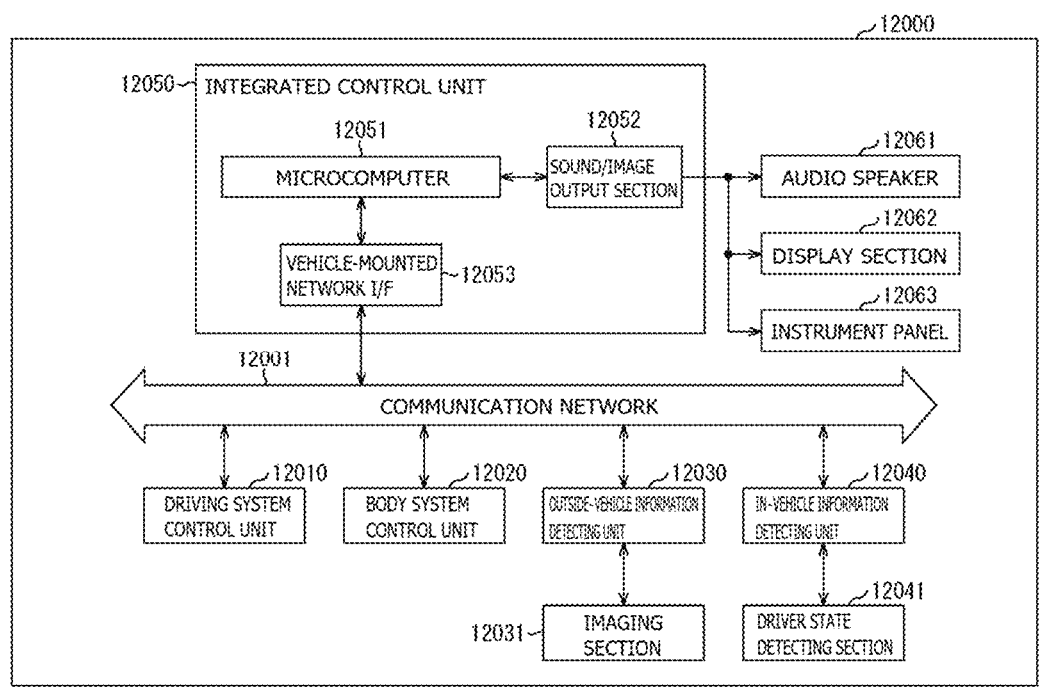
FIG. 25 is a block diagram depicting an example of schematic configuration of a vehicle control system of a second application example (a mobile body).

FIG. 25 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 25, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel autonomously without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 66, an audio speaker 12061, a display section 12062, and an instrument panel 12063 are illustrated as the output device. The display section 12062 may, for example, include at least one of an on-board display and a head-up display.

Figure 26:
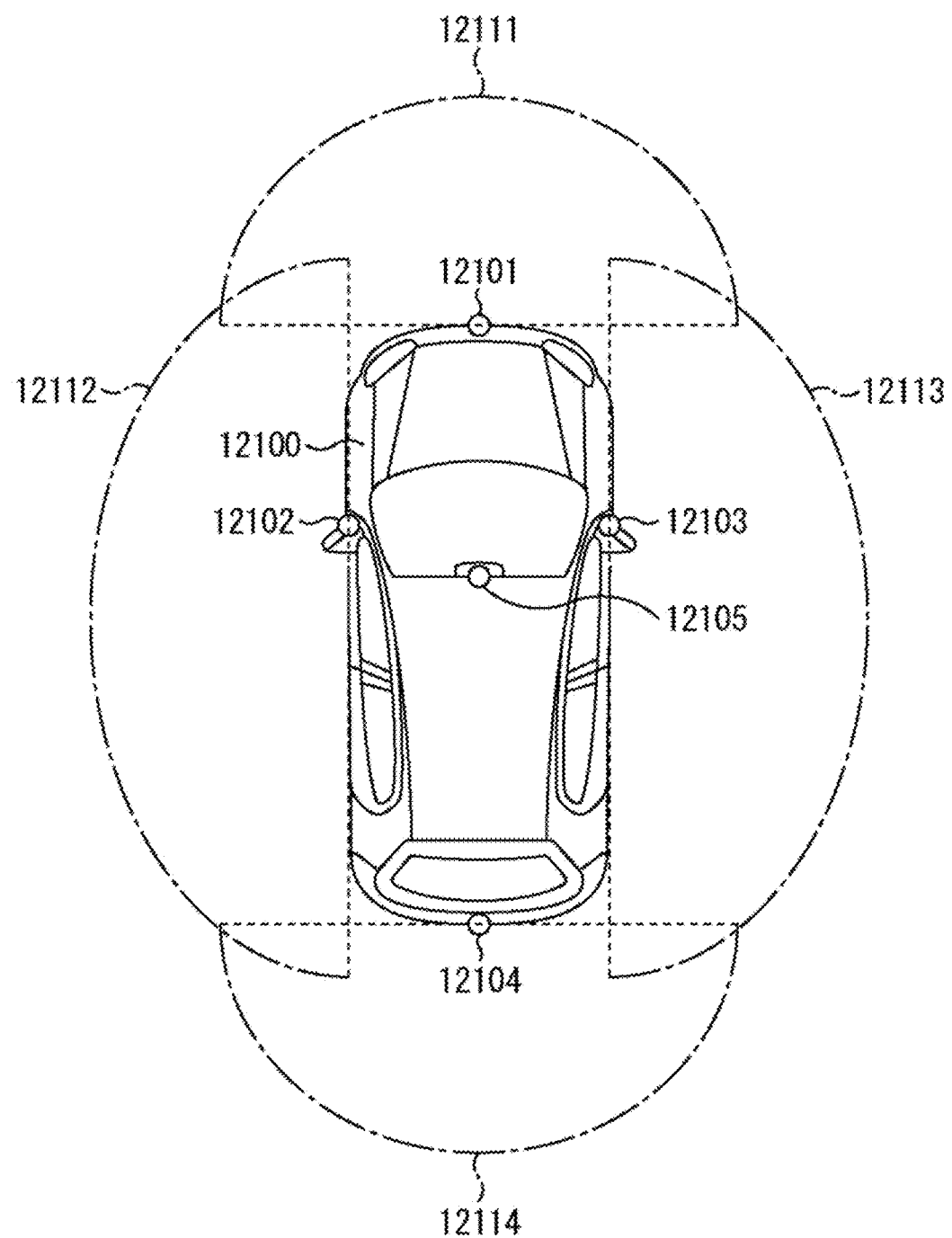
FIG. 26 is a diagram of assistance in explaining an example of installation positions of an outside-vehicle information detecting section and an imaging section.

FIG. 26 is a diagram depicting an example of the installation position of the imaging section 12031.

In FIG. 26, the vehicle 12100 includes imaging sections 12101, 12102, 12103, 12104, and 12105 as the imaging section 12031.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The images of the front that are obtained by the imaging sections 12101 and 12105 are used mainly to detect a preceding vehicle, a pedestrian, an obstacle, a signal, a traffic sign, a lane, or the like.

Incidentally, FIG. 26 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

The example of the vehicle control system to which the technology according to the present disclosure (present technology) may be applied has been described above. The technology according to the present disclosure may be applied to the imaging section 12031 or the like among the above-described structural elements. Specifically, the solid-state imaging device according to the present technology is applicable to the imaging section 12031. Application of the technology according to the present disclosure to the imaging section 12031 makes it possible to improve performance, quality, and reliability of the imaging section 12031.

Note that the present technology is not limited to the above-described embodiments, usage examples, or the application examples. Various modifications are possible without departing from the gist of the present technology.

In addition, the effects described in the present specification are merely illustrative, and the present technology is not limited thereto. There may be other effects.

Additionally, the present technology may also be configured as below.

[1] A solid-state imaging device including:
  a first substrate including at least
    a first electrode,
    a first modification layer,
    a first low-permittivity layer formed on the first modification layer, and
    a first joint surface where the first electrode and the first modification layer are exposed; and
  a second substrate including at least
    a second electrode,
    a second modification layer,
    a second low-permittivity layer formed on the second modification layer, and
    a second joint surface where the second electrode and the second modification layer are exposed, in which the
    first modification layer has higher hydrophilicity than the first low-permittivity layer,
    the second modification layer has higher hydrophilicity than the second low-permittivity layer, and
    the first substrate and the second substrate form a laminate structure and are electrically connected by bonding the first joint surface and the second joint surface.

[2] The solid-state imaging device according to [1], in which
  the first low-permittivity layer includes SiOC,
  the first modification layer includes Si atoms, O atoms, and C atoms, and
  concentration of the C atoms in the first modification layer decreases toward the first joint surface.

[3] The solid-state imaging device according to [1], in which
  the first low-permittivity layer includes SiOC,
  the first modification layer includes Si atoms, O atoms, and C atoms, and
  concentration of the O atoms in the first modification layer increases toward the first joint surface.

[4] The solid-state imaging device according to [1], in which
  the first low-permittivity layer includes SiOC,
  the first modification layer includes Si atoms, O atoms, and C atoms,
  concentration of the C atoms in the first modification layer decreases toward the first joint surface, and
  concentration of the O atoms in the first modification layer increases toward the first joint surface.

[5] The solid-state imaging device according to [1], in which
the second low-permittivity layer includes SiOC,
the second modification layer includes Si atoms, O atoms, and C atoms, and
concentration of the C atoms in the second modification layer decreases toward the second joint surface.

[6] The solid-state imaging device according to [1], in which
the second low-permittivity layer includes SiOC,
the second modification layer includes Si atoms, O atoms, and C atoms, and
concentration of the O atoms in the second modification layer increases toward the second joint surface.

[7] The solid-state imaging device according to [1], in which
the second low-permittivity layer includes SiOC,
the second modification layer includes Si atoms, O atoms, and C atoms,
concentration of the C atoms in the second modification layer decreases toward the second joint surface, and
concentration of the O atoms in the second modification layer increases toward the second joint surface.

[8] The solid-state imaging device according to [1], in which
the first low-permittivity layer includes SiOC,
the second low-permittivity layer includes SiOC,
the first modification layer includes Si atoms, O atoms, and C atoms,
the second modification layer includes Si atoms, O atoms, and C atoms,
concentration of the C atoms in the first modification layer decreases toward the first joint surface, and
concentration of the C atoms in the second modification layer decreases toward the second joint surface.

[9] The solid-state imaging device according to [1], in which
the first low-permittivity layer includes SiOC,
the second low-permittivity layer includes SiOC,
the first modification layer includes Si atoms, O atoms, and C atoms,
the second modification layer includes Si atoms, O atoms, and C atoms,
concentration of the O atoms in the first modification layer increases toward the first joint surface, and
concentration of the O atoms in the second modification layer increases toward the second joint surface.

[10] The solid-state imaging device according to [1], in which
the first low-permittivity layer includes SiOC,
the second low-permittivity layer includes SiOC,
the first modification layer includes Si atoms, O atoms, and C atoms,
the second modification layer includes Si atoms, O atoms, and C atoms,
concentration of the C atoms in the first modification layer decreases toward the first joint surface,
concentration of the O atoms in the first modification layer increases toward the first joint surface,
concentration of the C atoms in the second modification layer decreases toward the second joint surface, and
concentration of the O atoms in the second modification layer increases toward the second joint surface.

[11] The solid-state imaging device according to [1], in which the first low-permittivity layer includes SiOC,
the second low-permittivity layer includes SiOC,
the first modification layer includes Si atoms, O atoms, and C atoms,
the second modification layer includes Si atoms, O atoms, and C atoms,
concentration of the C atoms in the first modification layer decreases toward the first joint surface, and
concentration of the O atoms in the second modification layer increases toward the second joint surface.

[12] The solid-state imaging device according to [1], in which
the first low-permittivity layer includes SiOC,
the second low-permittivity layer includes SiOC,
the first modification layer includes Si atoms, O atoms, and C atoms,
the second modification layer includes Si atoms, O atoms, and C atoms,
concentration of the O atoms in the first modification layer increases toward the first joint surface, and
concentration of the C atoms in the second modification layer decreases toward the second joint surface.

[13] The solid-state imaging device according to [1], in which
the first low-permittivity layer includes SiOC,
the second low-permittivity layer includes SiOC,
the first modification layer includes Si atoms, O atoms, and C atoms,
the second modification layer includes Si atoms, O atoms, and C atoms,
concentration of the C atoms in the first modification layer decreases toward the first joint surface,
concentration of the O atoms in the first modification layer increases toward the first joint surface, and
concentration of the C atoms in the second modification layer decreases toward the second joint surface.

[14] The solid-state imaging device according to [1], in which
the first low-permittivity layer includes SiOC,
the second low-permittivity layer includes SiOC,
the first modification layer includes Si atoms, O atoms, and C atoms,
the second modification layer includes Si atoms, O atoms, and C atoms,
concentration of the C atoms in the first modification layer decreases toward the first joint surface,
concentration of the O atoms in the first modification layer increases toward the first joint surface, and
concentration of the O atoms in the second modification layer increases toward the second joint surface.

[15] The solid-state imaging device according to [1], in which
the first low-permittivity layer includes SiOC,
the second low-permittivity layer includes SiOC,
the first modification layer includes Si atoms, O atoms, and C atoms,
the second modification layer includes Si atoms, O atoms, and C atoms,
concentration of the C atoms in the first modification layer decreases toward the first joint surface,
concentration of the C atoms in the second modification layer decreases toward the second joint surface, and
concentration of the O atoms in the second modification layer increases toward the second joint surface.

[16] The solid-state imaging device according to [1], in which
the first low-permittivity layer includes SiOC,
the second low-permittivity layer includes SiOC,
the first modification layer includes Si atoms, O atoms, and C atoms,
the second modification layer includes Si atoms, O atoms, and C atoms,
concentration of the O atoms in the first modification layer increases toward the first joint surface,
concentration of the C atoms in the second modification layer decreases toward the second joint surface, and
concentration of the O atoms in the second modification layer increases toward the second joint surface.

[17] The solid-state imaging device according to any one of [1] to [16], in which
the first substrate and/or the second substrate further includes an insulating thin film, and
the insulating thin film is exposed on the first joint surface and/or the second joint surface.

[18] The solid-state imaging device according to any one of [1] to [17], in which
each of the first low-permittivity layer and the second low-permittivity layer includes at least one selected from a group consisting of SiOC, SiOF, SiOCH, SiCOH, hydrogen silsesquioxane, and methylsilsesquioxane.

[19] The solid-state imaging device according to any one of [1] to [18], in which
the first joint surface and the second joint surface are bonded via the first electrode and the second electrode.

[20] The solid-state imaging device according to any one of [1] to [19], in which
the first joint surface and the second joint surface are bonded via the first modification layer and the second electrode.

[21] The solid-state imaging device according to any one of [1] to [20], in which
the first joint surface and the second joint surface are bonded via the first electrode and the second modification layer.

[22] The solid-state imaging device according to any one of [1] to [21], in which
the first substrate includes a pixel area where a plurality of pixels including photoelectric converters is arrayed,
the second substrate includes a peripheral circuit section that includes at least a logic circuit and that is formed on a periphery of the pixel area, and
the first electrode of the first substrate is formed in an area outside of the pixel area and is electrically connected to the second electrode of the second substrate.

[23] The solid-state imaging device according to any one of [1] to [22], in which
the first electrode of the first substrate is formed in the pixel area and is electrically connected to the second electrode of the second substrate.

[24] The solid-state imaging device according to any one of [1] to [21], in which
the first substrate includes a pixel area where a plurality of pixels including photoelectric converters is arrayed,
the second substrate includes a peripheral circuit section that includes at least a logic circuit and that is formed on a periphery of the pixel area, and
the first electrode of the first substrate is formed in the pixel area and is electrically connected to the second electrode of the second substrate.

[25] A solid-state imaging device including:
a first substrate including at least
a first electrode,
an insulating layer, and
a first joint surface where the first electrode and the insulating layer are exposed; and
a second substrate including at least
a second electrode,
a modification layer,
a low-permittivity layer formed on the modification layer, and
a second joint surface where the second electrode and the modification layer are exposed, in which the modification layer has higher hydrophilicity than the low-permittivity layer, and
the first substrate and the second substrate form a laminate structure and are electrically connected by bonding the first joint surface and the second joint surface.

[26] The solid-state imaging device according to [25], in which
the low-permittivity layer includes SiOC,
the second modification layer includes Si atoms, O atoms, and C atoms, and
concentration of the C atoms in the second modification layer decreases toward the second joint surface.

[27] The solid-state imaging device according to [25], in which
the low-permittivity layer includes SiOC,
the second modification layer includes Si atoms, O atoms, and C atoms, and
concentration of the O atoms in the second modification layer increases toward the second joint surface.

[28] The solid-state imaging device according to [25], in which
the low-permittivity layer includes SiOC,
the second modification layer includes Si atoms, O atoms, and C atoms,
concentration of the C atoms in the second modification layer decreases toward the second joint surface, and
concentration of the O atoms in the second modification layer increases toward the second joint surface.

[29] The solid-state imaging device according to any one of [25] to [28], in which
the first substrate and/or the second substrate further includes an insulating thin film, and
the insulating thin film is exposed on the first joint surface and/or the second joint surface.

[30] The solid-state imaging device according to any one of [25] to [29], in which
the low-permittivity layer includes at least one selected from a group consisting of SiOC, SiOF, SiOCH, SiCOH, hydrogen silsesquioxane, and methylsilsesquioxane.

[31] The solid-state imaging device according to any one of [25] to [30], in which
the first joint surface and the second joint surface are bonded via the first electrode and the second electrode.

[32] The solid-state imaging device according to any one of [25] to [31], in which
the first joint surface and the second joint surface are bonded via the insulating layer and the second electrode.

[33] The solid-state imaging device according to any one of [25] to [32], in which
the first joint surface and the second joint surface are bonded via the first electrode and the modification layer.

[34] The solid-state imaging device according to any one of [25] to [33], in which
the first substrate includes a pixel area where a plurality of pixels including photoelectric converters is arrayed,
the second substrate includes a peripheral circuit section that includes at least a logic circuit and that is formed on a periphery of the pixel area, and
the first electrode of the first substrate is formed in an area outside of the pixel area and is electrically connected to the second electrode of the second substrate.

[35] The solid-state imaging device according to [34], in which
the first electrode of the first substrate is formed in the pixel area and is electrically connected to the second electrode of the second substrate.

[36] The solid-state imaging device according to any one of [25] to [33], in which
the first substrate includes a pixel area where a plurality of pixels including photoelectric converters is arrayed,
the second substrate includes a peripheral circuit section that includes at least a logic circuit and that is formed on a periphery of the pixel area, and
the first electrode of the first substrate is formed in the pixel area and is electrically connected to the second electrode of the second substrate.

[37] An electronic apparatus including the solid-state imaging device according to any one of [1] to [36].

REFERENCE SIGNS LIST

1(1-1, 1-2) modification layer
2(2-1, 2-2) low-permittivity layer
10 first substrate (sensor board)
13(13-1, 13-2) electrode
20 second substrate 8 circuit board)
100(100-1, 100-2, 100-3, 100-4, 100-5, 100-6, 100-7, 100-8, 100-9, 100-10, 100-11, 100-12) solid-state imaging device

The invention claimed is:
1. A solid-state imaging device, comprising:
a first substrate including:
    a first electrode;
    a first modification layer;
    a first low-permittivity layer on the first modification layer; and
    a first joint surface that exposes the first electrode and the first modification layer; and
a second substrate including:
    a second electrode;
    a second modification layer;
    a second low-permittivity layer on the second modification layer; and
    a second joint surface that exposes the second electrode and the second modification layer, wherein
        the first modification layer has higher hydrophilicity than the first low-permittivity layer,
        the second modification layer has higher hydrophilicity than the second low-permittivity layer,
        the first substrate and the second substrate form a laminate structure, and
        the first joint surface and the second joint surface are electrically connected.

2. The solid-state imaging device according to claim 1, wherein
the first low-permittivity layer includes SiOC,
the first modification layer includes Si atoms, O atoms, and C atoms, and
a concentration of the C atoms in the first modification layer decreases toward the first joint surface.

3. The solid-state imaging device according to claim 1, wherein
the first low-permittivity layer includes SiOC,
the first modification layer includes Si atoms, O atoms, and C atoms, and
a concentration of the O atoms in the first modification layer increases toward the first joint surface.

4. The solid-state imaging device according to claim 1, wherein
the first low-permittivity layer includes SiOC,
the first modification layer includes Si atoms, O atoms, and C atoms,
a concentration of the C atoms in the first modification layer decreases toward the first joint surface, and
a concentration of the O atoms in the first modification layer increases toward the first joint surface.

5. The solid-state imaging device according to claim 1, wherein
the second low-permittivity layer includes SiOC,
the second modification layer includes Si atoms, O atoms, and C atoms, and
a concentration of the C atoms in the second modification layer decreases toward the second joint surface.

6. The solid-state imaging device according to claim 1, wherein
the second low-permittivity layer includes SiOC,
the second modification layer includes Si atoms, O atoms, and C atoms, and
a concentration of the O atoms in the second modification layer increases toward the second joint surface.

7. The solid-state imaging device according to claim 1, wherein
the second low-permittivity layer includes SiOC,
the second modification layer includes Si atoms, O atoms, and C atoms,
a concentration of the C atoms in the second modification layer decreases toward the second joint surface, and
a concentration of the O atoms in the second modification layer increases toward the second joint surface.

8. The solid-state imaging device according to claim 1, wherein
the first low-permittivity layer includes SiOC,
the second low-permittivity layer includes SiOC,
the first modification layer includes Si atoms, O atoms, and C atoms,
the second modification layer includes Si atoms, O atoms, and C atoms,
a concentration of the C atoms in the first modification layer decreases toward the first joint surface, and
a concentration of the C atoms in the second modification layer decreases toward the second joint surface.

9. The solid-state imaging device according to claim 1, wherein
the first low-permittivity layer includes SiOC,
the second low-permittivity layer includes SiOC,
the first modification layer includes Si atoms, O atoms, and C atoms,
the second modification layer includes Si atoms, O atoms, and C atoms, a concentration of the O atoms in the first modification layer increases toward the first joint surface, and a concentration of the O atoms in the second modification layer increases toward the second joint surface.

10. The solid-state imaging device according to claim 1, wherein the first low-permittivity layer includes SiOC, the second low-permittivity layer includes SiOC, the first modification layer includes Si atoms, O atoms, and C atoms, the second modification layer includes Si atoms, O atoms, and C atoms, a concentration of the C atoms in the first modification layer decreases toward the first joint surface, a concentration of the O atoms in the first modification layer increases toward the first joint surface, a concentration of the C atoms in the second modification layer decreases toward the second joint surface, and a concentration of the O atoms in the second modification layer increases toward the second joint surface.

11. The solid-state imaging device according to claim 1, wherein at least one of the first substrate or the second substrate further includes an insulating thin film, and the insulating thin film is exposed on the at least one of the first joint surface or the second joint surface.

12. The solid-state imaging device according to claim 1, wherein each of the first low-permittivity layer and the second low-permittivity layer includes at least one selected from a group consisting of SiOC, SiOF, SiOCH, SiCOH, hydrogen silsesquioxane, and methylsilsesquioxane.

13. The solid-state imaging device according to claim 1, wherein the first joint surface and the second joint surface are bonded via the first electrode and the second electrode.

14. The solid-state imaging device according to claim 1, wherein the first joint surface and the second joint surface are bonded via the first modification layer and the second electrode.

15. The solid-state imaging device according to claim 1, wherein the first joint surface and the second joint surface are bonded via the first electrode and the second modification layer.

16. The solid-state imaging device according to claim 1, wherein the first substrate further includes a pixel area that includes a plurality of pixels, the plurality of pixels includes photoelectric converters, the second substrate further includes a peripheral circuit section that includes at least a logic circuit, the peripheral circuit section is on a periphery of the pixel area, the first electrode of the first substrate is in an area outside of the pixel area, and the first electrode of the first substrate is electrically connected to the second electrode of the second substrate.

17. The solid-state imaging device according to claim 16, wherein the first electrode of the first substrate is in each of:
the pixel area, and
the area outside of the pixel area, and the first electrode of the first substrate is electrically connected to the second electrode of the second substrate.

18. The solid-state imaging device according to claim 1, wherein the first substrate further includes a pixel area that includes a plurality of pixels, the plurality of pixels includes photoelectric converters, the second substrate further includes a peripheral circuit section that includes at least a logic circuit, the peripheral circuit section is on a periphery of the pixel area, the first electrode of the first substrate is in the pixel area, and the first electrode of the first substrate is electrically connected to the second electrode of the second substrate.

19. An electronic apparatus, comprising:
the solid-state imaging device according to claim 1.

20. A solid-state imaging device, comprising:
a first substrate including:
a first electrode;
an insulating layer; and
a first joint surface that exposes the first electrode and the insulating layer; and
a second substrate including:
a second electrode;
a modification layer;
a low-permittivity layer on the modification layer; and
a second joint surface that exposes the second electrode and the modification layer, wherein
the modification layer has higher hydrophilicity than the low-permittivity layer,
the first substrate and the second substrate form a laminate structure, and
the first joint surface and the second joint surface are electrically connected.

21. An electronic apparatus, comprising:
the solid-state imaging device according to claim 19.

* * * * *